United States Patent
Shoji

(10) Patent No.: US 6,214,684 B1
(45) Date of Patent: *Apr. 10, 2001

(54) METHOD OF FORMING A SEMICONDUCTOR DEVICE USING AN EXCIMER LASER TO SELECTIVELY FORM THE GATE INSULATOR

(75) Inventor: Tatsumi Shoji, Hiratsuka (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/720,236

(22) Filed: Sep. 26, 1996

(30) Foreign Application Priority Data

| Sep. 29, 1995 | (JP) | 7-252204 |
| Sep. 29, 1995 | (JP) | 7-252205 |
| Sep. 29, 1995 | (JP) | 7-252206 |
| Sep. 29, 1995 | (JP) | 7-252207 |
| Jun. 4, 1996 | (JP) | 8-141510 |
| Sep. 13, 1996 | (JP) | 8-243087 |

(51) Int. Cl.[7] ................................................. H01L 21/336

(52) U.S. Cl. ........................................ 438/308; 438/197

(58) Field of Search ............... 437/19, 21, 40 TFT, 437/40 TFI, 41 TFT, 41 TFI, 173, 174, 233, 907, 908, 168, 165; 117/8–10, 43, 904; 148/DIG. 90–DIG. 94; 438/166, 487, 535, 771, 149, 151, 197, 308

(56) References Cited

U.S. PATENT DOCUMENTS

| 4,390,791 | 6/1983 | Hatanaka et al. ................. 250/578 |
| 4,724,219 | * 2/1988 | Ridinger ............................ 437/19 |
| 5,116,771 | * 5/1992 | Karulkar ..................... 437/40 TFT |
| 5,315,144 | 5/1994 | Cherne ................................ 257/351 |
| 5,316,969 | * 5/1994 | Ishida et al. ....................... 437/168 |
| 5,413,958 | * 5/1995 | Imahashi et al. .................. 438/487 |
| 5,424,244 | * 6/1995 | Zhang et al. ...................... 437/173 |
| 5,529,951 | * 6/1996 | Noguchi et al. ................... 437/174 |
| 5,541,138 | * 7/1996 | Yamazaki et al. ................. 437/174 |
| 5,620,910 | * 4/1997 | Teramoto .............................. 437/21 |

FOREIGN PATENT DOCUMENTS

| 304336A2 | 2/1989 | (EP) | ............................. H01L/31/10 |
| 0655774A2 | 5/1995 | (EP) | . |
| 660421A2 | 6/1995 | (EP) | ........................... H01L/31/108 |
| 660421A3 | 11/1997 | (EP) | ........................... H01L/27/146 |

(List continued on next page.)

OTHER PUBLICATIONS

S. Chen et al., Solid State Technol., 1(1996)113 "Polysilicon TFT technology . . . ", Jan. 1996.*

S.S. He et al., MRS Symp. Proc., 318 (1994)489 "Back–channel surface modification . . . plasma excited N2O", Jun. 1994.*

Mei, P. et al. "Grain Growth In Laser Dehydrogenated And Crystallized Polycrystalline Silicon For Thin Film Transistors", Journal of Applied Physics, vol. 76, 1994, pp. 3194–3199.

T. Sugii et al., "Low–Temperature Fabrication of Silicon Nitride Films by ArF Excimer Laser Irradiation", Applied Physics A/Solids, & Surfaces A46 (1988) Aug., No. 4, Berlin, W. Germany, pp. 249–253.

*Primary Examiner*—Charles Bowers
*Assistant Examiner*—Evan Pert
(74) *Attorney, Agent, or Firm*—Fitzpatrick, Cella, Harper & Scinto

(57) ABSTRACT

To form a high-quality insulating layer at a low temperature, a semiconductor layer is formed on an insulating surface of an insulating substrate, and the semiconductor layer is selectively modified by an excimer laser irradiated from a surface opposing the insulating surface side of the semiconductor layer to form an insulating layer.

16 Claims, 32 Drawing Sheets

FOREIGN PATENT DOCUMENTS

| | | |
|---|---|---|
| 58-095830 | 6/1983 | (JP) . |
| 59-014672 | 1/1984 | (JP) . |
| 59-201422 * | 11/1984 | (JP) . |
| 61-100967 * | 5/1986 | (JP) . |
| 61-105870 * | 5/1986 | (JP) . |
| 62-193177 * | 8/1987 | (JP) . |
| 1-212481 * | 8/1989 | (JP) . |
| 2-33934 * | 2/1990 | (JP) ........................ 437/174 |
| 5-16372 | 12/1993 | (JP) ..................... H01L/27/146 |
| 6069504 | 3/1994 | (JP) . |
| 6125084 | 6/1994 | (JP) ..................... H01L/29/784 |
| 6-244184 * | 9/1994 | (JP) . |
| 7-94756 * | 4/1995 | (JP) . |

* cited by examiner

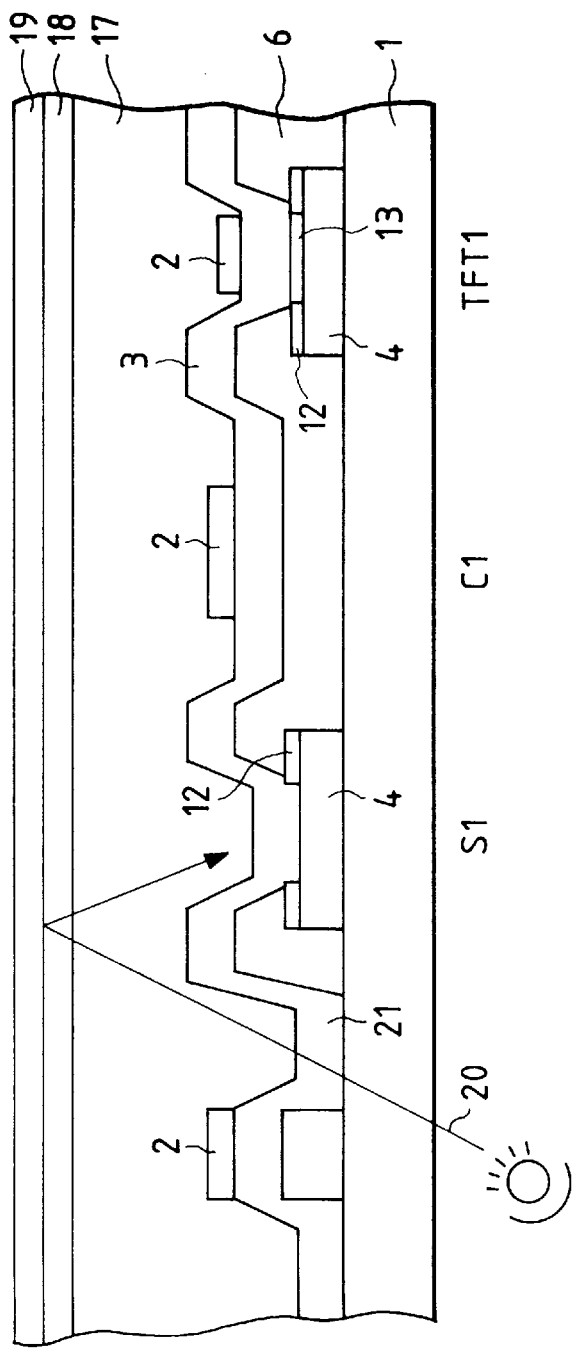
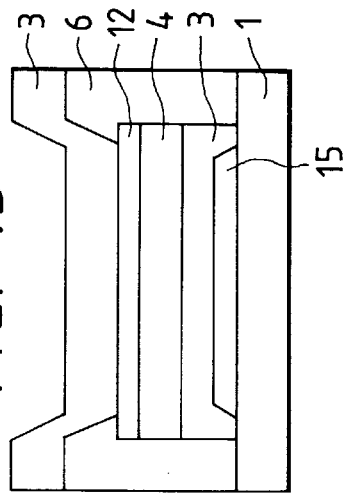
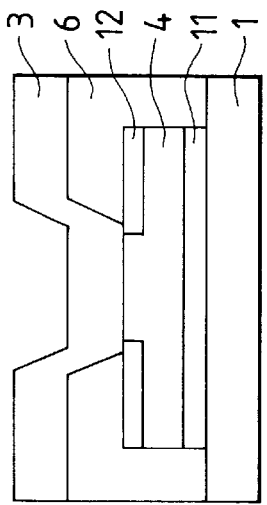

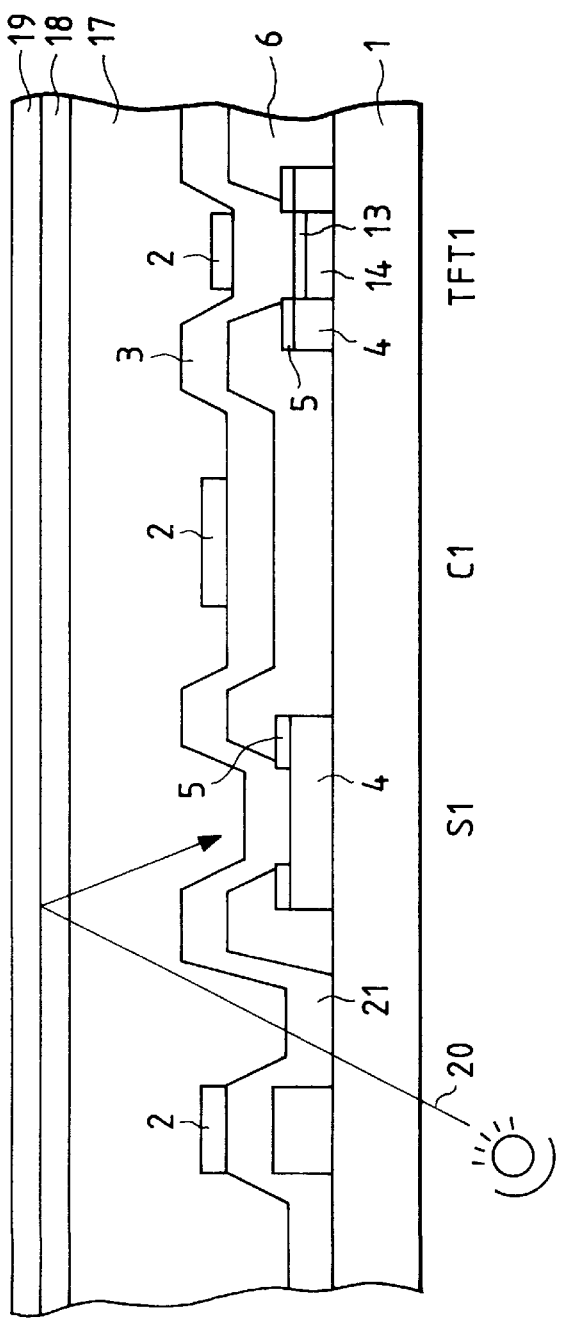
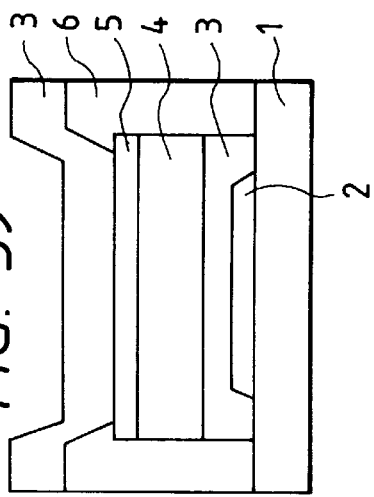
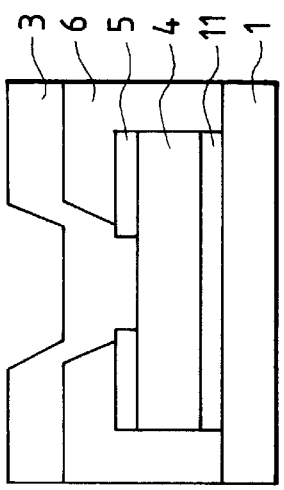

METHOD OF FORMING A SEMICONDUCTOR DEVICE USING AN EXCIMER LASER TO SELECTIVELY FORM THE GATE INSULATOR

BACKGROUND OF THE INVENTION

1. Field of the Invention

The present invention relates to a semiconductor device and a method of manufacturing the same and, more particularly, to a semiconductor device having a non-monocrystalline semiconductor layer represented by an amorphous silicon, and a method of manufacturing the same.

2. Related Background Art

In a conventional image information processing apparatus such as a facsimile or an image reader, a photosensor is used as a photoelectric converter. In particular, in recent years, a high-sensitive image reading apparatus having a long line sensor obtained by one-dimensionally arranging photosensors using a hydrogenated amorphous silicon as a photoelectric conversion layer is proposed. Further, a reading apparatus in which photosensors are two-dimensionally arranged in a large area, and a high-performance image reading apparatus in which thin-film transistors or shift resisters are formed on the same substrate by using a hydrogenated amorphous silicon are provided. In particular, in recent years, liquid crystal display apparatuses which are driven by thin-film transistors using a hydrogenated amorphous silicon to cope with large screens are actively developed and manufactured.

FIG. 1 shows an example of an element arrangement of a one-dimensional image reading apparatus. Referring to FIG. 1, reference symbol SR1 is a shift resister; S1, a photosensor portion; C1, a capacitor portion for accumulating charges; TFT1, a transfer TFT for transferring accumulated charges; and Sig MTX1, a signal line matrix wiring for outputting the transferred charges out of the circuit. A one-dimensional image reading apparatus is constituted such that such elements are arranged at 1,728 bits in A-B direction for, e.g., A4 size. Note that reference symbols $\phi 1$ and $\phi 2$ denote block lines, and reference symbol $V_{DD}$ denotes a power supply.

FIG. 2 shows an example of a sensor portion of an image reading apparatus as a C-D section of the element arrangement shown in FIG. 1. FIG. 2 shows only the photosensor portion S1. A gate electrode 2 is formed on a transparent insulating substrate 1, and an insulating layer 3 consisting of $SiO_2$, $SiN_x$, or the like, a semiconductor layer 4 consisting of an amorphous silicon, a doping semiconductor layer 5 such as an $n^+$-type amorphous silicon, and a main electrode 6 are formed on the gate electrode 2 by patterning as needed. Reference numeral 18 denotes an anti-abrasion thin glass, having a thickness of, e.g., 50 $\mu$m, for preventing abrasion of an image reading element by an original surface; and 17, a surface of the element. The surface 17 is constituted by a layer which serves as a protective layer as needed and consists of SiN, and a polyimide resin, and an epoxy resin for adhering the anti-abrasion thin glass 18. In this arrangement, light rays 20 emitting from a light source 22 such as an LED pass through an illumination transmission window 21 of the transparent insulating substrate 1 and are reflected by the original surface 19. The reflected light rays are incident on the TFT photosensor portion S1. The photosensor portion S1 generates a light output depending on the intensity of the reflected light rays as an electric signal, so that an image can be processed with gradation.

FIGS. 3 to 5 show examples of the arrangement of a thin-film transistor. Referring to FIG. 3, a transparent or opaque conductive layer is patterned on the transparent insulating substrate 1 to form the gate electrode 2, and the insulating layer 3 consisting of $SiO_2$ or $SiN_x$, the semiconductor layer 4 consisting of an amorphous silicon, and the doping semiconductor layer 5 are formed on the gate electrode 2 by patterning as needed. A discrete electrode 7 and the main electrode 6 are formed by patterning.

FIG. 4 shows an example wherein a channel protective layer 8 is formed on the semiconductor layer 4 in FIG. 3.

FIG. 5 shows the following example. That is, a light-shielding layer 9 and an insulating layer 10 are formed on the transparent insulating substrate 1 by patterning as needed, and the discrete electrode 7 is formed on the resultant structure by patterning. The main electrode 6 and the doping semiconductor layer 5 are formed with a gap by patterning, and the semiconductor layer 4 and the insulating layer 3 are sequentially formed on the gap. The gate electrode 2 is formed on the resultant structure by patterning.

A large-area two-dimensional sensor driven by a thin film transistor using a silicon has developed.

FIG. 6 is a typical sectional view showing a large-area two-dimensional sensor, corresponding to one pixel, for an apparatus for detecting an electromagnetic wave including radiation such as X-rays or light rays. Referring to FIG. 6, a thin-film transistor (T11) having an electrode 62 serving as a gate electrode, an insulating layer 63 serving as a gate insulating layer, a hydrogenated amorphous silicon semiconductor layer 64, a doping semiconductor layer 65, and an electrode serving as a main electrode, an MIS photosensor (S11) having the electrode 62 serving as a lower electrode, the insulating layer 63, the hydrogenated amorphous silicon semiconductor layer 64, the doping semiconductor layer 65, and a capacitor (C11) having the electrode 62 serving as a lower electrode, the insulating layer 63, the hydrogenated amorphous silicon semiconductor layer 64, the doping semiconductor layer 65, and the electrode 66 serving as an upper electrode are parallelly arranged and formed on an insulating substrate 61 to constitute one pixel.

Such pixels are arranged in a two-dimensional large area, and a protective layer 68, consisting of SiN., for protecting the respective pixels and a phosphor 69 for converting the incident radiation such as X-rays into visible light rays are formed on the pixels, thereby constituting a so-called radiation detecting apparatus which copes with a large area.

However, the apparatus with the above arrangement has the following points to be improved.

In the arrangement shown in FIG. 3, the doping semiconductor layer 5 formed in a gap K in FIG. 3 must be removed by etching to a channel of a thin-film transistor after the doping semiconductor layer 5 or/and the main electrode 6 are formed. At this time, a dopant contained in the doping semiconductor layer 5, e.g., phosphorus atoms, are partially diffused in the semiconductor layer 4 in formation of the doping semiconductor layer 5. For this reason, the diffused layer must be also removed at the same time. In this case, in particular, if the transparent insulating substrate 1 has a large area, the end point of slight etching of the semiconductor layer 4 cannot be determined. For this reason, a disadvantage that the semiconductor layer 4 is over-etched or etched with poor uniformity may be posed. As a result, the characteristics of the thin-film transistor, especially, a voltage $V_{th}$ and a variation thereof, the value of electron mobility and a variation thereof, and a $V_{th}$ shift in an operation reliability test and a variation thereof may become worse. In addition, although no t shown, upon completion of the step of finally protecting the structure with a passivation film, the surface of the semiconductor layer 4 is temporarily exposed to the atmospheric air. Due to this influence, the above problems may become worse, or a change in temperature characteristics may disadvantageously vary.

In contrast to this, in the arrangement shown in FIG. 4, the above problems can be regulated. The number of masks used in the steps in manufacturing the arrangement in FIG. 4 is larger than that in FIG. 3. The thin-film transistor in FIG. 4 cannot be easily manufactured at a cost lower than that of the thin-film transistor in FIG. 3.

In the arrangement shown in FIG. 5, since the semiconductor layer 4 is formed after the main electrode 6 and the doping semiconductor layer 5 are formed by patterning, the ohmic contact of the semiconductor layer 4 cannot be easily obtained, and preferable TFT characteristics may be not easily obtained. In addition, since the insulating layer 3 is formed after the semiconductor layer 4 is formed, when the formation temperature is set to 350° C. to form the insulating layer 3 having high quality, the semiconductor layer 4 which has been formed is degraded. When the formation temperature of the insulating layer 3 decreases, the insulating layer 3 having high quality cannot be obtained, and transistor characteristics, especially, ON-OFF characteristics, a voltage $V_{th}$, and a $V_{th}$ shift, may be degraded.

Further, as shown in FIG. 6, the doping semiconductor layer 5 for ohmic contact is formed on the thin-film transistor (T11) and the MIS photosensor (S11) using a hydrogenated amorphous silicon semiconductor. In this case, a micropatterning process by photolithography using a photomask must be performed.

To decrease the number of steps, the doping semiconductor layers 5 of elements, i.e., the thin-film transistor (T11) and the MIS photosensor (S11), have the same film thickness. However, in the thin-film transistor (T11), the doping semiconductor layer 5 desirably has a low resistivity to improve its transfer capability. On the other hand, in the MIS photosensor (S11), since the doping semiconductor layer 5 serves as a transparent electrode, the doping semiconductor layer desirably has a low resistivity and a small thickness to cause light rays to sufficiently reach the hydrogenated amorphous silicon semiconductor layer 4.

To make this point clear, FIG. 7 shows a film thickness dependency of the resistivity of the doping semiconductor layer formed by a normal P-CVD method. As is apparent from FIG. 7, when the doping semiconductor layer is formed to have a small thickness, its resistivity increases. In particular, when the thickness is decreased from 500 Å to 300 Å, the resistivity increases to several hundreds Ω·cm.

FIGS. 8 and 9 show, with respect to the thin-film transistor and the MIS photosensor, dependencies of a transfer capability and a light output on the formation film thickness of the doping semiconductor layer 5 formed by the normal P-CVD method, respectively. As is apparent from FIGS. 8 and 9, in the thin-film transistor, when the doping semiconductor layer 5 decreases in thickness, the increase in resistance of the doping semiconductor layer 5 degrades the transfer capability. In the photosensor, the light output increases with a decrease in thickness of the doping semiconductor layer 5. However, a doping semiconductor layer having a thickness: 300 Å is used, the resistance of the transparent electrode is too high so that the light output cannot be measured.

For these reasons, in the prior art, at any rate, the thickness of the doping semiconductor layer 5 is set to 750 Å, and the respective functions are realized within the satisfactory range. However, decreases in resistance and thickness of the doping semiconductor layer 5 are desired to realize higher functional transistor and photosensor.

In addition, the doping semiconductor layer 5 is deposited to have a large thickness, and only the doping semiconductor layer 5 on the MIS photosensor is etched by the photolithographic step. In this manner, the thickness of the doping semiconductor layer is set to 1,000 Å, and the thickness of the doping semiconductor layer 5 of the MIS photosensor is set to 500 Å, thereby obtaining a high transfer capability and a high light output at once. In this case, since the photolithographic step is additionally performed, a problem that a yield of semiconductor devices increases and a problem that the production cost of the semiconductor devices increases are posed. Further, a problem that, on a substrate having a large area, e.g., a 460-mm square, the uniformity of etching cannot be sufficiently, technically assured is also posed, thereby preventing the photosensor and TFT from being realized.

The photosensor and TFT are formed in the same processes. The thickness of the semiconductor layer 4 of the photosensor must be large to assure the high light output of the photosensor. For this reason, the semiconductor layer 4 used on the TFT side increases in thickness in the same manner as in the photosensor, and the TFT may be erroneously operated by irradiation of light onto the TFT. Therefore, a light-shielding film is required for the TFT, so that a problem of an increase in number of steps and a problem of an increase in cost are disadvantageously posed.

SUMMARY OF THE INVENTION

The present invention has been made in consideration of the above problems, and has as its object to provide a semiconductor device which has a semiconductor element such as an inexpensive high-performance TFT or photosensor formed without increasing the number of maskand in which when a high-quality insulating film can be formed at a low temperature, and an insulating layer is formed by partially modifying the semiconductor layer in a layer direction, the interface between the semiconductor layer and the insulating layer is formed cleanly, and the high-quality insulating layer and the semiconductor layer free from degradation can be formed at a low temperature without increasing the number of masks to be in contact with each other, and a method of manufacturing the semiconductor device.

It is another object of the present invention to provide a method of manufacturing a semiconductor device in which, after a semiconductor layer is formed, when an insulating layer is formed by modifying the semiconductor layer using an excimer laser, and a doping semiconductor layer is formed by using the excimer laser, a high-quality insulating layer and a doping semiconductor layer can be formed at a low temperature, and the interface between the semiconductor layer and the insulating layer can be formed cleanly by partially modifying the semiconductor layer in the layer direction.

It is still another object of the present invention to provide a semiconductor device which has an element such as an inexpensive high-performance TFT or photosensor formed without increasing the number of masks and in which the insulating layer is formed in a part of the semiconductor layer in the layer direction, a portion of the semiconductor layer which is not modified into the insulating layer in the layer direction is used as a channel portion of a thin-film transistor, and the doping semiconductor layer is used as an ohmic contact layer of the thin-film transistor, and a method of manufacturing the semiconductor device.

It is still another object of the present invention to provide a semiconductor device such as a high-performance image reading apparatus (image-pickup apparatus) or a liquid crystal display apparatus in which a high-performance photosensor can be formed on the same substrate in the same manufacturing processes as in a TFT, and the inexpensive high-performance photosensor free from variation can be driven by a high-performance TFT and a shift resistor, and a method of manufacturing the semiconductor device.

It is still another object of the present invention to provide a semiconductor device which has a semiconductor element such as a TFT having a small channel resistance and excellent high-frequency characteristics or a photosensor and in which a high-quality film can be formed without ununiformity of film quality due to unevenness when a gate insulating film or a passivation film is to be formed because the surfaces of the doping semiconductor layer and the insulating layer form substantially the same flat surface, and the doping semiconductor layer can be formed near a channel portion, and a method of manufacturing the semiconductor device at a low temperature.

In addition, it is still another object of the present invention to provide a semiconductor device which includes an inexpensive high-performance TFT or photosensor and in which, after a semiconductor layer is formed, the semiconductor layer is partially modified in a layer direction by using an excimer laser to form an insulating layer, the portion of the semiconductor layer which is not modified by using the excimer laser is modified into a polysilicon semiconductor layer by laser annealing so that the high-quality insulating layer and the high-quality polysilicon semiconductor layer can be formed at a low temperature, at the same time, the interface between the semiconductor layer and the insulating layer can be formed cleanly, and a higher-performance P-Si TFT can be formed by masks which are almost equal in number to masks in an a-Si:H TFT or a photosensor, and a method of manufacturing the semiconductor device.

It is still another object of the present invention to provide a semiconductor device including a high-performance image reading apparatus which is driven by a high-performance P-Si TFT and a shift resistor and in which a high-performance photosensor can be formed on the same substrate in the same manufacturing processes as in a TFT, and a method of manufacturing the semiconductor device at a low cost.

In addition, it is still another object of the present invention to provide a method of manufacturing a semiconductor device in which, after a semiconductor layer is formed, the semiconductor layer is partially modified in a layer direction by using an excimer laser to form an insulating layer, the portion of the semiconductor layer which is not modified in the layer direction by using the excimer laser is modified into a polysilicon semiconductor layer by laser annealing so that the high-quality insulating layer and the high-quality polysilicon semiconductor layer can be formed at a low temperature, at the same time, the interface between the semiconductor layer and the insulating layer can be formed cleanly, and a doping semiconductor layer is formed by partially modifying the semiconductor layer by excimer laser doping, thereby forming a high-quality ohmic contact layer at a low temperature.

It is still another object of the present invention to provide a semiconductor device which includes an inexpensive high-performance TFT or a photosensor and in which a higher-performance P-Si TFT can be formed by masks which are almost equal in number to masks in an a-Si:H TFT or a photosensor, and a method of manufacturing the semiconductor device.

Furthermore, it is still another object of the present invention to provide a semiconductor device which includes a high-performance image reading apparatus driven in which a high-performance photosensor can be formed on the same substrate in the same manufacturing processes as in a TFT, and the high-performance photosensor free from variation is driven by a high-performance P-Si TFT and a shift register, and a method of manufacturing the semiconductor device at a low cost.

It is still another object of the present invention to provide a method of manufacturing a semiconductor device in which since a high-quality film can be formed without ununiformity of film quality due to unevenness when a gate insulating film or a passivation film is to be formed because the surfaces of the doping semiconductor layer and the insulating layer form substantially the same flat surface, and the doping semiconductor layer can be formed near a channel portion, a semiconductor element such as a TFT or a photosensor having a small channel resistance and excellent high-frequency characteristics can be formed at a low temperature.

It is still another object of the present invention to provide a method of manufacturing a semiconductor device in which, when the doping layer formed by using the excimer laser is increased in thickness by using the excimer laser, even a semiconductor device having doping layers whose required thicknesses are different from each other can be uniformly manufactured at a high yield and a high accuracy. It is still another object of the present invention to provide a semiconductor device in which, since the arrangement can be optimized, not only an improvement on the characteristics of respective elements but also totally excellent characteristics can be obtained.

In addition, it is still another object of the present invention to provide a semiconductor device, such as an apparatus of detecting an electromagnetic wave including radiation, having an MIS sensor having a sufficient large light output and a thin-film transistor having sufficient transfer capability which are parallelly arranged in such a manner that, after a semiconductor layer is formed, the semiconductor layer is modified into an insulating layer by using an excimer laser, and a doping semiconductor layer for the MIS sensor and a doping semiconductor layer for the TFT are formed to have thicknesses which are substantially different from each other, and a method of manufacturing the semiconductor device.

It is still another object of the present invention to provide a method of manufacturing a semiconductor device in which a semiconductor device including a radiation detecting apparatus, having excellent in-plane uniformity, and corresponding to a large area can be formed at a low cost by masks which are smaller in number than masks used in a conventional channel-etch type semiconductor device. It is still another object of the present invention to provide a semiconductor device in which a TFT and a photosensor can be formed in the same processes, and a semiconductor layer in a TFT portion can be substantially decreased in thickness, thereby reducing a disadvantage caused by irradiation of light onto the TFT, and a method of manufacturing the semiconductor device.

It is still another object of the present invention to provide a method of manufacturing a semiconductor device in which, after a semiconductor layer is formed, when the semiconductor layer is partially modified in a layer direction by using an excimer laser to form an insulating layer, and the semiconductor layer is modified into a polysilicon semiconductor layer under the insulating layer by laser annealing, the high-quality insulating layer and the high-quality polysilicon semiconductor layer can be formed at a low temperature, at the same time, the interface between the semiconductor layer and the insulating layer can be formed cleanly, and a doping semiconductor layer can be formed by partially modifying the semiconductor layer by excimer laser doping, thereby forming the high-quality doping semiconductor layer having a low resistivity at a low temperature.

In addition, it is still another object of the present invention to provide a method of manufacturing a semiconductor device in which a combination between a high-performance P-Si TFT which is not erroneously operated by light irradiation and a photosensor having a high light output can be obtained, and a high-performance radiation detecting apparatus having this combination can be manufactured. It is still another object of the present invention to provide a semiconductor device in which the high-performance P-Si TFT and the photosensor are formed at once, thereby improving an opening rate of a photosensor portion, and a method of manufacturing the semiconductor device.

It is still another object of the present invention to provide a semiconductor device including a high-performance, high-definition, and large-screen liquid crystal display apparatus which has high uniformity, high contrast, high S/N ratio, and the like and is obtained by a small number of masks in such a manner that TFTs according to the present invention are arranged in a matrix form to be connected to pixel electrodes, and a method of manufacturing the semiconductor device at a low cost.

It is still another object of the present invention to provide a method of manufacturing a semiconductor device, comprising the steps of forming a semiconductor layer on an insulating surface, and modifying a first region of the semiconductor layer by an excimer laser from a surface opposing the insulating surface side of the semiconductor layer to form an insulating layer.

It is still another object of the present invention to provide a semiconductor device in which a doping semiconductor layer and an insulating layer are formed adjacent to each other on a surface side, of a semiconductor layer formed on an insulating surface, opposing the insulating surface side of the semiconductor layer, comprising a semiconductor element in which the surfaces of the semiconductor layer and the insulating layer form substantially the same flat surface.

It is still another object of the present invention to provide a semiconductor device in which a doping semiconductor layer and an insulating layer are formed adjacent to each other on a surface side, of a semiconductor layer formed on an insulating surface, opposing the insulating surface side of the semiconductor layer, comprising a semiconductor element in which the surfaces of the doping semiconductor layer and the insulating layer form substantially the same flat surface.

It is still another object of the present invention to provide a semiconductor device in which an insulating layer is formed on a surface side, of a semiconductor layer formed on an insulating surface, opposing the insulating surface side of the semiconductor layer, and a polysilicon semiconductor layer is formed in a layer thickness direction of the semiconductor layer to be adjacent to the insulating layer, comprising a semiconductor element in which the surfaces of the doping semiconductor layer and the insulating layer form substantially the same flat surface.

It is still another object of the present invention to provide a semiconductor device in which a doping semiconductor layer and an insulating layer are formed adjacent to each other on a surface side, of a semiconductor layer formed on an insulating surface, opposing the insulating surface side of the semiconductor layer, and a polysilicon semiconductor layer is formed in a layer direction of the semiconductor layer to be adjacent to the insulating layer, comprising a semiconductor element in which the surfaces of the doping semiconductor layer and the insulating layer form substantially the same flat surface.

It is still another object of the present invention to provide a semiconductor device in which a doping semiconductor layer and an insulating layer are formed on a surface side, of a semiconductor layer formed on an insulating surface, opposing the insulating surface side of the semiconductor layer, wherein the doping semiconductor layer has a plurality of thicknesses which are different from each other in the same layer with respect to a layer thickness direction.

It is still another object of the present invention to provide a semiconductor device in which a gate electrode, a gate insulating layer, a semiconductor layer, a doping semiconductor layer, and a main electrode are formed on a substrate to parallelly arrange a thin-film transistor and a photosensor, wherein, after the semiconductor layer is deposited, an excimer laser is partially irradiated from the surface side of the semiconductor layer to modify the semiconductor layer into an insulating layer of the thin-film transistor, the excimer laser is irradiated onto another region to modify the semiconductor layer into a doping semiconductor layer, the doping semiconductor layer has at least two different film thicknesses, at least a part of the doping semiconductor layer is used as an ohmic contact layer of the thin-film transistor, and at least the other part of the doping semiconductor layer is used as an electrode of the photosensor.

According to the present invention, after a semiconductor layer is formed, and the semiconductor layer is modified into an insulating layer by using an excimer laser, so that the high-quality insulating layer can be formed at a low temperature.

According to the present invention, after a semiconductor layer is formed, the semiconductor layer is partially modified in the layer direction of the semiconductor layer into an insulating layer, thereby forming the interface between the semiconductor layer and the insulating layer cleanly, so that the high-insulating layer and the semiconductor layer free from degradation can be formed adjacent to each other at a low temperature. According to the present invention, an excimer laser can be uniformly irradiated in a large area, and controllability of the thickness of a modified film is preferable, the film thickness of the non-modified semiconductor layer of the semiconductor layer can be made uniform.

Note that the insulating layer is formed in at least a part of the semiconductor layer in a layer thickness direction, a semiconductor layer portion which is not modified into the insulating layer is preferably used as the channel portion or a light-receiving portion of a thin-film transistor.

The insulating surface includes a surface, having insulating properties, such as the surface of the insulating substrate, the surface of the insulating layer formed on the substrate, and the surface of the deposited insulating layer.

According to the present invention, after a semiconductor layer is formed, the semiconductor layer is modified into an insulating layer by using an excimer laser, and a doping semiconductor layer is formed by using the excimer laser, thereby forming the preferable insulating film and the doping semiconductor layer at a low temperature.

According to the present invention, the insulating layer is formed in a part of the semiconductor layer in the layer direction, a portion of the semiconductor layer which is not modified into the insulating layer in the layer direction is used as a channel portion of a thin-film transistor, and the doping semiconductor layer is used as an ohmic contact layer of the thin-film transistor, thereby forming the preferable insulating layer and the ohmic contact layer at a low temperature without increasing the number of masks. According to the present invention, since the step of etching the semiconductor layer in formation of a channel can be omitted, a large-area uniform semiconductor layer and a large-area and high-quality uniform insulating layer can be formed.

According to the present invention, a high-quality film can be formed without ununiformity of film quality due to unevenness when a gate insulating film or a passivation film is to be formed because the surfaces of the doping semiconductor layer and the insulating layer form substantially the same flat surface, and the doping semiconductor layer can be formed near a channel portion, so that a TFT having a low channel resistance and excellent high-frequency characteristics can be formed at a low temperature.

According to the present invention, after a semiconductor layer is formed, the semiconductor layer is partially modified in a layer direction by using an excimer laser to form an insulating layer, the portion of the semiconductor layer which is not modified in the layer direction by using the excimer laser is modified into a polysilicon semiconductor layer by laser annealing so that the high-quality insulating layer and the polysilicon semiconductor layer can be formed at a low temperature, and the interface between the semiconductor layer and the insulating layer can be formed cleanly.

According to the present invention, after a semiconductor layer is formed, the semiconductor layer is partially modified in a layer direction by using an excimer laser to form an insulating layer, a portion of the semiconductor layer which is not modified into the insulating layer in the layer direction is modified into a polysilicon semiconductor layer by the excimer laser, a doping semiconductor layer for ohmic contact is formed by modifying a predetermined region of the semiconductor layer by excimer laser doping, so that the high-quality insulating layer, the polysilicon semiconductor layer, and the doping semiconductor layer can be formed at a low temperature, and the interface between the semiconductor layer and the insulating layer can be formed cleanly.

According to the present invention, since a high-quality film can be formed without ununiformity of film quality due to unevenness when a gate insulating film or a passivation film is to be formed because the surfaces of the doping semiconductor layer and the insulating layer form substantially the same flat surface, and the doping semiconductor layer can be formed near a channel portion, a TFT having a low channel resistance and excellent high-frequency characteristics can be formed at a low temperature.

Further, according to the present invention, a semiconductor layer is formed on an insulating surface, and an excimer laser is irradiated from a surface of the semiconductor layer opposing the insulating surface side to modify a first region of the semiconductor layer into an insulating layer and modify a second region on the insulating surface side into a doping semiconductor layer, and the irradiation of the excimer laser is desirably regulated such that the doping semiconductor layer has substantially two or more different thicknesses in the same layer.

The following is preferable as an embodiment of the present invention. That is, when the excimer laser is irradiated onto the semiconductor layer formed on the insulating surface, the irradiation region of the excimer laser is regulated to modify a portion (first region) of the semiconductor layer in a layer direction into an insulating layer, and the irradiation region of the excimer laser is changed to modify another portion (second region), which is not modified, of the semiconductor layer in the layer direction into a doping semiconductor layer.

Note that the doping semiconductor layer can be constituted such that a portion having a small thickness and a portion having a large thickness are used as an electrode of a photosensor and an ohmic contact layer of a thin-film transistor, respectively. In irradiation of the excimer laser onto the first region, when a portion under the insulating layer is modified into a polysilicon semiconductor layer by laser annealing, the portion can be used as a channel portion of the thin-film transistor. At least a part of the doping semiconductor layer on the photosensor side and at least a part of the doping semiconductor layer on the thin-film transistor side are preferably formed in the same step to reduce the number of steps.

In the semiconductor device of the present invention, a semiconductor layer is formed on an insulating surface, and a doping semiconductor layer and an insulating layer are formed adjacent to each other on the surface opposing the insulating surface side of the semiconductor layer. In this semiconductor device, the doping semiconductor layer preferably has a plurality of different thicknesses in the same layer with respect to a layer direction.

More specifically, in the semiconductor device in which a gate insulating layer, a semiconductor layer, a doping semiconductor layer, and a main electrode are formed on a substrate to parallelly arrange a thin-film transistor and a photosensor in a layer direction, after the semiconductor layer is deposited, an excimer laser is partially irradiated from its surface side onto the semiconductor layer to modify the semiconductor layer into an insulating layer of the thin-film transistor, the excimer laser is irradiated onto another region to modify the semiconductor layer into a doping semiconductor layer having two or more different thicknesses, at least a part of the doping semiconductor layer is used as an ohmic contact layer of the thin-film transistor, and at least the other part of the doping semiconductor layer is used an electrode of the photosensor.

When the semiconductor device is manufactured as described above, according to the present invention, the high-quality insulating layer, the high-quality olsemiconductor layer, and the interface between the semiconductor layer and the insulating layer can be formed at a low temperature, and the doping semiconductor layer having a low resistivity can be formed at a low temperature.

The following effect can be obtained. That is, when the channel portion of the thin-film transistor is formed under the insulating layer, and the doping semiconductor layer is used as the low-resistance transparent electrode of the photosensor and the ohmic contact layer of the thin-film transistor, a high-performance a-Si:H TFT constituted by a substantially thin semiconductor layer and a high-performance photosensor constituted by a thick semiconductor layer can be formed by masks which are smaller in number than those used in the prior art, and the semiconductor device can be manufactured at a low cost. An erroneous operation of the TFT caused by irradiation light as observed in a conventional a-Si:H TFT can be considerably reduced.

A photosensor and an a-Si:H TFT can be formed on the same substrate in the common manufacturing steps, on the photosensor, light rays can be sufficiently incident onto the a-Si:H semiconductor layer serving as a photosensitive layer by the doping layer serving as a low-resistance thin electrode, and a low-resistance source/drain electrode is formed near a channel in the a-Si:H TFT, thereby improving transfer efficiency and frequency efficiency. Therefore, a large area radiation detecting apparatus on which a high-output photosensor and a high-performance TFT can be simultaneously mounted can be manufactured at a low cost.

Note that, since, under the insulating layer formed on the surface side of the semiconductor layer by an excimer laser, the polysilicon semiconductor layer is modified and formed by laser annealing performed by the excimer laser, a high-quality insulating layer, a polysilicon semiconductor layer, and a doping semiconductor layer having a low resistivity can be formed at a low temperature by modifying performed by excimer laser irradiation to be performed later, and the interface between the semiconductor layer and the insulating layer can be formed cleanly.

Therefore, in this case, a high-performance stable P-Si TFT having high reliability and a high-performance photosensor can be manufactured at a low cost by masks which are smaller than in number those in the prior art, and an erroneous operation of the TFT observed in an a-Si:H TFT and caused by incident light rays can be prevented, thereby making a light-shielding layer unnecessary. In addition, a photosensor and a P-Si TFT can be formed on the same substrate in the same manufacturing steps, and an a-Si:H semiconductor layer serving as a photosensitive layer is formed on the photosensor by a doping semiconductor layer serving as a low-resistivity thin electrode, and light rays can be sufficiently incident onto the a-Si:H semiconductor layer. In this manner, a semiconductor device including a reading apparatus such as a radiation detecting apparatus having a high-output photosensor and a high-performance P-Si TFT can be manufactured at a low cost.

Further, since the thin-film transistor can be formed as a polysilicon TFT, the polysilicon TFT having higher driving performance and a smaller size than an a-Si:H TFT can be formed. For this reason, an opening rate for the sensor portion in one pixel, a semiconductor device having a higher-output photosensor can be manufactured, and a high-performance semiconductor device which copes with a large area and high definition can be manufactured.

In addition, according to the present invention, a semiconductor device including a high-performance image reading apparatus in which a high-performance photosensor is formed on the same substrate in the same manufacturing steps as those of a TFT, and the photosensor are integrated with the TFT and a shift register can be manufactured at a low cost.

Since the high-performance photosensor can be formed on the same substrate in the same manufacturing steps as those of the TFT, a high-performance image reading apparatus in which the high-performance photosensor free from variation can be driven by the high-performance TFT and the shift register can be manufactured at a low cost.

According to the present invention, when the polysilicon semiconductor layer and the doping semiconductor layer are used as the channel portion of the thin-film transistor and the ohmic contact layer of the thin-film transistor, a high-performance P-Si TFT can be formed by masks which are equal to in number those of an a-Si:H TFT, and a high-performance TFT can be manufactured at a low cost.

According to the present invention, a high-performance image reading apparatus in which the high-performance photosensor can be formed on the same substrate in the same manufacturing steps as those of the TFT, and the high-performance photosensor free from variation can be driven by a high-performance P-Si TFT and a shift register can be manufactured at a low cost.

In this manner, according to the present invention, there can be provided a high-performance semiconductor device which can manufacture a semiconductor element including a high-performance photosensor and/or a high-performance TFT without variation in characteristics of the semiconductor element and which has the semiconductor element including the photosensor and/or the TFT.

In the semiconductor device of the present invention, not only a so-called sensor such as an image reading apparatus or a radiation detecting apparatus described above, but also a circuit including a drive circuit for a liquid crystal display apparatus or other various apparatuses can be constituted.

Especially, the photosensor or the display apparatus (including a liquid crystal display apparatus) is often formed to have a large length or a large area. The present invention is particularly effectively applied to the photosensor or the display apparatus.

BRIEF DESCRIPTION OF THE DRAWINGS

FIGS. 22, 24, 25, 40, 42, 43, 56, 58, 59, 75, and 77 to 79 are typical sectional views for explaining photosensors according to the present invention, respectively.

FIGS. 23, 41, 57, 76, 80, and 86 are typical sectional views for explaining detecting apparatuses according to the present invention, respectively.

DETAILED DESCRIPTION OF THE PREFERRED EMBODIMENTS

Embodiments of the present invention will be described below in detail.

The embodiments to be described below are related to a TFT to which the present invention is applied and an apparatus using the TFT. Since the present invention is made to form a high-quality insulating film at a low temperature, the present invention is not limited to a TFT and an apparatus using the TFT as a matter of course.

[Embodiment 1]

Figure 10:
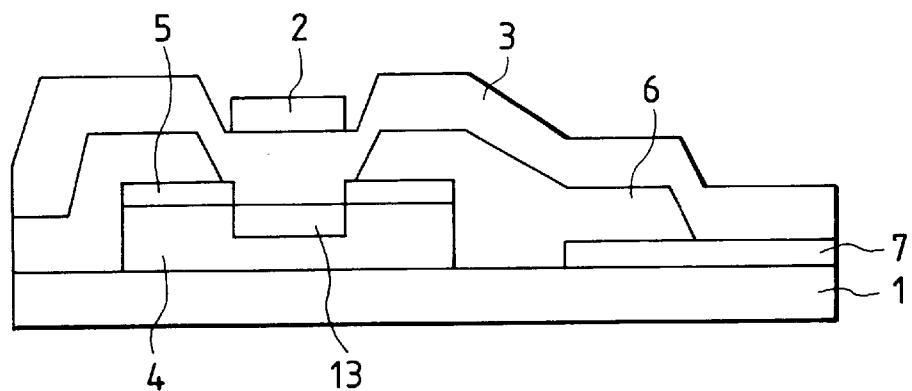
FIGS. 10, 16, 21, 27, 34, 39, 44, 50, 55, 62, 69, and 74 are typical sectional views for explaining TFTs according to the present invention, respectively.

FIG. 10 is a typical sectional view showing an embodiment of the present invention. Reference numeral 1 denotes an insulating substrate such as a glass substrate. A semiconductor layer 4 consisting of an amorphous silicon (to be referred to as a-Si:H hereinafter), a doping semiconductor layer 5, and an electrode 6 were formed and patterned, and a portion of the semiconductor layer 4 to be used as a channel of a TFT was modified into an insulating layer 13 consisting of $SiO_2$f $Si_3N_4$. or the like by an excimer laser. Thereafter, an insulating layer 3 and a gate electrode 2 were formed. Note that reference numeral 7 denotes a discrete electrode. The discrete electrode 7 is connected to, e.g., one side of a sensor or a pixel electrode.

Figure 11:
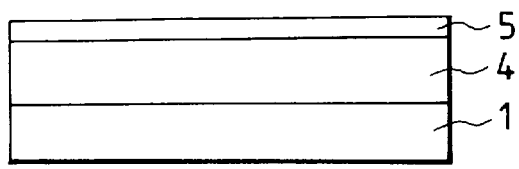
FIGS. 11 to 15, 17 to 20, 28 to 33, 35 to 38, 45 to 49, 51 to 54, 63 to 68, and 70 to 73 are typical sectional views for explaining the steps in manufacturing a TFT according to the present invent ion, respectively.

The steps in manufacturing the TFT will be described below with reference to FIGS. 11 to 15. The insulating substrate I was pre-processed to improve adhesion to the semiconductor layer 4, and the a-Si:H semiconductor layer 4 and the doping semiconductor layer 5 were deposited by a plasma CVD method on the entire surface of the insulating substrate 1 to have thicknesses 3,000 Å and 500 Å, respectively. The conditions for deposition of the a-Si:H semiconductor layer 4 were set as follows. That is, a substrate temperature $T_s$ was set to 250° C.; a flow rate of an $SiH_4$ gas ($SiH_4/H_2$ (10%)) diluted by an $H_2$ gas to have 10% was set to 300 SCCM; a pressure was set to 0.5 Torr; and an power density was set to 0.012 W/cm². The conditions for deposition of the doping semiconductor layer 5 were set as follows. That is, a substrate temperature $T_s$ was set to 250° C.; a source gas was supplied such that a ratio of a $PH_3$ gas to an $SiH_4$ gas ($PH_3/SiH_4$) was set to 5,000 ppm; a pressure was set to 0.5 Torr; an power density was set to 0.097 W/cm² (FIG. 11).

Figure 12:
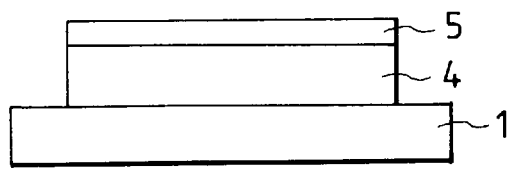

Thereafter, the semiconductor layer 4 and the doping semiconductor layer 5 were patterned by using a $CF_4+O_2$ gas by dry etching to have an island shape having a predetermined size (FIG. 12).

Figure 13:
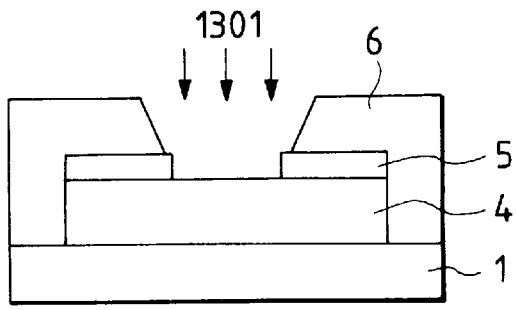
Figure 14:
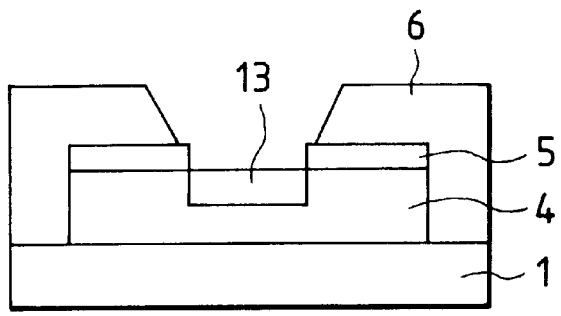

A 5,000-Å Al film was deposited on the resultant structure by a sputtering method and patterned to form the electrode 6, and the doping semiconductor layer 5 and the semiconductor layer 4 were partially removed by using a $CF_4+O_2$ gas by dry etching. An ArF 193-nm excimer laser beam 1301 was irradiated onto only a portion to be a channel portion through a mask formed on an optical system. The irradiation of the excimer laser beam was performed under the conditions, i.e., in an atmosphere including an $NH_3$ gas, at a pressure of 300 Torr, and at an energy density of 30 mJ/cm²(FIG. 13). In this manner, only a portion having a depth of 2,000 Å from the surface side of the semiconductor layer 4 was modified to form the insulating layer 13 serving as a gate insulating film (FIG. 14).

Figure 15:
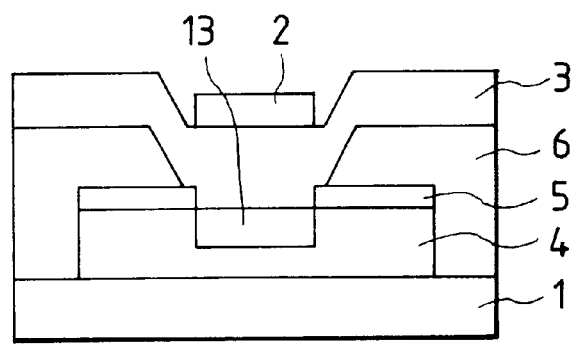

Finally, the insulating layer 3 was formed at 150° C. on the resultant structure by a plasma CVD method, thereby completing a TFT (FIG. 15). In this embodiment, the TFT can be manufactured at a low temperature, i.e., the maximum temperature in the manufacturing steps is se t to 250° C. In addition, the interface between the insulating layer 13 and the semiconductor layer 4 can be formed cleanly, and the insulating layer 13 is formed as a high-quality film at a low temperature.

When the characteristics of the TFT obtained as described above were evaluated, very preferable results could be obtained. In particular, an initial voltage $V_{th}$ was 1.5 V, an electron mobility was 0.7 cm²/V·S, and a $V_{th}$ shift after 1,000 hr operation in a reliability test was 1.0 V. As described above, the very preferable results are obtained.

Even in a TFT in which an $SiO_2$ film was formed by using an $N_2O$ gas as an atmosphere gas in formation of the insulating layer 13, a preferable result, i.e., a voltage $V_{th}$ of 1.5 V, could be obtained.

[Embodiment 2]

Figure 16:
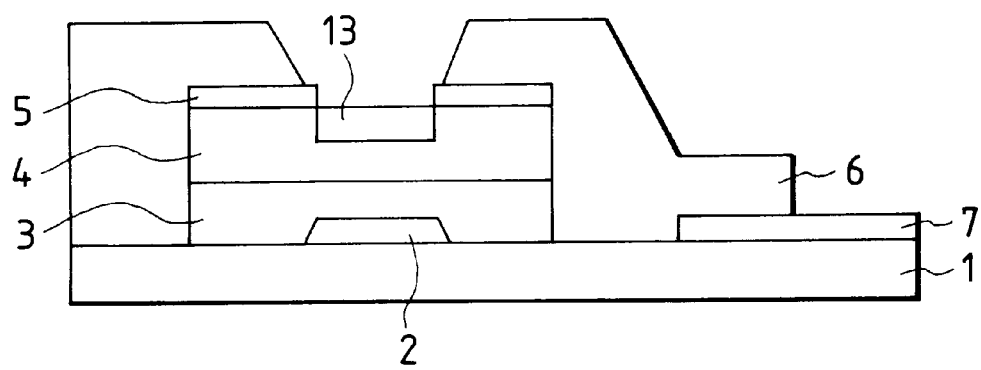

FIG. 16 shows another embodiment of the present invention. Reference numeral 1 denotes an insulating substrate such as a glass substrate. After an electrode 2 is formed on the insulating substrate 1, an insulating layer 3 consisting of SiN,, an a-Si:H semiconductor layer 4, and a doping semiconductor layer 5 are formed by patterning. An electrode 6 and a channel are formed on the resultant structure, and the surface of the semiconductor layer 4 is modified by an excimer laser into an insulating layer 13, thereby completing a TFT.

Figure 17:
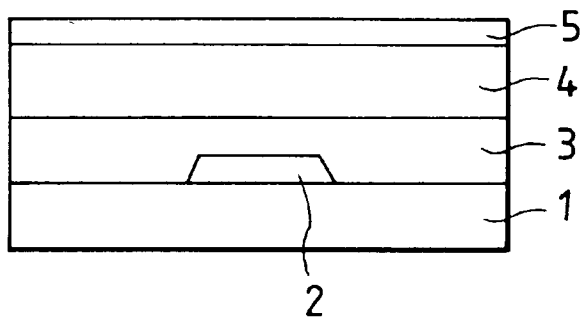

The steps in manufacturing the TFT will be described below with reference to FIGS. 17 to 20. A 1,000-Å Cr film was deposited by a sputtering method on the entire surface of a substrate at least whose surface had insulating properties, i.e., the insulating substrate 1, and then patterned as the gate electrode 2. The insulating layer 3 consisting of $SiN_x$, the a-Si:H semiconductor layer 4, and the doping semiconductor layer 5 were deposited on the resultant structure by a plasma CVD method to have thicknesses 3,000 Å, 3,000 Å, and 500 Å, respectively. The conditions for deposition of the insulating layer 3 are as follows. That is, a substrate temperature Ts was set to 350° C.; an $SiH_4/H_2$ (10%) and an $NH_3$ gas serving as a source gas were supplied into an inter-film space at flow rates of 50 SCCM and 140 SCCM; a pressure was set to 0.2 Torr; and an power density was set to 0.034 W/cm². The conditions for deposition of the a-Si:H semiconductor layer 4 were set as follows. That is, a substrate temperature $T_s$ was set to 250° C.; an $SiH_4/H_2$ (10%) gas serving as a source gas was supplied at a low rate of 300 SCCM; a pressure was set to 0.5 Torr; and an power density was set to 0.012 W/cm². The conditions for deposition of the doping semiconductor layer 5 were set as follows. That is, a substrate temperature $T_s$ was set to 250° C.; a $PH_3$ gas was supplied as a source gas such that a ratio of $PH_3/SiH_4$ was set to 5,000 ppm; a pressure was set to 0.5 Torr; an power density was set to 0.097 W/cm² (FIG. 17).

Figure 18:
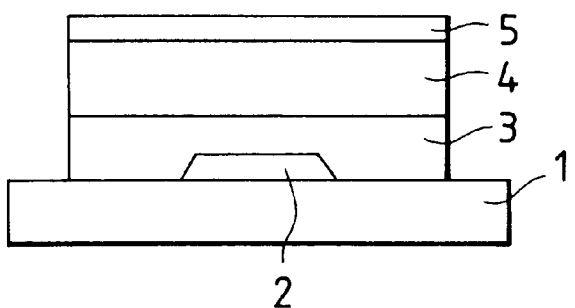

Thereafter, the insulating layer 3, the semiconductor layer 4, and the doping semiconductor layer 5 were patterned by using a $CF_4+O_2$ gas by dry etching to have an island shape (FIG. 18).

Figure 19:
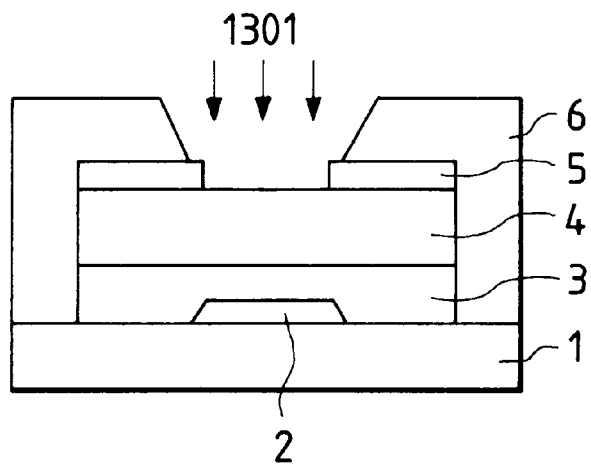
Figure 20:
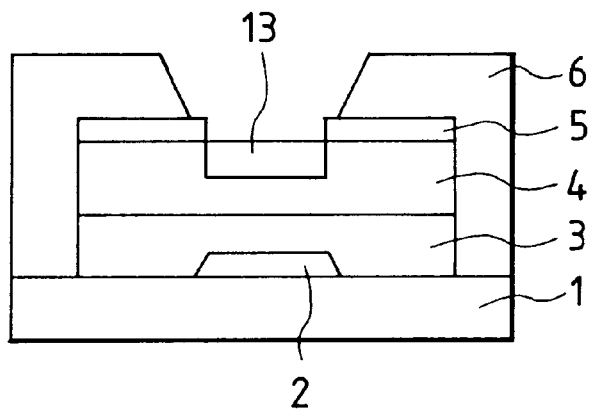

A 5,000-Å Al film was deposited on the resultant structure by a sputtering method and patterned to form the electrode 6, and the doping semiconductor layer 5 and the semiconductor layer 4 were partially removed by using a $CF_4+O_2$ gas by dry etching. Finally, an ArF 193-nm excimer laser beam 1301 was irradiated onto only a portion to be a channel portion through a mask formed on an optical system. The irradiation of the excimer laser beam was performed under the conditions, i.e., in an atmosphere including an $NH_3$ gas, at a pressure of 300 Torr, and at an energy density of 30 $mJ/cm^2$ (FIG. 19). In this manner, only a portion having a depth of 2,000 Å from the surface side of the semiconductor layer 4 was modified to form the insulating layer 13 serving as a channel protective layer (FIG. 20). In this embodiment, the insulating layer 13 for channel protection was formed in the final step. However, in this embodiment, the number of masks could be reduced compared with the example shown in FIG. 4, the interface between the insulating layer 13 and the semiconductor layer 4 was formed substantially cleanly, and the insulating layer 13 was formed as a high-quality film at a low temperature.

When the characteristics of the TFT obtained as described above were evaluated, very preferable results could be obtained. As initial characteristics, a voltage $V_{th}$ was 1.0 V and an electron mobility was 0.5 $cm^2/V \cdot S$. In particular, the voltage $V_{th}$, the electron mobility, and variations in temperature characteristics could be considerably reduced without increasing the number of masks.

[Embodiment 3]

Figure 21:
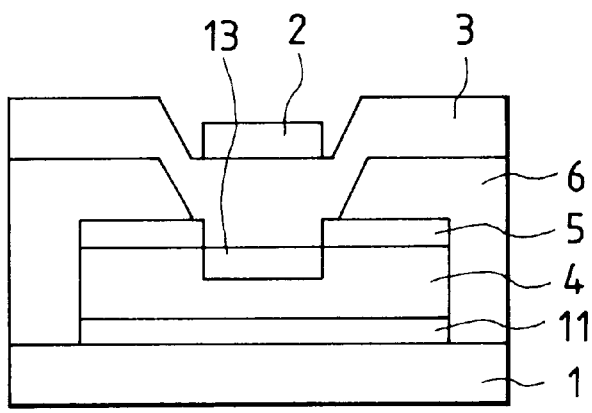

FIG. 21 is a typical sectional view showing still another embodiment of the present invention. This embodiment is a modification of the arrangement shown in Embodiment 1. In this modification, to improve the adhesion between the insulating substrate 1 and the semiconductor layer 4, an a-Si:H semiconductor layer or an SiNx insulating layer was deposited as an underlying layer 11 on the entire surface of the insulating substrate 1 to have a thickness of 500 Å, and, subsequently, the a-Si:H semiconductor layer 4 and the doping semiconductor layer 5 were deposited without breaking a vacuum state. The a-Si:H semiconductor layer serving as the underlying layer 11 was formed such that a substrate temperature $T_s$ was set to 250° C., an $SiH_4$ (100%) serving as a source gas was supplied at a flow rate of 40 SCCM, a pressure was set to 0.05 Torr, and an power density was set to 0.15 $W/cm^2$. The $SiN_x$ insulating film was formed such that a substrate temperature Ts was set to 250° C., an $SiH_4/H_2$ (10%) serving as a source gas was supplied at a flow rate of 50 SCCM, an $NH_3$ gas was supplied at a flow rate of 140 SCCM, a pressure was set to 0.2 Torr, and an power density was set to 0.034 $W/cm^2$.

Since the TFT obtained in this embodiment had the underlying layer 11 deposited on the insulating substrate 1, the adhesion between the insulating substrate 1 and the semiconductor layer 4 could be improved without degrading the TFT characteristics, and a throughput could be increased without using another pre-process. Therefore, a TFT could be manufactured at a low cost.

Figure 22:
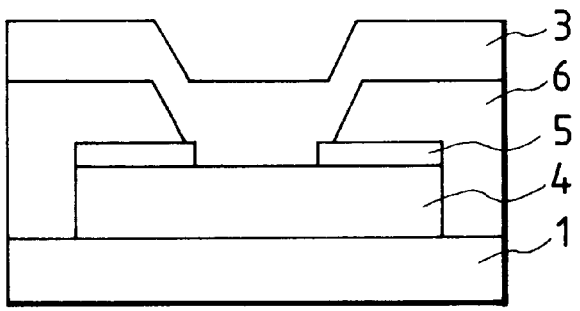

FIG. 22 is a typical sectional view showing a co-planar type a-Si:H photosensor which is obtained in such a manner that, in formation of an insulating layer 13 by an excimer laser when a TFT is to be manufactured in the manufacturing steps according to the present invention shown in Embodiment 1, the energy of the excimer laser is irradiated onto only a portion to be the TFT while a mask formed on the optical system is opened so as to modify the portion except for the other portion. Since a TFT and a photosensor could be formed on the same substrate in the same processes, inexpensive high-performance image reading apparatuses could be manufactured at a high throughput.

In this embodiment, the a-Si:H semiconductor layer 4 for a photosensor required a thickness of about 5,000 Å to improve an S/N ratio, the a-Si:H semiconductor layer 4 for a TFT had a thickness of 5,000 Å in deposition of the a-Si:H semiconductor layer 4 to obtain a high-speed operation or to prevent the TFT from being erroneously operated due to light. When the gate inflating)layer of the TFT portion was modified by an excimer laser, the a-Si:H semiconductor layer 4 was modified to have a depth of 4,000 Å.

Figure 23:
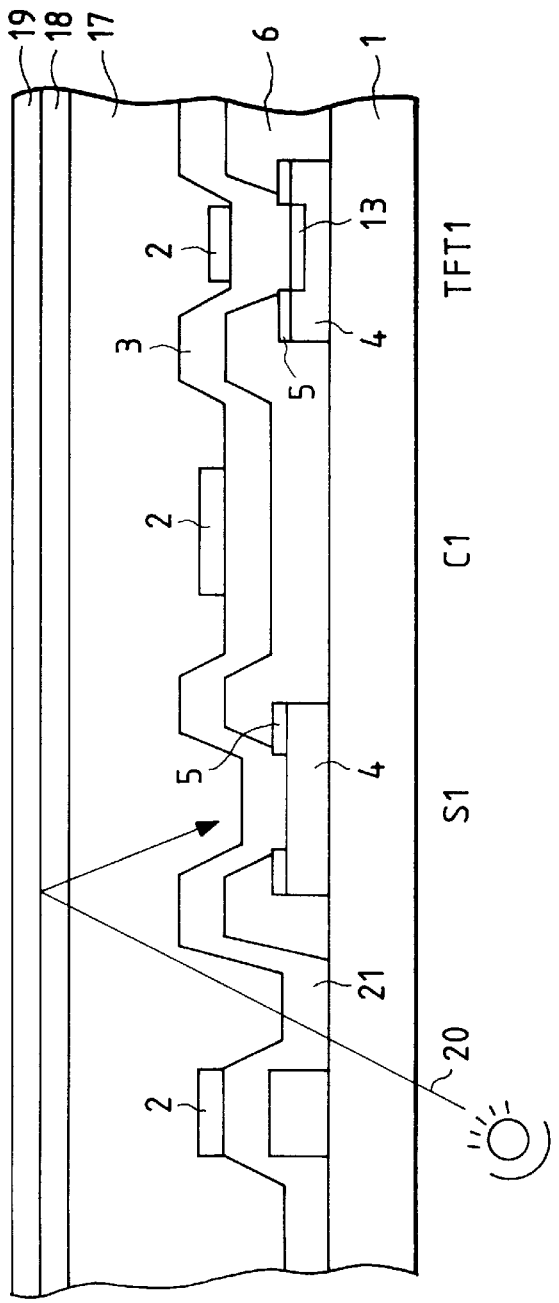

FIG. 23 is a typical sectional view showing an image reading apparatus using the TFT in Embodiment 1. Reference symbol S1 denotes a co-planar type a-Si:H photosensor portion formed by the a-Si:H semiconductor layer 4 onto which the excimer laser is not irradiated; C1, a capacitor portion for accumulating charges generated by the photosensor portion S1; and TFT1, an a-Si:H TFT modified by irradiating the excimer laser onto a channel portion and serving as a transfer TFT for transferring the accumulated charges. Referring to FIG. 23, a one-dimensional image reading apparatus obtained by combining such elements at 1,728 bits can perform image reading at a low cost and high reliability. Although not shown, a two-dimensional image reading apparatus can be formed by combining these elements as a matter of course.

According to this embodiment, when a TFT and a shift resistor serving as a drive system are to be formed on the same substrate as that of the co-planar type photosensor, these elements can be formed by masks which are equal to in number those in formation of the TFT. A high-performance image reading apparatus in which a high-output photosensor was combined to a high-performance TFT and a shift resistor could be manufactured at a low cost.

[Embodiment 5]

Figure 24:
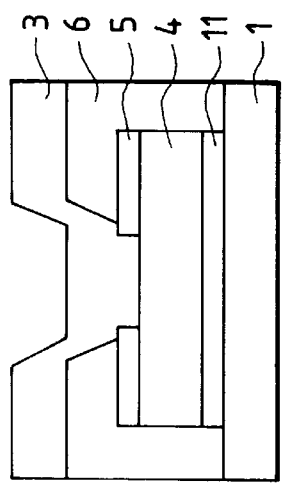

FIG. 24 is a typical sectional view showing a co-planar type a-Si:H photosensor which can be formed without increasing the number of masks as in Embodiment 4 when a TFT is manufactured in the manufacturing steps according to the present invention shown in Embodiment 3. The a-Si:H photosensor in this embodiment can obtain a light output which is three times or more the light output of the same a-Si:H semiconductor layer by the effect of an underlying layer 11. Therefore, a high-performance image reading apparatus in which a high-output photosensor was combined to a high-performance TFT and a shift resistor could be manufactured at a low cost.

[Embodiment 6]

Figure 25:
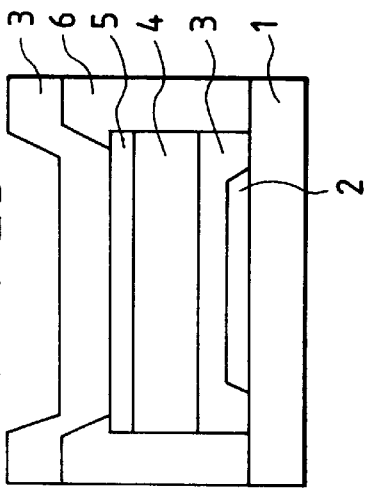

FIG. 25 is a typical sectional view showing a MIS type a-Si:H photosensor which can be formed without increasing the number of masks when a TFT is manufactured in the manufacturing steps according to the present invention shown in Embodiment 2. Since the a-Si:H sensor according to this embodiment could achieve high-speed response, when the a-Si:H sensor was combined to a TFT and a shift register, a high-performance image reading apparatus could be manufactured at a low cost.

[Embodiment 7]

A case wherein the TFT explained in Embodiment 1 is applied to a liquid crystal display apparatus will be described below.

Figure 26:
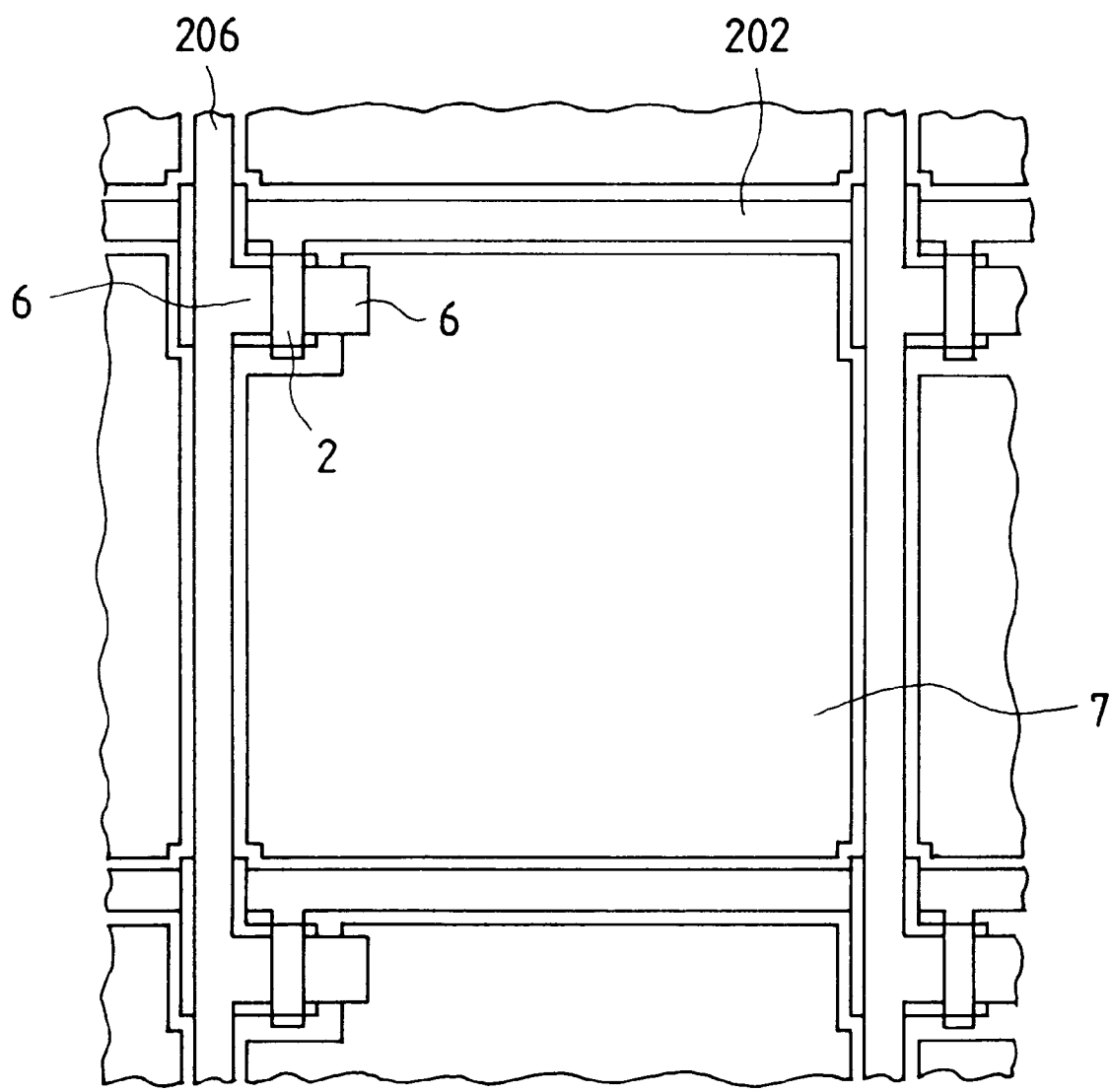
FIGS. 26 and 60 are typical plan views showing liquid crystal display apparatuses to which the present invention can be applied.

FIG. 26 is a typical plan view showing a liquid crystal display apparatus. Referring to FIG. 26, reference numeral 7 denotes a discrete electrode which is a pixel electrode here. Reference numeral 206 denotes a data line to which one side of an electrode 6; and 202, a gate line connected to an electrode serving as a gate. An electrode (not shown) is arranged to oppose the discrete electrode 7, and a liquid crystal material is interposed between these electrodes.

In the liquid crystal display apparatus according to this embodiment, a uniform image having a high contrast could be displayed in a large area.

The production yield of the liquid crystal display apparatus was high, and it was manufactured at a low cost.

[Embodiment 8]

Figure 27:
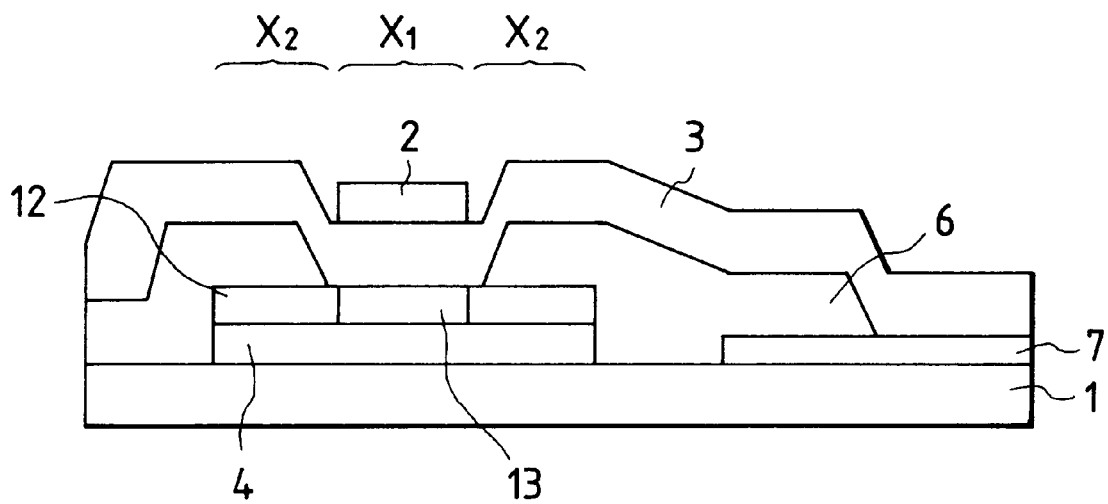

FIG. 27 is a typical sectional view showing a TFT according to still another embodiment of the present invention. Reference numeral 1 denotes a substrate at least whose surface has insulating properties (insulating substrate) such as a glass substrate. An a-Si:H semiconductor layer 4 is formed on the insulating substrate 1, a portion (region indicated by X. in FIG. 27 and serving as a first region) to be a channel of a TFT is modified by an excimer laser into an insulating layer 13 consisting of $SiO_2$, $Si_3N_4$, or the like, and a portion (region indicated by $X_2$ in FIG. 27 and serving as a second region) to be a source/drain electrode is modified by excimer laser doping to modify the semiconductor layer 4 into a doping semiconductor layer 12. Thereafter, a main electrode 6 is formed, and then an insulating layer 3 and a gate electrode 2 are formed. Note that reference numeral 7 denotes a discrete electrode.

Figure 28:
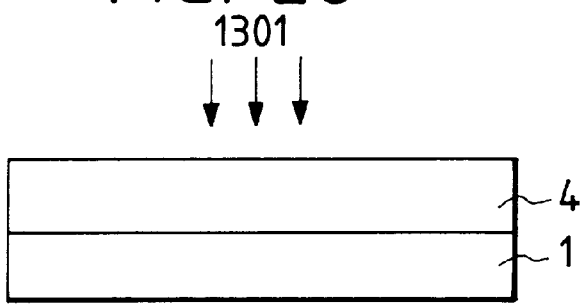

The steps in manufacturing the TFT will be described below with reference to FIGS. 28 to 33. The insulating substrate 1 was pre-processed to improve adhesion to the semiconductor layer 4, and the a-Si:H semiconductor layer 4 was deposited by a plasma CVD method on the entire surface of the insulating substrate 1. The conditions for deposition of the a-Si:H semiconductor layer 4 were set as follows: substrate temperature $T_s$=250° C.; $SiH_4/H_2$ (10%)= 300 SCCM; pressure=0.5 Torr; power density=0.012 W/cm²; and thickness=3,000 Å. Thereafter, an ArF 193-nm excimer laser beam 1301 was irradiated onto only a portion to be a channel portion of the TFT at an energy density of 30 mJ/cm² in an $NH_3$-containing atmosphere at a pressure of 300 Torr to modify a portion having a depth of 2,000 Å from the surface side of the a-Si:H semiconductor layer 4, thereby forming a insulating layer 13 serving as a gate insulating film (FIG. 28).

Figure 29:
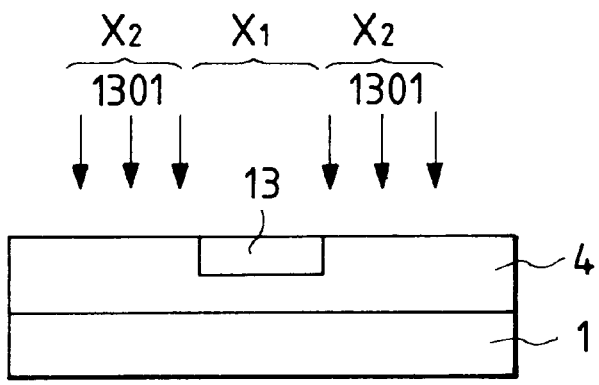
Figure 30:
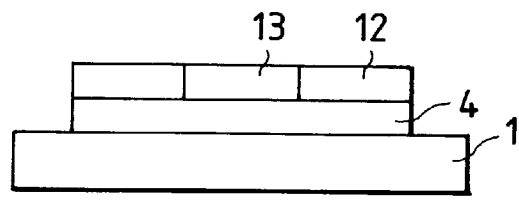

Subsequently, the atmosphere was changed to contain a $PCl_3$ gas and have a pressure of 5 Torr, the ArF 193-nm excimer laser beam 1301 was irradiated onto only a portion to be a source/drain electrode of the TFT (FIG. 29). In this manner, P atoms were diffused in the semiconductor layer 4 of the excimer-laser-irradiated portion to form the doping semiconductor layer 12 serving as an ohmic contact layer in a depth of 2,000 Å from the surface side. Thereafter, the semiconductor layer 4 and the doping semiconductor layer 12 were patterned by using a $CF_4+O_2$ gas by dry etching to have an island shape (FIG. 30).

Figure 31:
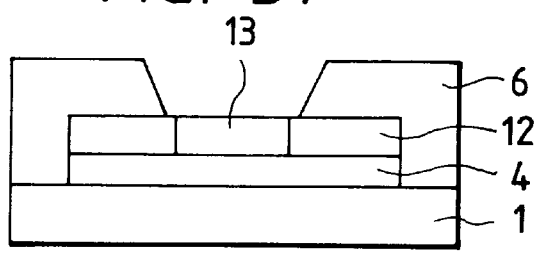

A 5,000-Å Al film was deposited on the resultant structure by a sputtering method and patterned to form the electrode 6 (FIG. 31).

Figure 32:
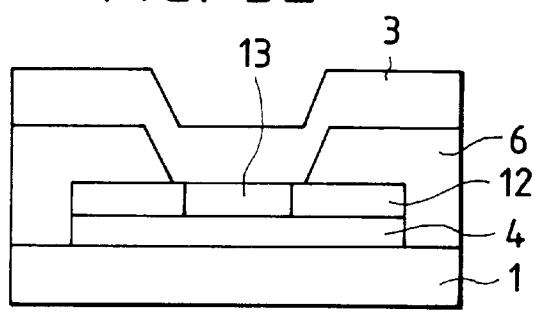

Subsequently, the insulating layer 3 was formed at 150° C. by a plasma CVD method (FIG. 32).

Figure 33:
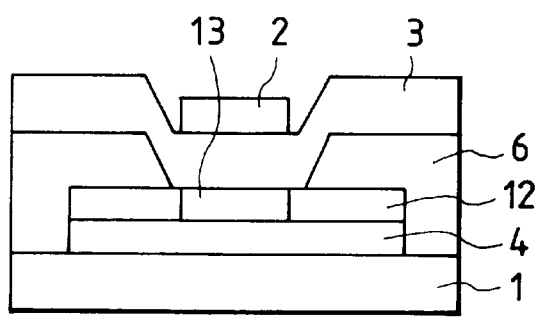

Further, an Al film was deposited by a sputtering method and patterned to form the electrode 2 serving as a gate electrode, thereby completing a TFT (FIG. 33).

In this embodiment, the TFT can be manufactured at a low temperature, i.e., the maximum temperature in the manufacturing steps is set to 250° C., the interface between the insulating layer 13 and the semiconductor layer 4 is formed substantially cleanly, and the insulating layer 13 is formed as a high-quality film at a low temperature. In addition, the doping semiconductor layer 12 was formed with a uniform thickness and preferable film quality throughout the entire substrate. In this embodiment, a mask was formed on the optical system of the excimer laser, and the laser energy was irradiated, through the mask, onto only a portion which was required to be irradiated. For this reason, a TFT could be completed without increasing the number of photomasks and without ununiformity of the step of etching the doping semiconductor layer 12.

When the characteristics of the TFT obtained as described above were evaluated, the following very preferable results could be obtained. That is, an ON/OFF ratio was increased by about 10 times that of the prior art, an initial voltage $V_{th}$ of 1.5 V and an electron mobility of 0.7 cm²/V·S were obtained because the quality of the insulating layer 13 was improved and the interface between the insulating layer 13 and the a-Si:H layer 4 was cleaned. In addition, a $V_{th}$ shift after 1,000 hr operation in a reliability test was 1.0 V.

Even in a TFT in which an $SiO_2$ film was formed by using an $N_2O$ gas as an atmosphere gas in formation of the insulating layer 13, a preferable result, i.e., a voltage $V_{th}$ of 1.5 V, could be obtained.

[Embodiment 9]

Figure 34:
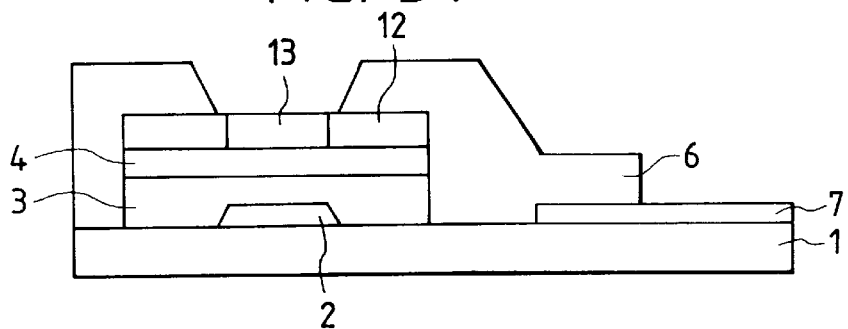

FIG. 34 is a sectional view showing still another embodiment of the present invention. Reference numeral 1 denotes an insulating substrate such as a glass substrate. After a gate electrode 2 is formed on the insulating substrate 1, an insulating layer 3 consisting of $SiO_2$ or SiN, and an a-Si:H semiconductor layer 4 are formed, a portion to be a channel of a TFT is modified by an excimer laser into an insulating layer 13 consisting of $SiO_2$, $Si_3N_4$, or the like, and a portion to be a source/drain electrode is modified by excimer laser doping to modify the semiconductor layer 4 into a doping semiconductor layer 12. A main electrode 6 is formed, thereby completing a TFT.

Figure 35:
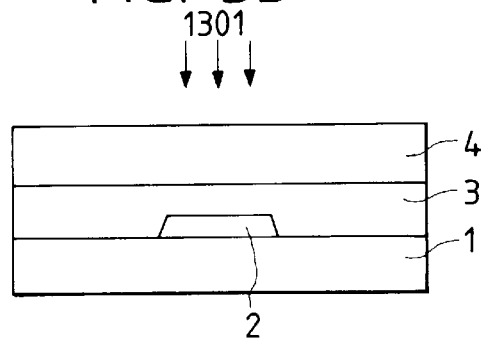

The steps in manufacturing the TFT will be described below with reference to FIGS. 35 to 38. A 1,000-Å Cr film was deposited on the entire surface of the insulating substrate 1 by a sputtering method and patterned as a gate electrode 2, and the insulating layer 3 consisting of SiN, and the a-Si:H semiconductor layer 4 were deposited by a plasma CVD method to each have a thickness of 3,000 Å. The conditions for deposition of the insulating layer 3 were set as follows: substrate temperature $T_s$=350° C.; $SiH_4/H_2$ (10%)=50 SCCM; $NH_3$=140 SCCM; pressure=0.2 Torr; and power density=0.034 W/cm². The conditions for deposition of the a-Si:H semiconductor layer 4 were set as follows: substrate temperature $T_s$=250° C.; $SiH_4/H_2$ (10%)=300 SCCM; pressure=0.5 Torr; and power density=0.012 W/cm². Thereafter, an ArF 193-nm excimer laser beam 1301 was irradiated onto only a portion to be a channel portion of the TFT at an energy density of 30 mJ/cm² in an $NH_3$-containing atmosphere at a pressure of 300 Torr (FIG. 35).

Figure 36:
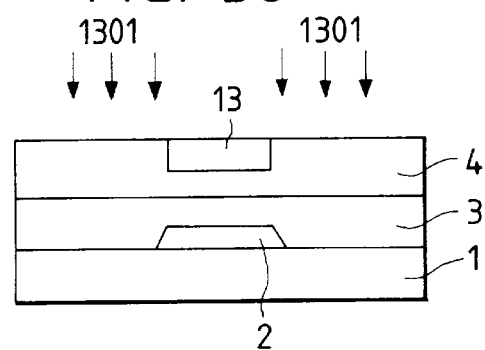
Figure 37:
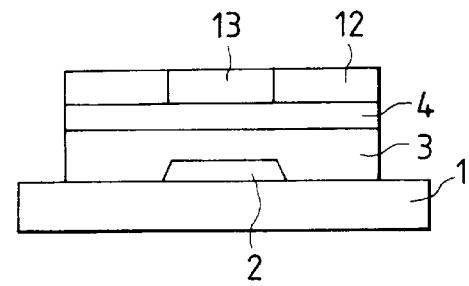
Figure 38:
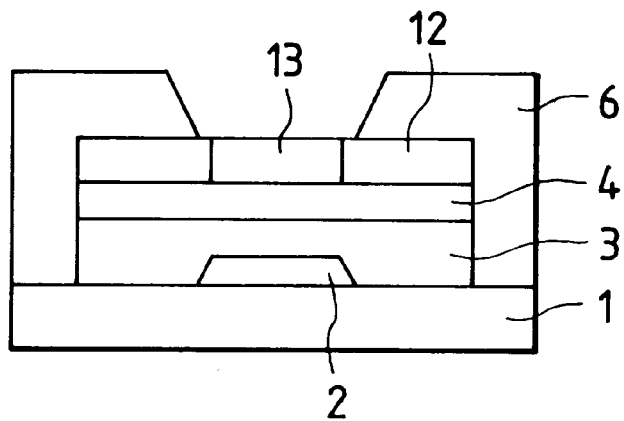

In this manner, only a portion having a depth of 2,000 Å from the surface side of the a-Si:H semiconductor layer 4 was modified into $S_3N_4$, thereby forming a insulating layer 13 serving as a channel protective layer. Subsequently, an atmosphere containing a $PCl_3$ gas and having a pressure of 5 Torr was set, the ArF 193-nm excimer laser beam 1301 was irradiated onto only a portion to be a source/drain electrode of the TFT (FIG. 36). In this manner, P atoms were diffused in the semiconductor layer 4 of the excimer-laser-irradiated portion to form the doping semiconductor layer 12 serving as an ohmic contact layer in a depth of 2,000 Å from the surface side. Thereafter, the semiconductor layer 4 and the doping semiconductor layer 12 were patterned by using a $CF_4+O_2$ gas by dry etching to have an island shape (FIG. 37). A 5,000-Å Al film was deposited on the resultant structure by a sputtering method and patterned to form the electrode 6, thereby completing a TFT (FIG. 38).

Figure 1:
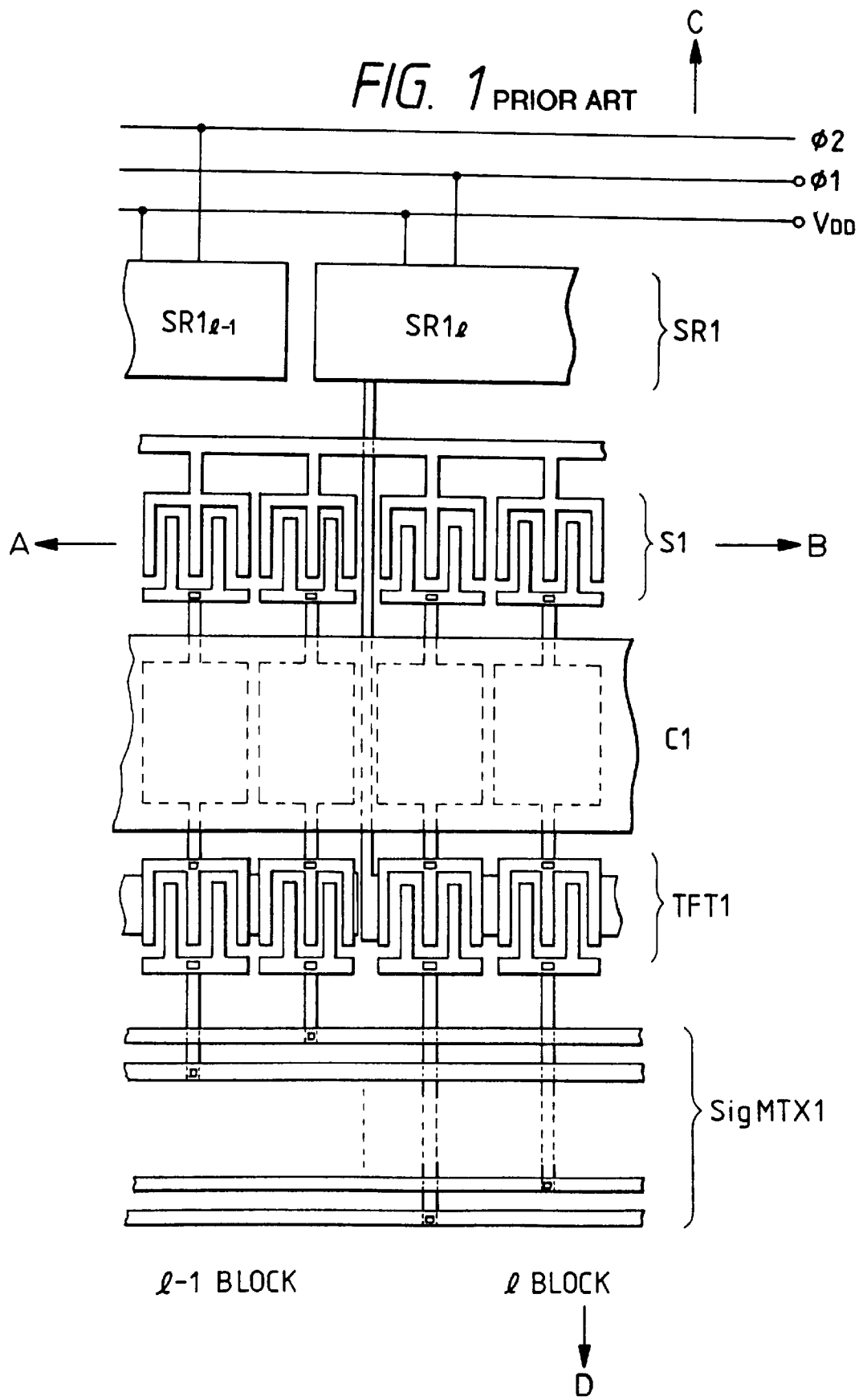
FIG. 1 is a schematic plan view showing the arrangement of an image reading apparatus.
Figure 2:
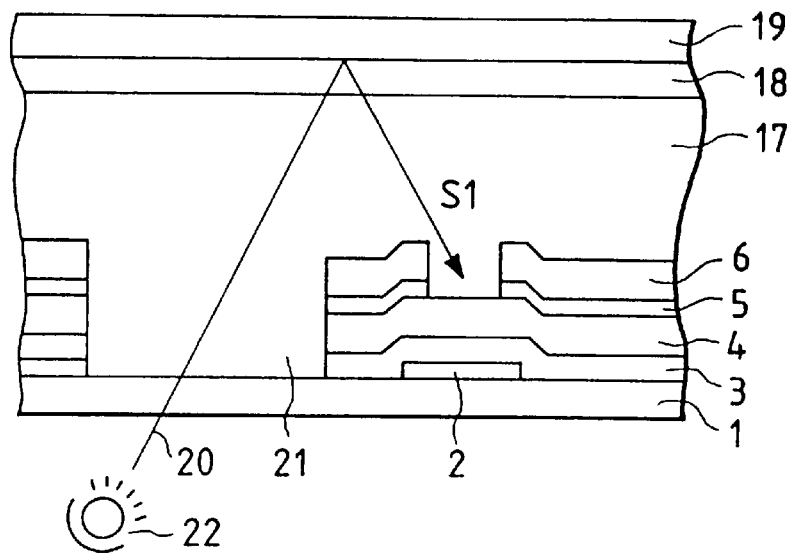
FIG. 2 is a typical sectional view showing a photosensor section.
Figure 3:
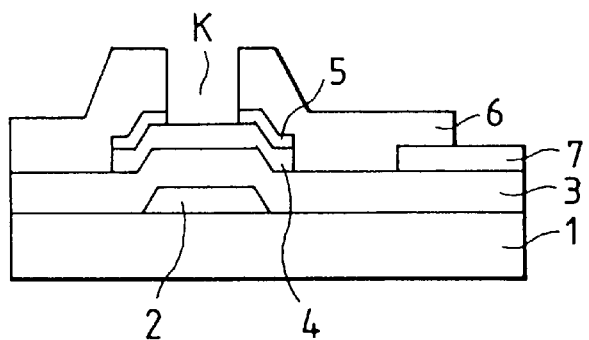
FIGS. 3 to 5 are typical sectional views showing thin-film transistors (TFTs).
Figure 4:
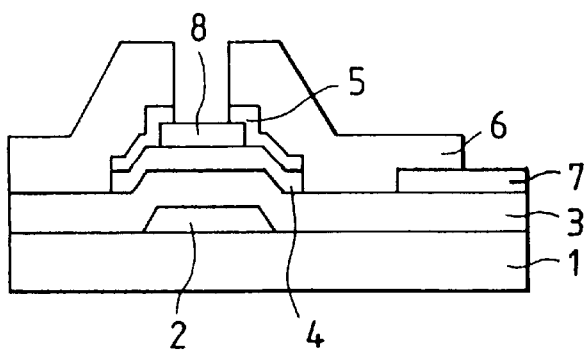
Figure 5:
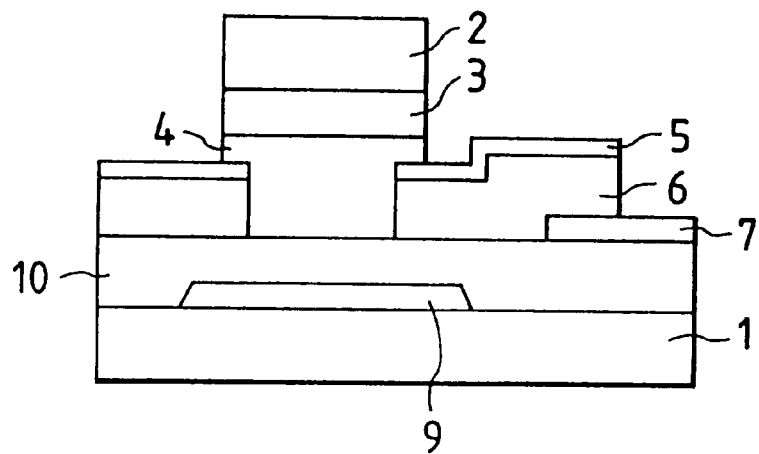
Figure 6:
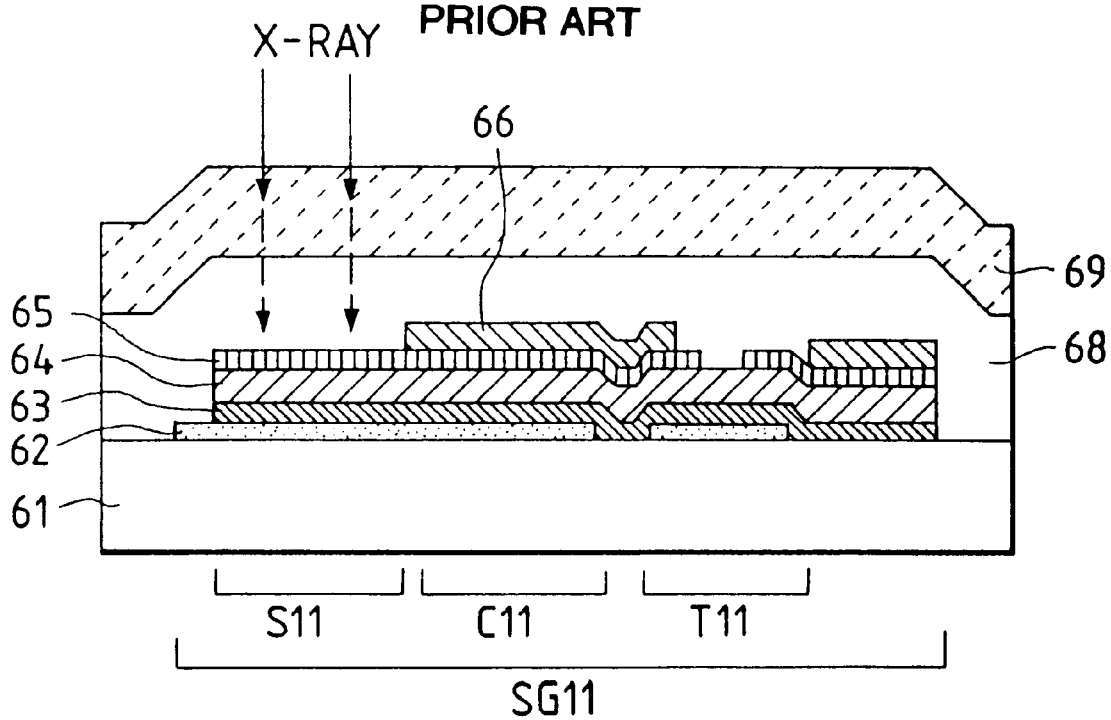
FIG. 6 is a typical sectional view for explaining an electromagnetic wave detecting apparatus.
Figure 7:
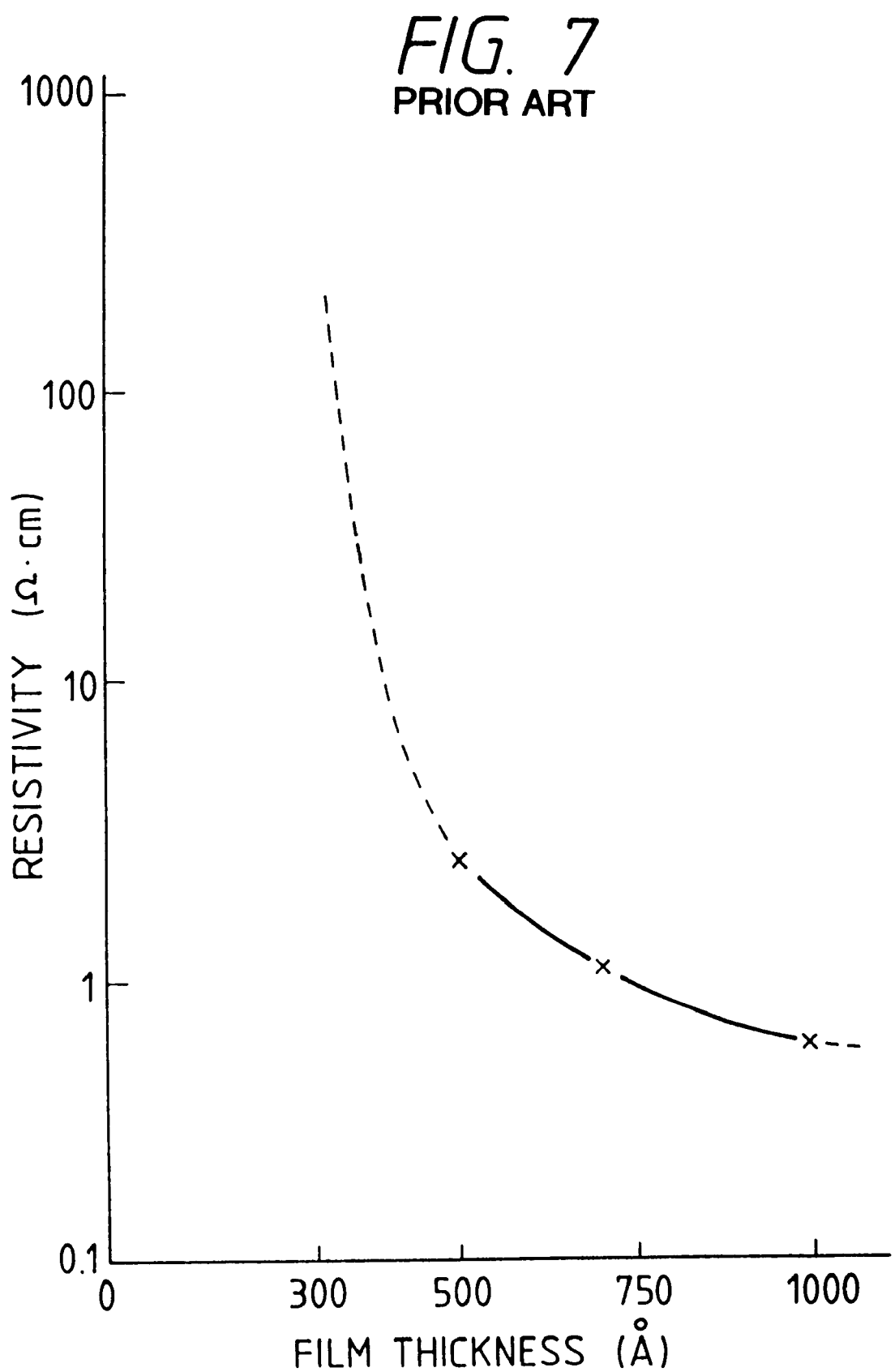
FIG. 7 is a graph showing the relationship between the film thickness and the resistivity of a doping semiconductor layer obtained by a plasma CVD method.
Figure 8:
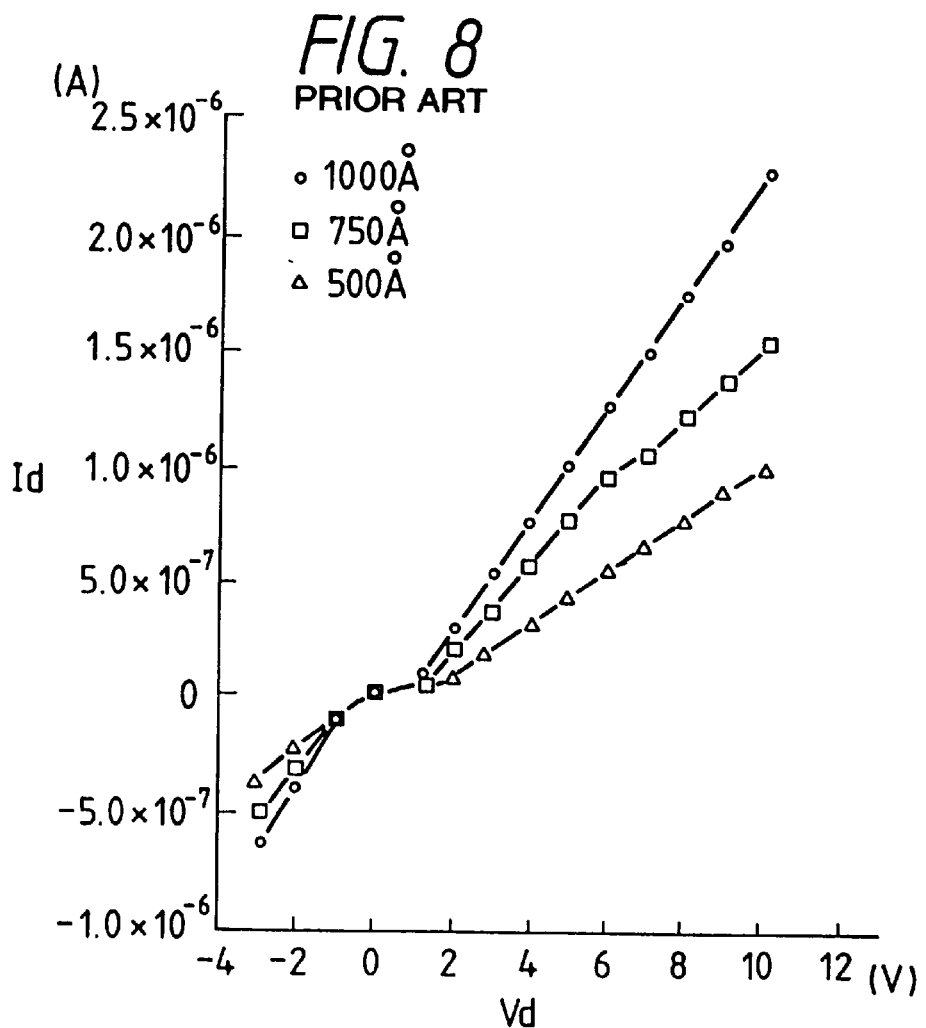
FIG. 8 is a graph for explaining a dependency of the transfer capability of a thin-film transistor on the film thickness of a doping semiconductor layer.
Figure 9:
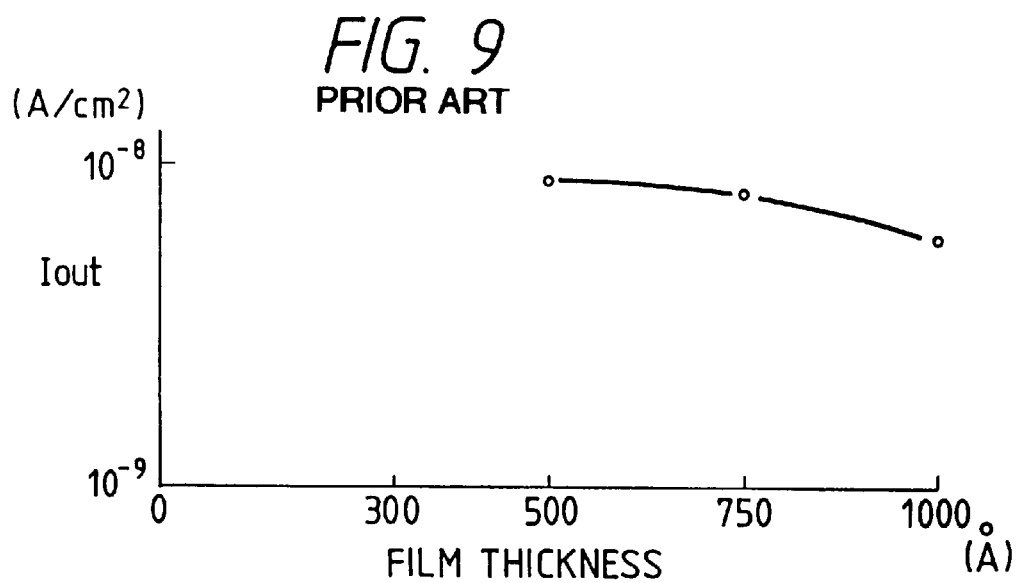
FIG. 9 is a graph for explaining a dependency of the light output of a photosensor on the film thickness of the doping semiconductor layer.

In this embodiment, the number of masks can be reduced compared with the number of masks used in a TFT having the structure shown in FIG. 4, the interface between the insulating layer 13 and the semiconductor layer 4 is formed substantially cleanly, and the insulating layer 13 is formed as a high-quality film at a low temperature. In addition, the doping semiconductor layer 12 was formed with a uniform thickness and preferable film quality throughout the entire substrate. Therefore, a TFT could be completed without ununiformity of the step of etching the doping semiconductor layer 12.

When the characteristics of the TFT obtained as described above were evaluated, the following results could be obtained. That is, with improve the quality of the doping semiconductor layer 12, an ON/OFF ratio was increased, an initial voltage $V_{th}$ of 1.0 V and an electron mobility of 0.7 $cm^2/V \cdot S$ were obtained because the quality of the insulating layer 13 was improved and the interface between the insulating layer 13 and the a-Si:H layer 4 was cleaned. In addition, the voltage $V_{th}$, the electron mobility, and variations in temperature characteristics could be considerably reduced without increasing the number of masks.

[Embodiment 10]

Figure 39:
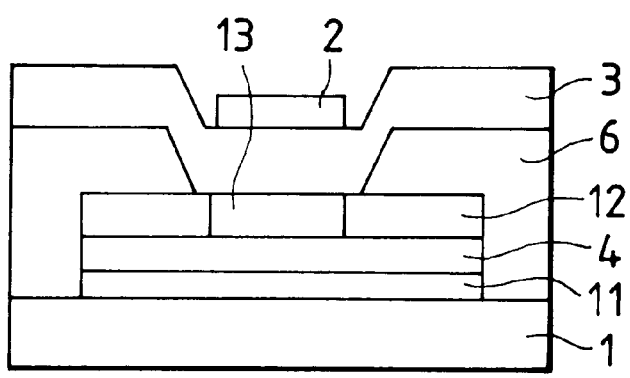

FIG. 39 is a typical sectional view showing still another embodiment of the present invention. This embodiment is a modification of the arrangement shown in Embodiment 8. In this modification, to improve the adhesion between the insulating substrate 1 and the semiconductor layer 4, an a-Si:H semiconductor layer or an $SiN_x$ insulating layer was deposited as an underlying layer 11 on the entire surface of the insulating substrate 1 to have a thickness of 500 Å, and, subsequently, the a-Si:H semiconductor layer 4 was deposited without breaking a vacuum state. The a-Si:H semiconductor layer serving as the underlying layer 11 was formed under the deposition conditions: substrate temperature $T_s$=250° C.; $SiH_4$ (100%)=40 SCCM; Press.=0.05 Torr; and power density=0.15 W/cm². The $SiN_x$ insulating film was formed under the deposition condition: $T_s$=250° C.; $SiH_4/H_2$ (10%)=50 SCCM; $NH_3$=140 SCCM; pressure=0.2 Torr, and power density=0.034 W/cm².

Since the TFT obtained in this embodiment had the underlying layer 11 deposited on the insulating substrate 1, the adhesion between the insulating substrate 1 and the semiconductor layer 4 could be improved without degrading the TFT characteristics, and a throughput could be increased without using another pre-process. Therefore, a TFT could be manufactured at a low cost.

[Embodiment 11]

Figure 40:
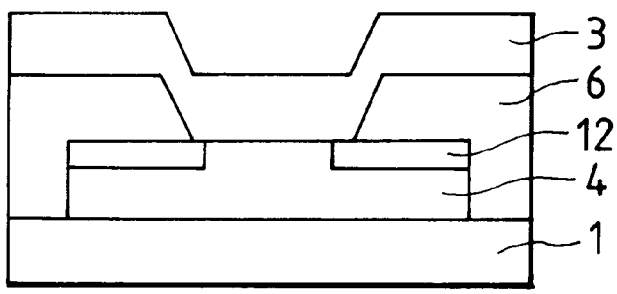

FIG. 40 is a typical sectional view showing a co-planar type a-Si:H photosensor which is obtained in such a manner that, in formation of an insulating layer 13 by an excimer laser when a TFT is to be manufactured in the manufacturing steps according to the present invention shown in Embodiment 8, the energy of the excimer laser is irradiated onto only a portion to be the TFT while a mask formed on the optical system is opened so as to modify the portion except for the other portion. According to this arrangement, since a TFT and a photosensor could be easily formed on the same substrate in the same processes, inexpensive high-performance image reading apparatuses could be manufactured at a high throughput.

In this embodiment, the a-Si:H semiconductor layer 4 for a photosensor required a thickness of about 5,000 Å to improve an S/N ratio, the a-Si:H semiconductor layer 4 for a TFT had a thickness of 5,000 Å in deposition of the a-Si:H semiconductor layer 4 to obtain a high-speed operation or to prevent the TFT from being erroneously operated due to light. When the gate insulating layer of the TFT portion was modified by an excimer laser, the a-Si:H semiconductor layer 4 was modified to have a depth of 4,000 Å.

FIG. 41 is a typical sectional view showing an image reading apparatus using the TFT in Embodiment 8. Reference symbol Si denotes a co-planar type a-Si:H photosensor portion formed such that only the doping semiconductor layer 12 is formed by excimer laser doping; Cl, a capacitor portion for accumulating charges generated by the photosensor portion Si; and TFT1, an a-Si:H TFT modified by irradiating the excimer laser onto a channel portion and serving as a transfer TFT for transferring the accumulated charges. Referring to FIG. 41, a one-dimensional image reading apparatus obtained by combining such elements at 1,728 bits can perform image reading at a low cost and high reliability. Although not shown, a two-dimensional image reading apparatus can be formed by combining these elements as a matter of course.

According to this embodiment, when a TFT and a shift resistor serving as a drive system are to be formed on the same substrate as that of the co-planar type photosensor, these elements can be formed by masks which are equal to in number those in formation of the TFT, and the step of etching the doping semiconductor layer of the co-planar type photosensor is unnecessary. For this reason, variations in characteristics of the photosensor could be reduced, and a high-performance image reading apparatus could be manufactured at a low cost.

[Embodiment 12]

FIG. 42 is a typical sectional view showing a co-planar type a-Si:H photosensor which can be formed without increasing the number of masks as in Embodiment 11 when a TFT is manufactured in the manufacturing steps according to the present invention shown in Embodiment 10. The a-Si:H photosensor in this embodiment could obtain a light output which was three times or more the light output of the same a-Si:H semiconductor layer by the effect of an underlying layer 11. Therefore, a high-performance image reading apparatus in which a high-output photosensor was combined to a high-performance TFT and a shift resistor could be manufactured at a low cost.

[Embodiment 13-1]

FIG. 43 is a typical sectional view showing a MIS type a-Si:H photosensor which can be formed without increasing the number of masks when a TFT is manufactured in the manufacturing steps according to the present invention shown in Embodiment 9. Reference numeral 15 denotes a control electrode. Since the a-Si:H sensor according to this embodiment could achieve high-speed response, when the a-Si:H sensor was combined to a TFT and a shift register, a high-performance image reading apparatus could be manufactured at a low cost.

[Embodiment 13-2]

When a liquid crystal display apparatus as shown in FIG. 26 was manufactured using the TFT shown in FIG. 27 in the same manner as in Embodiment 7, an excellent image display free from ununiformity throughout the entire screen region could be performed as in Embodiment 7.

[Embodiment 14]

Figure 44:
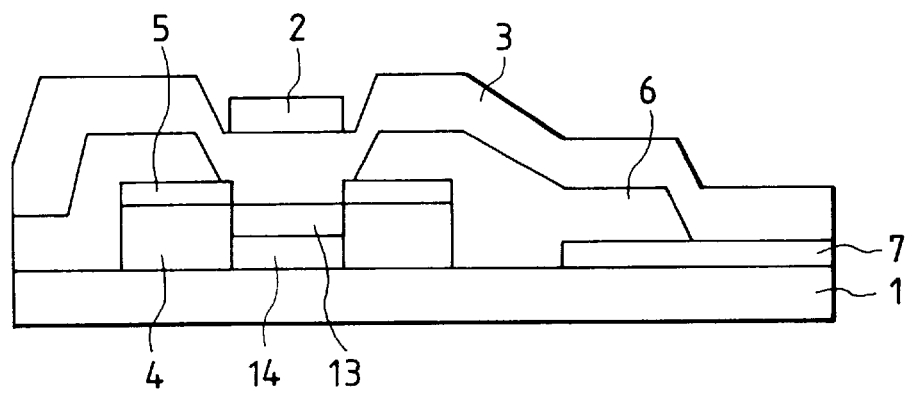

FIG. 44 is a typical sectional view showing still another embodiment of the present invention. Reference numeral 1 denotes an insulating substrate such as a glass substrate. A semiconductor layer 4 consisting of an amorphous silicon (to be referred to as a-Si:H hereinafter), a doping semiconductor layer 5, and an electrode 6 are formed and patterned, and a portion of the semiconductor layer 4 to be used as a channel of a TFT is modified into an insulating layer 13 consisting of $SiO_2$, $Si_3N_4$, or the like by an excimer laser. Subsequently, the semiconductor layer 4 under the insulating layer 13 is modified by the excimer laser into a semiconductor layer 14 consisting of polysilicon (to be referred to as P-Si hereinafter). Thereafter, an insulating layer 3 and a gate electrode 2 are formed. Note that reference numeral 7 denotes a discrete electrode.

Figure 45:
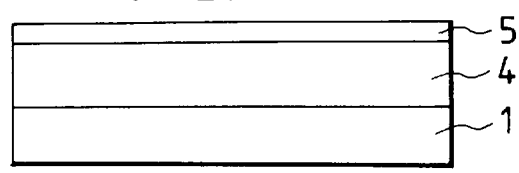
Figure 46:
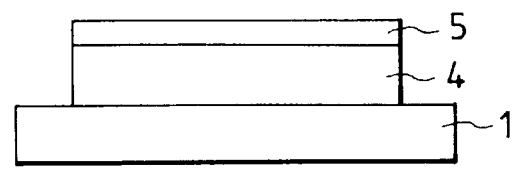
Figure 47:
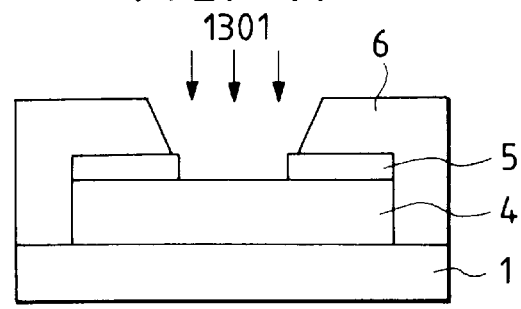
Figure 48:
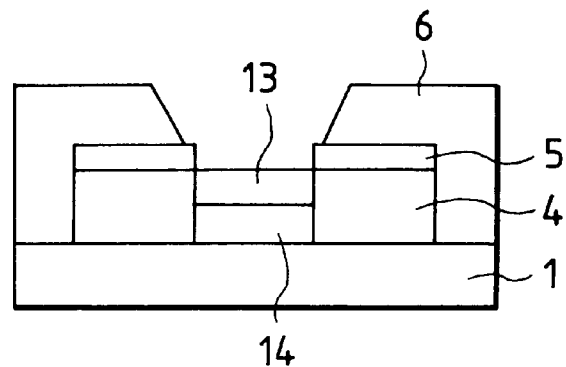
Figure 49:
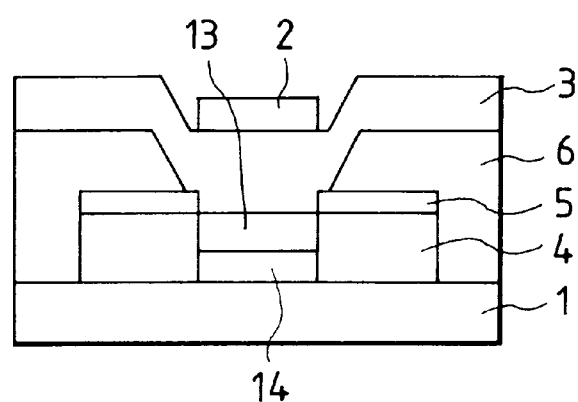

The steps in manufacturing the TFT will be described below with reference to FIGS. 45 to 49. The insulating substrate 1 was pre-processed to improve adhesion to the semiconductor layer 4, and the a-Si:H semiconductor layer 4 and the doping semiconductor layer 5 were deposited by a plasma CVD method on the entire surface of the insulating substrate 1 to have thicknesses 3,000 Å and 500 Å, respectively. The conditions for deposition of the a-Si:H semiconductor layer 4 were set as follows: substrate temperature $T_s$= 250° C.; $SiH_4/H_2$ (10%)=300 SCCM; pressure=0.5 Torr; and power density=0.012 W/cm². The conditions for deposition of the doping semiconductor layer 5 were set as follows: substrate temperature $T_s$=250° C.; $PH_3/SiH_4$ (serving as a doping gas)=5,000 ppm; pressure=0.5 Torr; power density= 0.097 W/cm² (FIG. 45). Thereafter, the semiconductor layer 4 and the doping semiconductor layer 5 were patterned by using a $CF_4+O_2$ gas by dry etching to have an island shape (FIG. 46). A 5,000-Å Al film was deposited on the resultant structure by a sputtering method and patterned to form the electrode 6, and the doping semiconductor layer 5 and the semiconductor layer 4 were partially removed by using a $CF_4+O_2$ gas by dry etching. An ArF 193-nm excimer laser was irradiated onto only a portion to be a channel portion through a mask formed on an optical system. The irradiation of the excimer laser beam was performed under the conditions, i.e., in an atmosphere including an $NH_3$ gas, at a pressure of 300 Torr, and at an energy density of 30 mJ/cm² to modify only a portion having a depth of 2,000 Å from the surface side of the semiconductor layer 4, thereby forming the insulating layer 13 serving as a gate insulating film (FIG. 47). Subsequently, the atmosphere was changed from the $NH_3$ atmosphere to a vacuum atmosphere, and the wavelength of the excimer laser was changed into KrF:248 nm. In this state, the excimer laser was irradiated on the same position as described above at an energy density of 200 mJ/cm² to modify the semiconductor layer 4 to be a channel into the P-Si semiconductor layer 14 (FIG. 48). Finally, the insulating layer 3 was formed at a substrate temperature $T_s$ of 150° C. by a plasma CVD method, and an Al film was formed by a sputtering method, thereby completing a TFT (FIG. 49). In this embodiment, the TFT can be manufactured at a low substrate temperature $T_s$, i.e., the maximum temperature in the manufacturing steps is set to 250° C. In addition, the high-quality insulating layer 13 and the high-quality P-Si semiconductor layer 4 can be formed such that their interface is in substantially clean state.

When the characteristics of the TFT obtained as described above were evaluated, very preferable results could be obtained. An electron mobility could be remarkably increased, i.e., 30 cm²/V·S.

Even in a TFT in which an $SiO_2$ film was formed by using an $N_2O$ gas as an atmosphere gas in formation of the insulating layer 13, the same preferable result as described above could be obtained.

[Embodiment 15]

Figure 50:
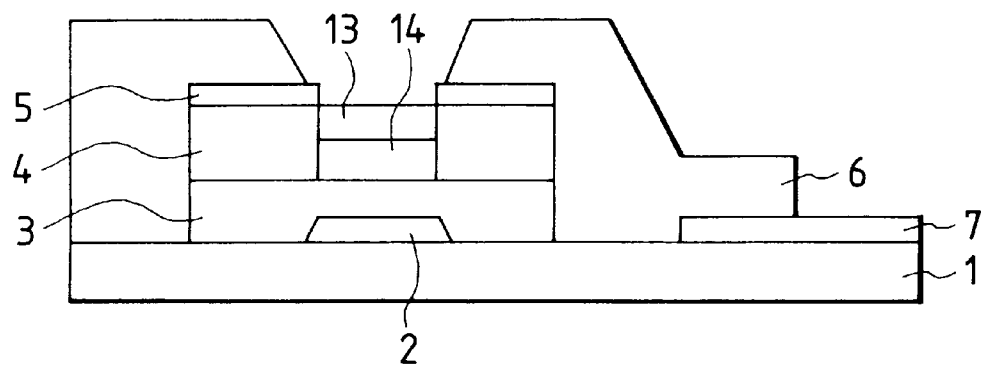

FIG. 50 is a typical sectional view showing still another embodiment of the present invention. Reference numeral 1 denotes an insulating substrate such as a glass substrate. After an electrode 2 is formed on the insulating substrate 1, an insulating layer 3 consisting of $SiN_x$, an a-Si:H semiconductor layer 4, and a doping semiconductor layer 5 are formed by patterning. Thereafter, an electrode 6 and a channel are formed on the resultant structure, and the surface of the semiconductor layer 4 is modified by an excimer laser into an insulating layer 13, and, subsequently, the semiconductor layer 4 under the insulating layer 13 is modified into a P-Si semiconductor layer 4, thereby completing a TFT.

Figure 51:
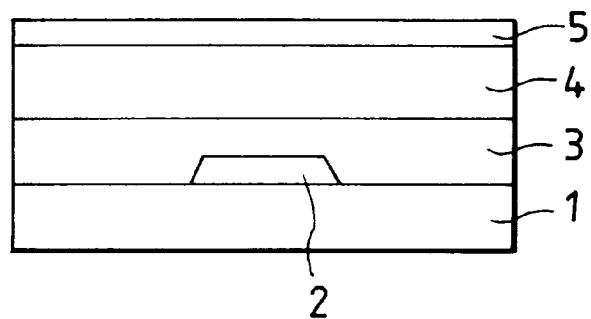
Figure 52:
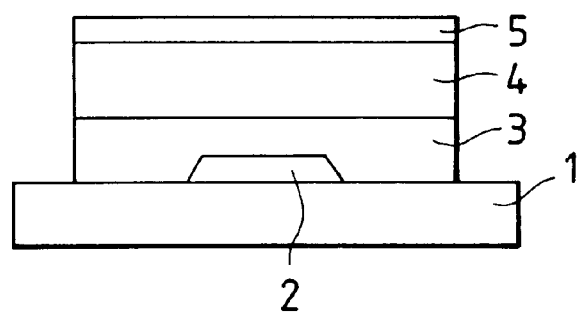
Figure 53:
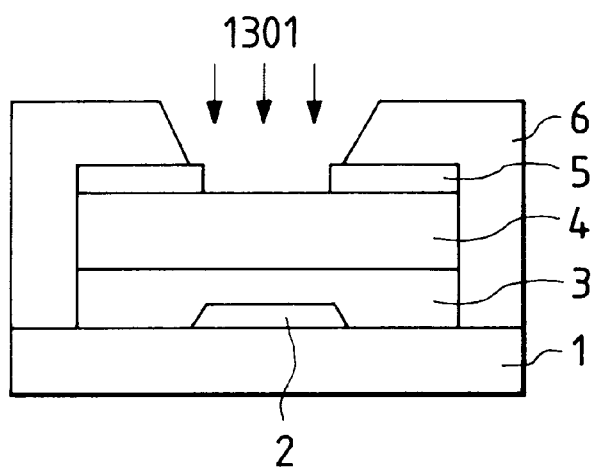
Figure 54:
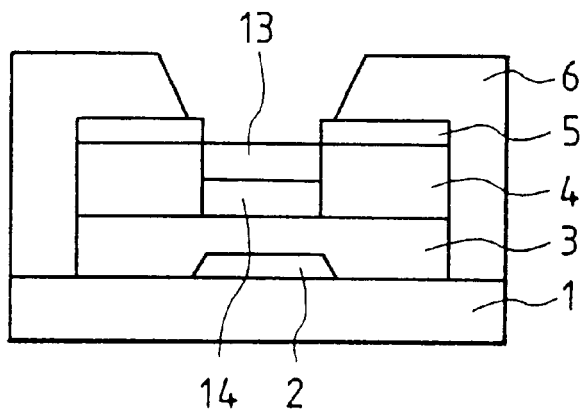

The steps in manufacturing the TFT will be described below with reference to FIGS. 51 to 54. A 1,000-Å Cr film was deposited by a sputtering method on the entire surface of a substrate, and then patterned as the gate electrode 2. The insulating layer 3 consisting of $SiN_x$, the a-Si:H semiconductor layer 4, and the doping semiconductor layer 5 were deposited on the resultant structure by a plasma CVD method to have thicknesses 3,000 Å, 3,000 Å, and 500 Å, respectively. The conditions for deposition of the insulating layer 3 are as follows: substrate temperature $T_s$=350° C.; $SiH_4/H_2$ (10%)=50 SCCM; $NH_3$=140 SCCM; pressure=0.2 Torr; and power density=0.034 W/cm². The conditions for deposition of the a-Si:H semiconductor layer 4 were set as follows: substrate temperature $T_s$=250° C.; $SiH_4/H_2$ (10%)= 300 SCCM; pressure=0.5 Torr; and power density=0.012 W/cm². The conditions for deposition of the doping semiconductor layer 5 were set as follows: substrate temperature $T_s$=250° C.; $PH_3/SiH_4$ (serving as a doping gas)=5,000 ppm; pressure=0.5 Torr; power density=0.097 Wc²(FIG. 51). Thereafter, the insulating layer 3, the semiconductor layer 4, and the doping semiconductor layer 5 were patterned by using a $CF_4+O_2$ gas by dry etching to have an island shape (FIG. 52). A 5,000-Å Al film was deposited on the resultant structure by a sputtering method and patterned to form the electrode 6, and the doping semiconductor layer 5 and the semiconductor layer 4 were partially removed by using a $CF_4+O_2$ gas by dry etching. An ArF 193-nm excimer laser beam 1301 was irradiated onto only a portion to be a channel portion through a mask formed on an optical system (FIG. 53). The irradiation of the excimer laser beam was performed under the conditions, i.e., in an atmosphere including an $NH_3$ gas, at a pressure of 300 Torr, and at an energy density (of the excimer laser beam 1301) of 30 mJ/cm² to modify only a portion having a depth of 2,000 Å from the surface side of the semiconductor layer 4 to form the insulating layer 13 serving as a channel protective layer. Subsequently, the atmosphere was changed from the $NH_3$ atmosphere to a vacuum atmosphere, and the wavelength of the excimer laser was changed into KrF:248 nm. In this state, the excimer laser was irradiated on the same position as described above at an energy density of 200 mJ/cm² to modify the semiconductor layer 4 to be a channel into the P-Si semiconductor layer 14 (FIG. 54). In this embodiment, the high-quality insulating layer 13 and the high-quality P-Si semiconductor layer 4 can be formed such that their interface is in a substantially clean state.

When the characteristics of the TFT obtained as described above were evaluated, very preferable results could be obtained. In particular, an electron mobility which was a problem in the prior art could be remarkably increased, i.e., 30 cm²/V·S. In this manner, a high-performance TFT could be manufactured at a low cost without increasing the number of masks to be used.

[Embodiment 16]

Figure 55:
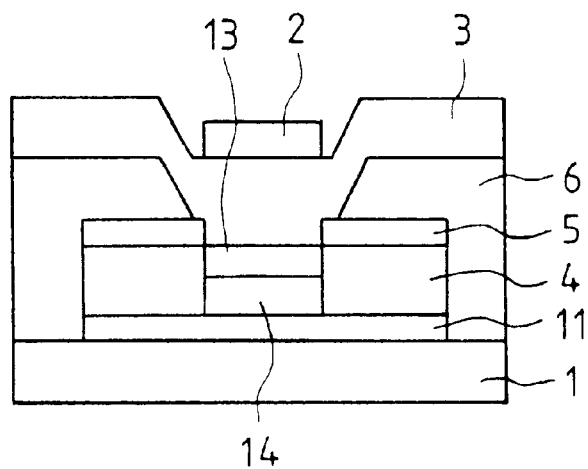

FIG. 55 is a typical sectional view showing still another embodiment of the present invention. This embodiment is a modification of the arrangement shown in Embodiment 14. In this modification, to improve the adhesion between the insulating substrate 1 and the semiconductor layer 4, an a-Si:H semiconductor layer or an $SiN_x$ insulating layer was deposited as an underlying layer 11 on the entire surface of the insulating substrate 1 to have a thickness of 500 Å, and, subsequently, the a-Si:H semiconductor layer 4 and the doping semiconductor layer 5 were deposited without breaking a vacuum state. The a-Si:H semiconductor layer serving as the underlying layer 11 was formed under the following conditions: substrate temperature $T_s$=250° C.; $SiH_4$ (100%)=

40 SCCM; pressure=0.05 Torr; and power density=0.15 W/cm². The SiN$_x$ insulating film was formed under the following conditions: substrate temperature $T_s$=250° C.; SiH$_4$/H$_2$ (10%)=50 SCCM; NH$_3$=140 SCCM; pressure=0.2 Torr; and power density=0.034 W/cm².

Since the TFT obtained in this embodiment had the underlying layer 11 deposited on the insulating substrate 1, the adhesion between the insulating substrate 1 and the a-Si:H semiconductor layer 4 could be improved without using another pre-process, and a high-performance TFT having a high throughput could be manufactured at a low cost.

[Embodiment 17]

Figure 56:
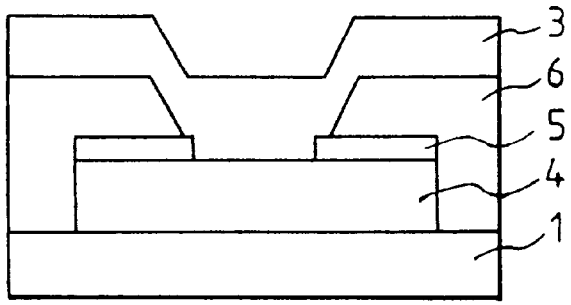

FIG. 56 is a typical sectional view showing a co-planar type a-Si:H photosensor which is obtained in such a manner that, in formation of an insulating layer 13 by an excimer laser and formation of a P-Si semiconductor layer 14 when a TFT is to be manufactured in the manufacturing steps according to the present invention shown in Embodiment 14, the energy of the excimer laser is irradiated onto only a portion to be the TFT while a mask formed on the optical system is opened so as to modify the portion except for the other portion. Since a TFT and a photosensor could be easily formed on the same substrate in the same processes, inexpensive high-performance image reading apparatuses could be manufactured at a high throughput.

In this embodiment, since the a-Si:H semiconductor layer 4 for a photosensor required a thickness of about 5,000 Å to improve an S/N ratio, the thickness of the a-Si:H semiconductor layer 4 in deposition was set to 5,000 Å, and, in modification of the TFT portion, the insulating layer 13 and the P-Si semiconductor layer 4 were modified and formed to have thicknesses 3,000 Å and 2,000 Å, respectively.

FIG. 57 is a typical sectional view showing an image reading apparatus using the TFT described in Embodiment 14. Reference symbol S1 denotes a co-planar type a-Si:H photosensor portion formed such that only the doping semiconductor layer 12 is formed by the a-Si:H semiconductor layer 4 onto which the excimer laser beam is not irradiated; Cl, a capacitor portion for accumulating charges generated by the photosensor portion Si; and TFT1, an a-Si:H TFT modified by irradiating the excimer laser onto a channel portion and serving as a transfer TFT for transferring the accumulated charges. Referring to FIG. 57, a one-dimensional image reading apparatus obtained by combining such elements at 1,728 bits can perform image reading at a high speed because the TFT is operated at a high speed. Although not shown, a two-dimensional image reading apparatus can be formed by combining these elements as a matter of course.

As described above, according to the present invention, the maximum temperature in the manufacturing steps was low, i.e., 250° C., and the number of masks to be used was equal to that of a conventional a-Si:H TFT. For this reason, a TFT whose performance was higher than that of a conventional TFT could be manufactured.

According to this embodiment, since a co-planar photosensor using a high-performance P-Si TFT and a shift resistor serving as a drive system could be manufactured on the same substrate by masks which were equal to in number those used when a TFT was formed, a high-performance image reading apparatus in which a high-output photosensor could be driven by a P-Si TFT and a shift resistor could be manufactured at a low cost.

[Embodiment 18]

FIG. 58 is a typical sectional view showing a co-planar type a-Si:H photosensor which can be formed without increasing the number of masks as in Embodiment 17 when a TFT is manufactured in the manufacturing steps according to the present invention shown in Embodiment 16. The a-Si:H photosensor in this embodiment can obtain a light output which is three times or more the light output of the same a-Si:H semiconductor layer by the effect of an underlying layer 11. Therefore, a high-performance image reading apparatus in which a high-output photosensor was could be driven by a P-Si TFT and a shift resistor could be manufactured at a low cost.

[Embodiment 19]

FIG. 59 is a typical sectional view showing a MIS type a-Si:H photosensor which can be formed without increasing the number of masks when a TFT is manufactured in the manufacturing steps according to the present invention shown in Embodiment 2. Since the a-Si:H sensor according to this embodiment could achieve high-speed response, a high-performance image reading apparatus in which the a-Si:H photosensor could be driven by a high-performance P-Si TFT and a shift resistor could be manufactured at a low cost.

[Embodiment 20]

Figure 60:
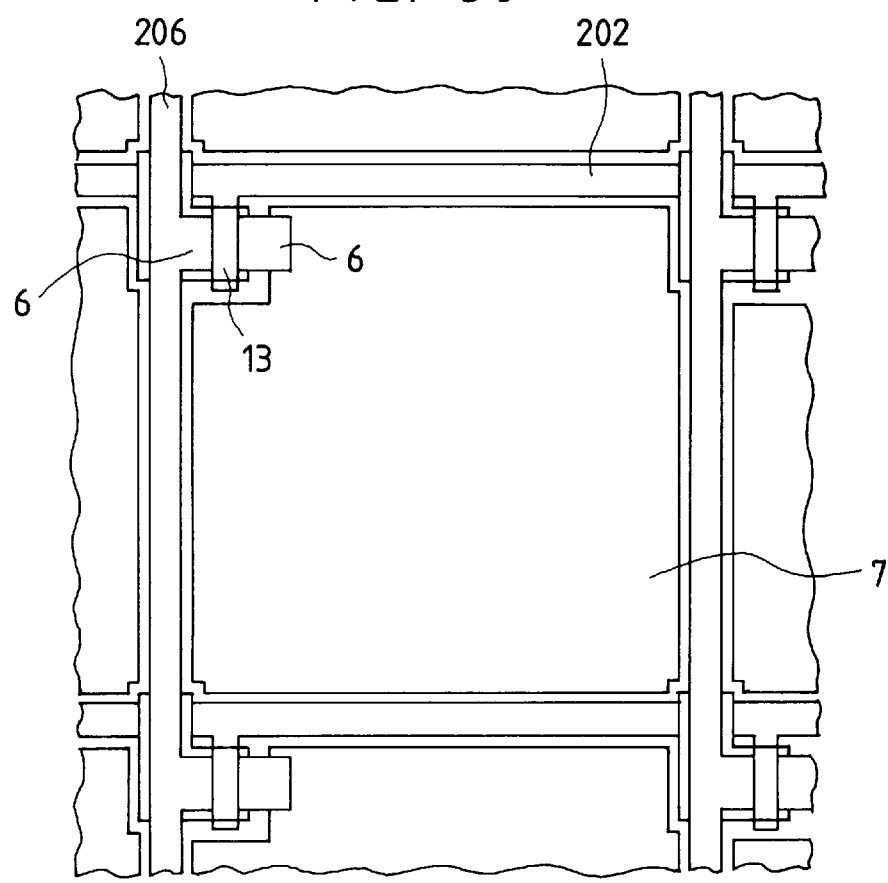
Figure 61:
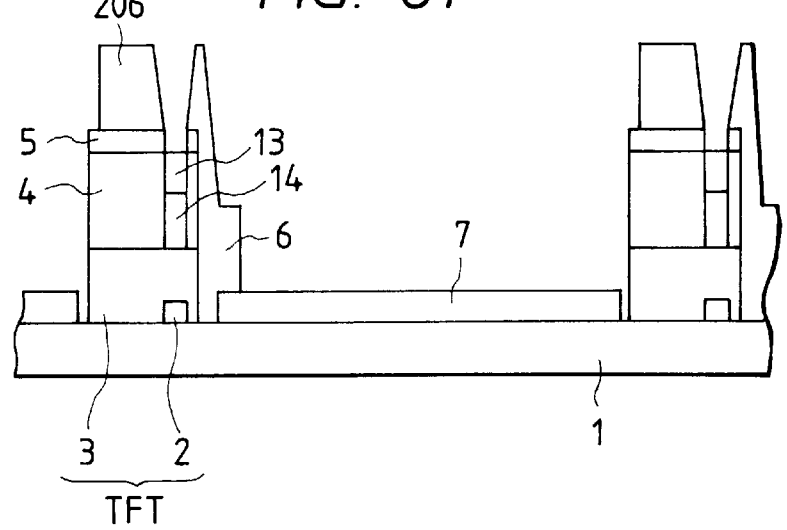
FIG. 61 is a typical sectional view showing the liquid crystal display apparatus shown in FIG. 60.

FIGS. 60 and 61 are a typical plan view and a typical sectional view showing the array portion of one pixel of a liquid crystal display apparatus which can cope with a large screen and in which TFTs formed in Embodiment 1 are arranged in a matrix form and driven. A TFT portion is constituted by an insulating substrate 1 such as a glass substrate, a gate electrode/gate wiring 2, a gate insulating layer 3, an a-Si:H semiconductor layer 4, a doping semiconductor layer 5, a channel protective insulating layer 13 modified/formed by an excimer laser, a P-Si semiconductor layer 14 modified/formed by the excimer laser, and an electrode 6. A pixel portion is constituted by a discrete electrode (pixel electrode here) 7 consisting of a transparent electrode connected to the electrode 6. Since the P-Si TFT formed as described above had an electron mobility which was about ten times that of a conventional a-Si:H TFT, the performance of the P-Si TFT could be sufficiently obtained even if a write time was shortened in accordance with an increase in screen size and high definition. In addition, since the TFT could be decreased in size, the opening ratio of the pixel could be increased, and the brightness of the screen could be improved. Furthermore, a light-shielding layer, which was required in a conventional a-Si:H TFT, for preventing a TFT from being erroneously operated by incident light was not necessary. For this reason, the number of steps could be reduced, and a yield could be increased, so that an inexpensive high-performance liquid crystal display apparatus having high definition and a large screen could be manufactured.

As described above, according to this embodiment, a TFT can be manufactured by masks which is equal to or smaller than in number those of a conventional a-Si:H TFT, and a high-performance TFT and an electron apparatus having the TFT mounted thereon can be manufactured at a cost lower than that in the prior art.

Although not shown, a counter electrode is arranged to oppose the discrete electrode 7, and a liquid crystal material is interposed between these electrodes.

[Embodiment 21]

Figure 62:
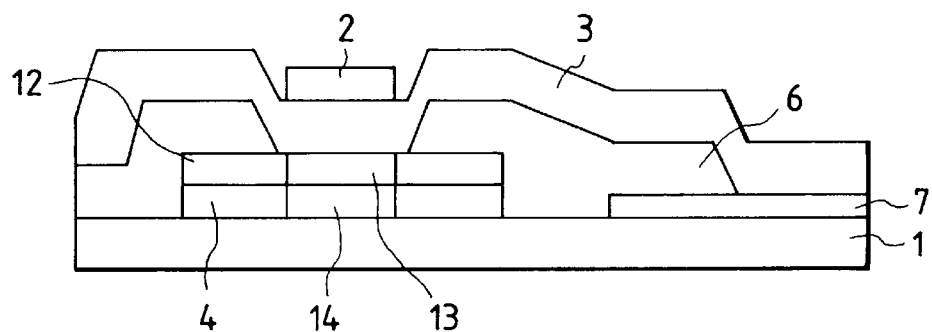
Figure 63:
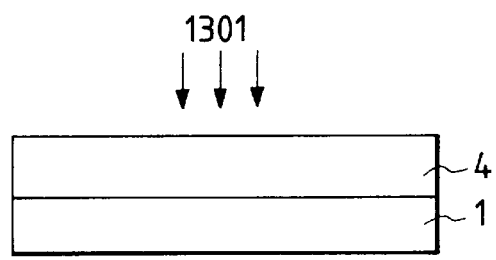
Figure 64:
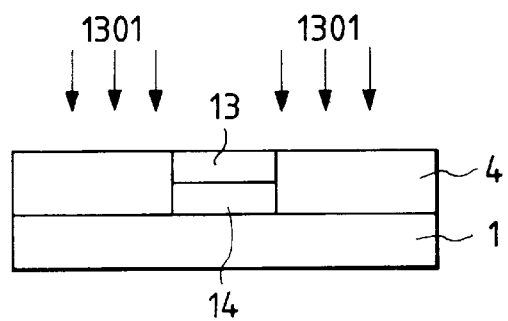

FIG. 62 is a typical sectional view showing still another embodiment of the present invention. Reference numeral 1 denotes an insulating substrate such as a glass substrate. A semiconductor layer 4 consisting of an amorphous silicon (to be referred to as a-Si:H hereinafter), and a portion of the semiconductor layer 4 to be used as a channel of a TFT is modified into an insulating layer 13 consisting of $SiO_2$, $Si_3N_4$, or the like by an excimer laser. Subsequently, the semiconductor layer 4 under the insulating layer 13 is modified by the excimer laser into a semiconductor layer 14 consisting of polysilicon (to be referred to as P-Si hereinafter). Next, a portion of the semiconductor layer 4 to be a source/drain electrode is modified by excimer laser doping to form a doping semiconductor layer 12. After an electrode 6 is formed, an insulating layer 3 and an electrode serving as a gate electrode are formed. Note that reference numeral 7 denotes a discrete electrode.

Figure 65:
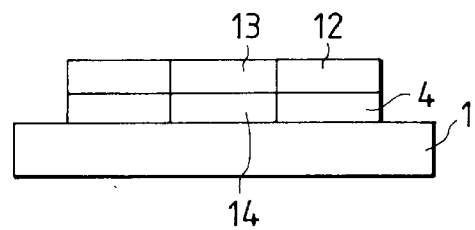
Figure 66:
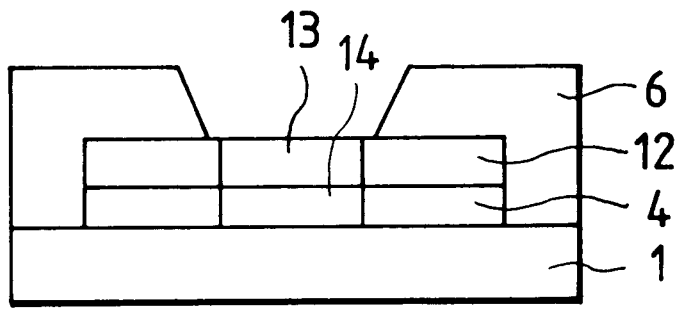
Figure 67:
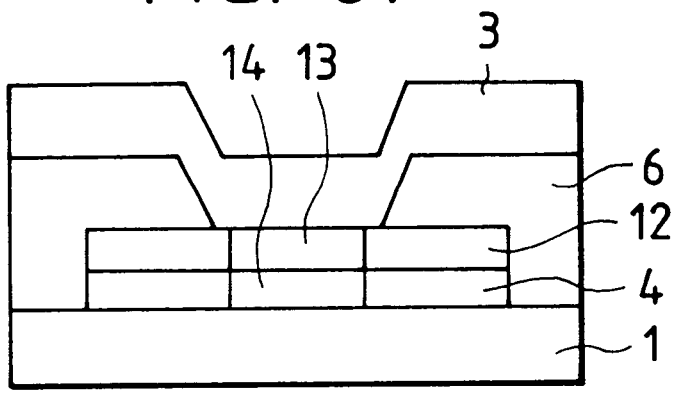
Figure 68:
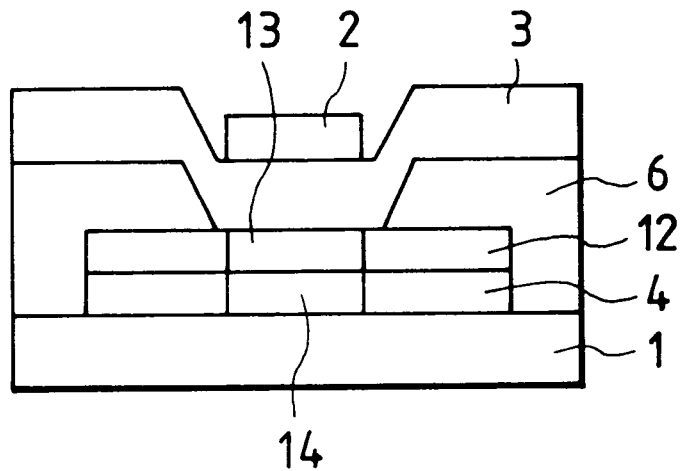

The steps in manufacturing the TFT will be described below with reference to FIGS. 63 to 68. The insulating substrate 1 was pre-processed to improve adhesion to the semiconductor layer 4, and the a-Si:H semiconductor layer 4 was deposited by a plasma CVD method on the entire surface of the insulating substrate 1. The conditions for deposition of the a-Si:H semiconductor layer 4 were set as follows: substrate temperature $T_s$=250° C.; $SiH_4/H_2$=300 SCCM; pressure=0.5 Torr; power density=0.012 W/cm²; and thickness, 3,000 Å. Thereafter, an ArF 193-nm excimer laser beam 1301 was irradiated (FIG. 63) onto only a portion to be a channel portion of a TFT at an energy density of 30 mJ/cm² and a pressure of 300 Torr in an atmosphere including an $NH_3$ gas to modify only a portion having a depth of 2,000 Å from the surface side of the semiconductor layer 4, thereby forming the insulating layer 13 serving as a gate insulating film. Subsequently, the atmosphere was changed from the $NH_3$ atmosphere to a vacuum atmosphere, and the wavelength of the excimer laser was changed into KrF:248 nm. In this state, the excimer laser was irradiated on the same position as described above at an energy density of 200 mJ/cm² to modify the semiconductor layer 4 to be a channel into the P-Si semiconductor layer 14. The atmosphere was changed to contain a $PCl_3$ gas and have a pressure of 5 Torr, the ArF 193-nm excimer laser beam 1301 was irradiated onto only a portion to be a source/drain electrode of the TFT (FIG. 64) to diffuse P atoms in this portion, thereby forming the doping semiconductor layer 12 serving as an ohmic contact layer in a depth of 2,000 Å from the surface side. Thereafter, the semiconductor layers 4 and 14 and the doping semiconductor layer 12 were patterned by using a $CF_4+O_2$ gas by dry etching to have an island shape (FIG. 65). A 5,000-Å Al film was deposited on the resultant structure by a sputtering method and patterned to form the electrode 6 (FIG. 66). Subsequently, the insulating layer 3 was formed at 150° C. by a plasma CVD method (FIG. 67). Further, an Al film was deposited by a sputtering method and patterned to form the gate electrode 2, thereby completing a TFT (FIG. 68). In this embodiment, the TFT can be manufactured at a low temperature, i.e., the maximum temperature in the manufacturing steps is set to 250° C. In addition, the high-quality insulating layer 13 and the high-quality P-Si semiconductor layer 4 can be formed such that their interface is substantially clean, and the doping semiconductor layer 12 having a uniform thickness and high quality throughout the substrate was formed. In this embodiment, a mask is formed on the optical system of the excimer laser, and the laser energy was irradiated, through the mask, onto only a portion which was required to be irradiated. For this reason, a TFT could be completed without increasing the number of photomasks and without ununiformity of the step of etching the doping semiconductor layer 12.

When the characteristics of the TFT obtained as described above were evaluated, the following results could be obtained. That is, characteristics such as an ON/OFF ratio and a voltage $V_{th}$ were uniform throughout a large area, and an electron mobility which was posed in the prior art could be remarkably increased, i.e., 30 cm²/V·S. In this manner, according to this embodiment, a high-performance TFT in which the maximum substrate temperature in the manufacturing steps was low, i.e., 250° C., and the number of masks to be used was smaller could be manufactured at a low cost.

Even in a TFT in which an $SiO_2$ film was formed by using an $N_2O$ gas as an atmosphere gas in formation of the insulating layer 13, the same preferable result as described above could be obtained.

[Embodiment 22]

Figure 69:
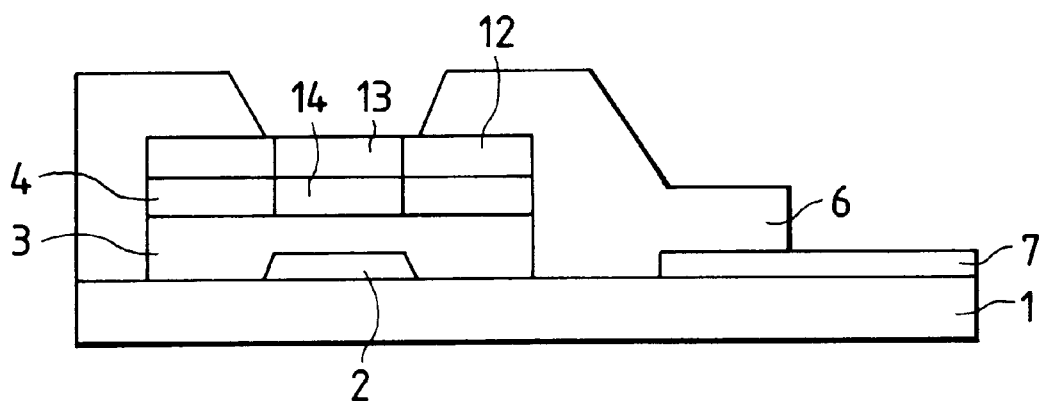
Figure 70:
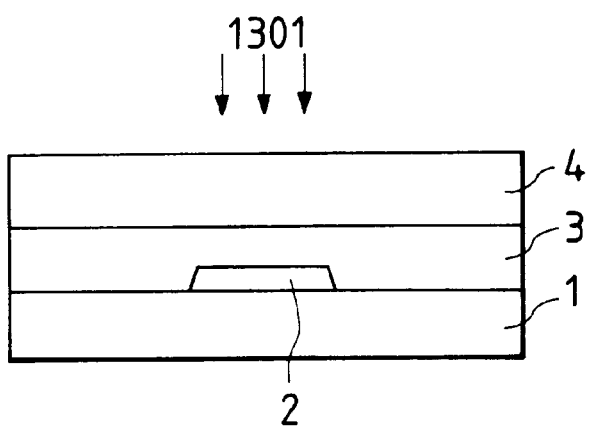
Figure 71:
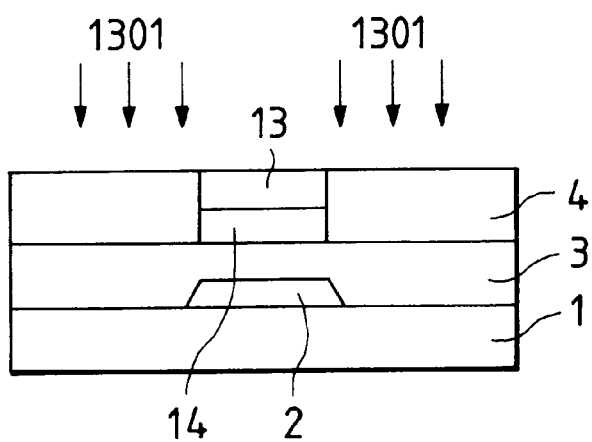

FIG. 69 is a typical sectional view showing still another embodiment of the present invention. Reference numeral 1 denotes an insulating substrate such as a glass substrate. After a gate electrode 2 is formed on the insulating substrate 1, an insulating layer 3 consisting of $SiO_2$, SiN,, or the like, and an a-Si:H semiconductor layer 4 are formed, and the surface of the semiconductor layer 4 is modified by an excimer laser into an insulating layer 13 consisting of $SiO_2$, $Si_3N_4$, or the like. In addition, the semiconductor layer 4 under the insulating layer 13 is modified by the excimer laser into a P-Si semiconductor layer 14. A portion of the semiconductor layer 4 to be a source/drain electrode is modified by excimer laser doping to form a doping semiconductor layer 12. Thereafter, an electrode 6 is formed, thereby completing a TFT.

Figure 72:
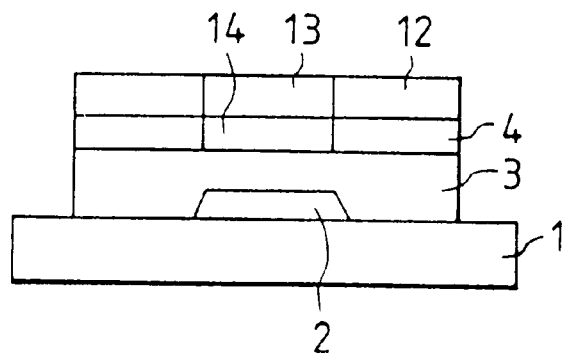
Figure 73:
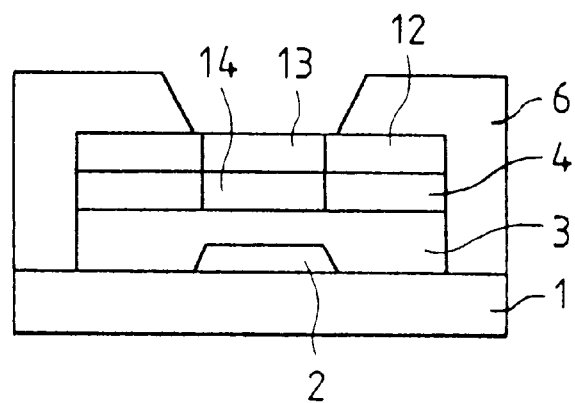

The steps in manufacturing the TFT will be described below with reference to FIGS. 70 to 73. A 1,000-Å Cr film was deposited by a sputtering method on the entire surface of a substrate, and then patterned as the gate electrode 2. The insulating layer 3 consisting of $SiN_x$ and the a-Si:H semiconductor layer 4 were deposited on the resultant structure by a plasma CVD method to each have a thickness of 3,000 Å. The conditions for deposition of the insulating layer 3 are as follows: substrate temperature $T_s$=350° C.; $SiH_4/H_2$ (10%)=50 SCCM; $NH_3$=140 SCCM; pressure=0.2 Torr; and power density=0.034 W/cm². The conditions for deposition of the a-Si:H semiconductor layer 4 were set as follows: substrate temperature $T_s$=250° C.; $SiH_4/H_2$ (10%)=300 SCCM; pressure=0.5 Torr; and power density=0.012 W/cm². Thereafter, an ArF 193-nm excimer laser beam 1301 was irradiated onto only a portion to be a channel portion of the TFT at a pressure of 300 Torr and an energy density of 30 mJ/cm² in an atmosphere including an $NH_3$ gas (FIG. 70) to modify only a portion having a depth of 2,000 Å into $Si_3N_4$, thereby forming the insulating layer 13 as a channel protective layer. Subsequently, the atmosphere was changed from the $NH_3$ atmosphere to a vacuum atmosphere, and the wavelength of the excimer laser beam 1301 was changed into KrF:248 nm. In this state, the excimer laser was irradiated on the same position as described above at an energy density of 200 mJ/cm² to modify the semiconductor layer 4 to be a channel into the P-Si semiconductor layer 14. The atmosphere was changed to contain a $PCl_3$ gas and have a pressure of 5 Torr, the ArF 193-nm excimer laser beam 1301 was irradiated onto only a portion to be a source/drain electrode of the TFT (FIG. 71) to diffuse P atoms in this portion, thereby forming the doping semiconductor layer 12 serving as an ohmic contact layer in a depth of 2,000 Å from the surface side. Thereafter, the semiconductor layers 4 and 14 and the doping semiconductor layer 12 were patterned by using a $CF_4+O_2$ gas by dry etching to have an island shape (FIG. 72). A 5,000-Å Al film was deposited on the resultant structure by a sputtering method and patterned to form the electrode 6, thereby completing a TFT (FIG. 73). In this embodiment, the high-quality channel protective insulating layer 13 and the high-quality P-Si semiconductor layer 14 could be formed at a low temperature, the interface between the high-quality insulating layer 13 and the high-quality P-Si semiconductor layer 4 could be formed in a substantially clean state, and the doping semiconductor layer 12 having a uniform thickness and high quality throughout the substrate was formed. In this embodiment, a mask was formed on the optical system of the excimer laser, and the laser energy was irradiated, through the mask, onto only a portion which was required to be irradiated. For this reason, a TFT could be completed without increasing the number of photomasks and without ununiformity of the step of etching the doping semiconductor layer 12.

When the characteristics of the TFT obtained as described above were evaluated, very preferable results could be obtained. In particular, an electron mobility which was a problem in the prior art could be remarkably increased, i.e., 30 cm²/V·S. In this manner, a high-performance TFT could be manufactured at a low cost without increasing the number of masks to be used.

[Embodiment 23]

Figure 74:
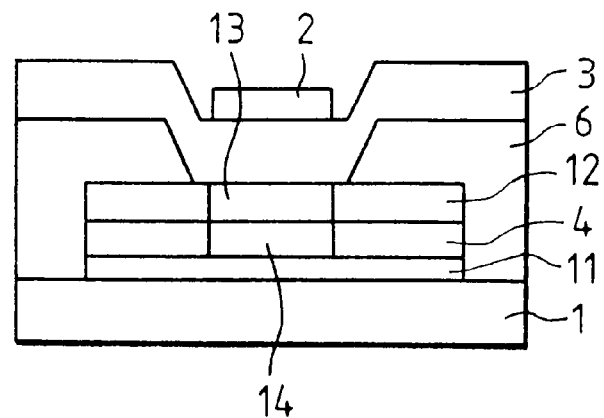

FIG. 74 is a typical sectional view showing still another embodiment of the present invention. This embodiment is a modification of the arrangement shown in Embodiment 1. In this modification, to improve the adhesion between the insulating substrate 1 and the semiconductor layer 4, an a-Si:H semiconductor layer or an SiN, insulating layer was deposited as an underlying layer 11 on the entire surface of the insulating substrate 1 to have a thickness of 500 Å, and, subsequently, the a-Si:H semiconductor layer 4 was deposited without breaking a vacuum state. The a-Si:H semiconductor layer serving as the underlying layer 11 was formed under the following conditions: substrate temperature $T_s=250°$ C.; $SiH_4$ (100%)=40 SCCM; pressure=0.05 Torr; and power density=0.15 W/CM². The SiN, insulating film was formed under the following conditions: substrate temperature $T_s=250°$ C.; $SiH_4/H_2$ (10%)=50 SCCM; $NH_3=140$ SCCM; pressure=0.2 Torr; and power density=0.034 W/CM².

Since the TFT obtained in this embodiment had the underlying layer 11 deposited on the insulating substrate 1, the adhesion between the insulating substrate I and the a-Si:H semiconductor layer 4 could be improved without using another pre-process, and a high-performance TFT having a higher throughput could be manufactured at a low cost.

[Embodiment 24]

Figure 75:
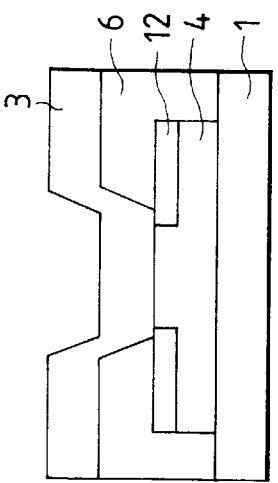

FIG. 75 is a typical sectional view showing a co-planar type a-Si:H photosensor which is obtained in such a manner that, in formation of an insulating layer 13 by an excimer laser and formation of a P-Si semiconductor layer 14 when a TFT is to be manufactured in the manufacturing steps according to the present invention shown in Embodiment 1, the energy of the excimer laser is irradiated onto only a portion to be the TFT while a mask formed on the optical system is opened so as to modify the portion except for the other portion. Since a TFT and a photosensor could be formed on the same substrate in the same processes, inexpensive high-performance image reading apparatuses could be manufactured at a high throughput.

In this embodiment, since the a-Si:H semiconductor layer 4 for a photosensor required a thickness of about 5,000 Å to improve an S/N ratio, the thickness of the a-Si:H semiconductor layer 4 in deposition was set to 5,000 Å, and, in modification of the TFT, the insulating layer 13 and the P-Si semiconductor layer 4 were modified and formed to have thicknesses 3,000 Å and 2,000 Å, respectively.

Figure 76:
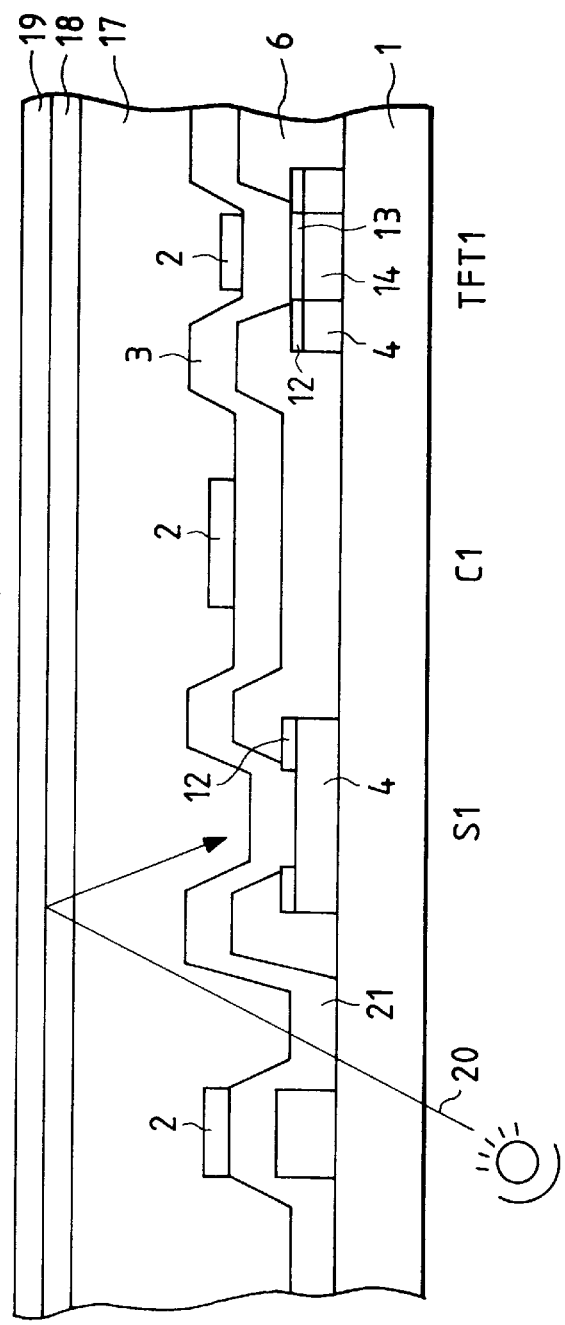

FIG. 76 is a typical sectional view showing an image reading apparatus using the TFT described in Embodiment 21. Reference symbol Si denotes a co-planar type a-Si:H photosensor portion formed such that only the doping semiconductor layer 12 is formed by excimer laser doping; Cl, a capacitor portion for accumulating charges generated by the photosensor portion Si; and TFT1, a polysilicon TFT modified by irradiating the excimer laser onto a channel portion and serving as a transfer TFT for transferring the accumulated charges. Referring to FIG. 76, a one-dimensional image reading apparatus obtained by combining such elements at 1,728 -bits can perform image reading at a high speed because the TFT is operated at a high speed. Although not shown, a two-dimensional image reading apparatus can be formed by combining these elements as a matter of course.

According to this embodiment, a co-planar type photosensor using a high-performance TFT and a shift resistor serving as a drive system could be manufactured on the same substrate by masks which were equal to in number those in formation of a TFT was formed, and the step of etching the doping semiconductor layer is unnecessary. For this reason, variations in characteristics of the photosensor could be reduced, and a high-performance image reading apparatus in which a higher-output photosensor could be driven by a high-performance P-Si TFT and a shift resistor could be manufactured at a low cost.

[Embodiment 25]

Figure 77:
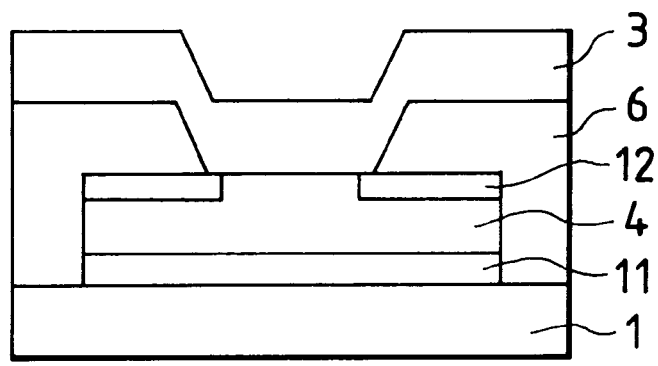

FIG. 77 is a typical sectional view showing a co-planar type a-Si:H photosensor which can be formed without increasing the number of masks as in Embodiment 24 when a TFT is manufactured in the manufacturing steps according to the present invention shown in Embodiment 23. The a-Si:H photosensor in this embodiment can obtain a light output which is three times or more the light output of the same a-Si:H semiconductor layer by the effect of an underlying layer 11. Therefore, a high-performance image reading apparatus in which a higher-output photosensor can be driven by a high-performance P-Si TFT and a shift resistor can be manufactured at a low cost.

[Embodiment 26-1]

Figure 78:
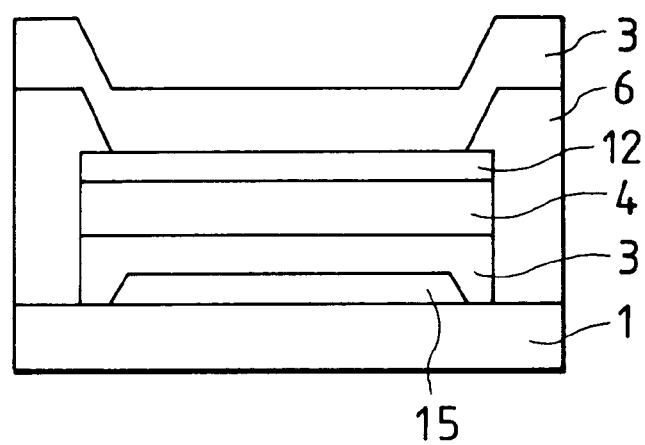
Figure 79:
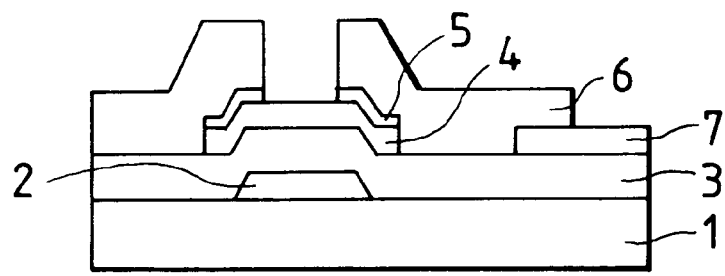

FIG. 78 is a typical sectional view showing a MIS type a-Si:H photosensor which can be formed without increasing the number of masks when a TFT is manufactured in the manufacturing steps according to the present invention shown in Embodiment 22. Since the a-Si:H sensor according to this embodiment can achieve high-speed response, a high-performance image reading apparatus in which the a-Si:H photosensor can be driven by a high-performance P-Si TFT and a shift resistor can be manufactured at a low cost.

[Embodiment 26-2]

When a liquid crystal display apparatus was manufactured in the same manner as in Embodiment 20 except that the TFT described in Embodiment 22 was used, the liquid crystal display apparatus could be manufactured at a high yield. The entire screen of the manufactured liquid crystal display apparatus had a high contrast and a high S/N ratio, and could clearly display a moving image.

[Embodiment 27]

Figure 80:
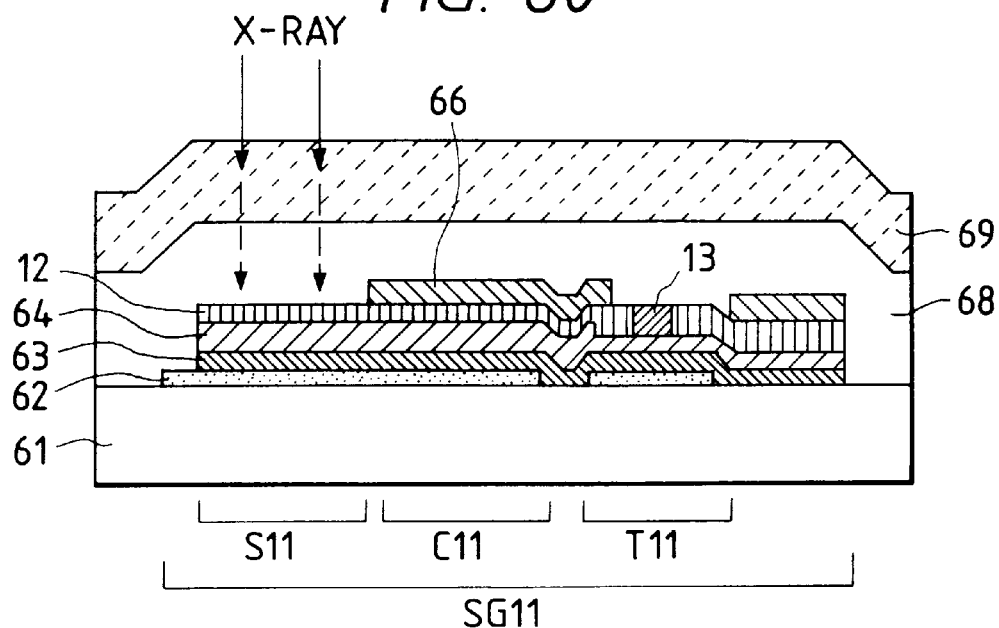
Figure 81:
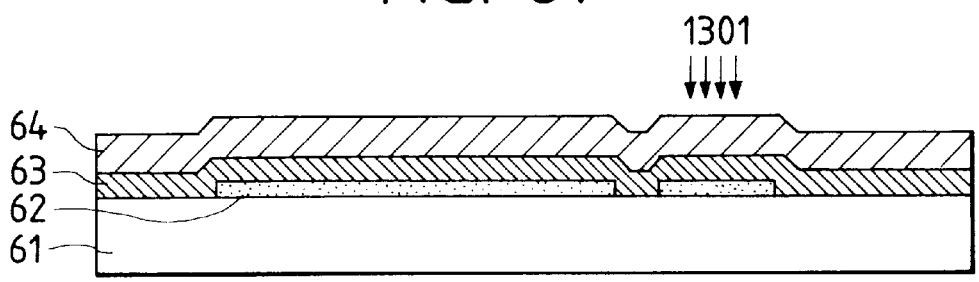
FIGS. 81 to 85 and 87 to 91 are typical sectional views for explaining the steps in manufacturing a detecting apparatus according to the present invention, respectively.
Figure 82:
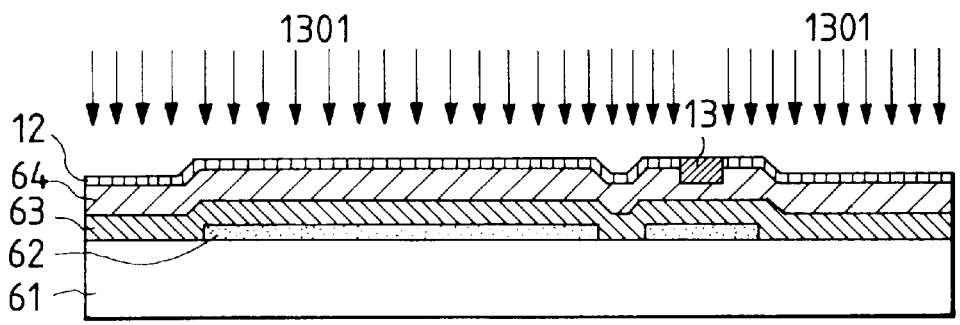

FIG. 80 is a typical sectional view for explaining still another embodiment of the present invention. Reference numeral 61 denotes an insulating substrate such as a glass substrate. After an electrode 62 is formed on the insulating substrate 61, an insulating layer 63 consisting of $SiO_2$ or SiN, and an hydrogenated amorphous silicon semiconductor layer 64 such as an a-Si:H semiconductor layer are formed. An insulating layer 13 modified into $SiO_2$, $Si_3N_4$, or the like by an excimer laser is formed on a portion to be a channel of a TFT, and a portion to be a doping semiconductor layer 12 is modified by excimer laser doping such that the amorphous silicon semiconductor layer 64 is modified into the doping semiconductor layer 12. In this embodiment, only a portion of the doping semiconductor layer 12 in which a source/drain is to be formed is modified by performing excimer laser doping to the doping semiconductor layer 12 again to have a large thickness, and an electrode 66 is formed thereon.

The steps in manufacturing the semiconductor device will be described below with reference to FIGS. 81 to 85. A 1,000-Å Cr film was deposited by a sputtering method on the entire surface of the insulating substrate 61, and then patterned as the electrode 62. As the electrode 62, the insulating lay er 63 consisting of SiN, a nd the a-Si:H semiconductor layer 64 were deposited on the resultant structure by a plasma CVD method to have thicknesses of 3,000 Å and 3,300 Å, respectively.

The conditions for deposition of the insulating layer 63 are as follows: substrate temperature $T_s=350°$ C.; $SiH_4/H_2$ (10%)=50 SCCM; $NH_3$=140 SCCM; pressure=0.2 Torr; and electron density=0.034 W/cm². The conditions for deposition of the a-Si:H semiconductor layer 64 were set as follows: substrate temperature $T_s=250°$ C.; $SiH_4/H_2$ (10%)= 300 SCCM; pressure=0.5 Torr; and electron density=0.012 W/cm².

Thereafter, an ArF 193-nm excimer laser beam 1301 was irradiated onto only a portion to be a channel portion of the TFT at a substrate temperature $T_s$ of 200° C., a pressure of 300 Torr, and an energy density of 30 mJ/cm² in an atmosphere including an $NH_3$ gas (see FIG. 81) to modify only a portion having a depth of 2,300 Å into $Si_3N_{41}$ thereby forming the insulating layer 13 as a channel protective layer.

Subsequently, the atmosphere was changed to contain a $PCL_3$ gas and have a pressure of 5 Torr, and the mask formed on the optical system of the excimer laser. In this state, the ArF 193-nm excimer laser beam 1301 was irradiated at an energy density of 200 mJ/cm² such that the a-Si:H semiconductor layer 64 of a portion other than the portion modified into $Si_3N_4$ as described above was modified in a depth of 300 Å from the surface side, thereby forming the doping semiconductor layer 12 (see FIG. 82).

Figure 83:
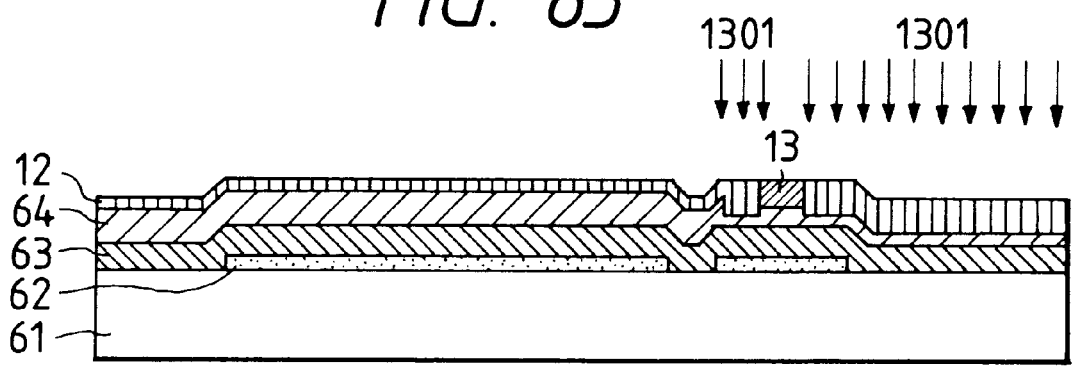
Figure 84:
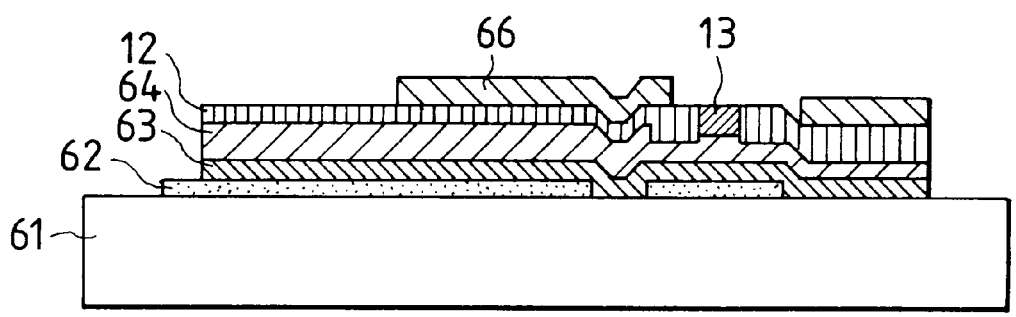
Figure 85:
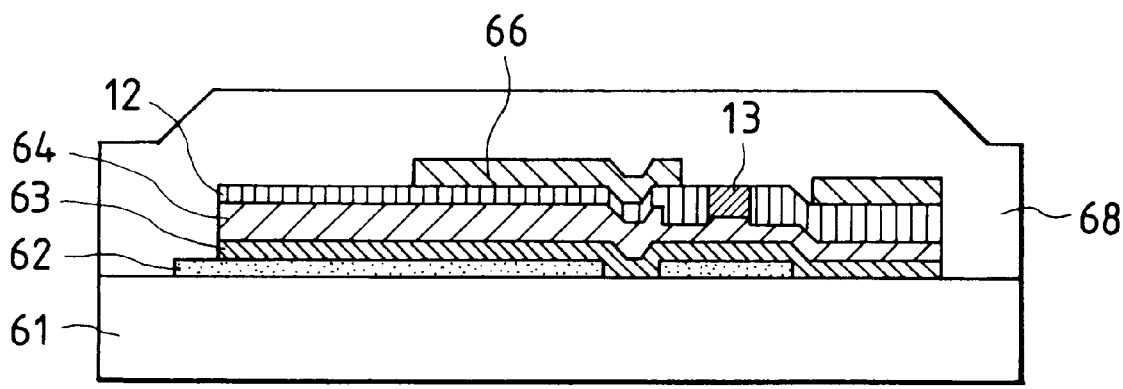

Thereafter, the mask formed on the optical system of the excimer laser was changed, and the excimer laser was irradiated onto only a portion to be a source/drain electrode of the TFT under the above conditions to form the doping semiconductor layer 12 in a total depth of 2,500 Å from the surface side (see FIG. 83). Thereafter, the resultant structure was patterned by using a $CF_4+O_2$ gas in an island shape having a predetermined size. A 1 -μm Al film was deposited by a sputtering method and patterned to be an electrode (see FIG. 84). Finally, an $SiN_x$ film serving as a protective layer 68 was formed by a plasma CVD method, thereby completing an array process (see FIG. 85).

In this embodiment, the doping semiconductor layer 12 serving as the MIS type sensor can be formed to have a small thickness, i.e., 300 Å, and the doping semiconductor layer 12 on the TFT can be formed to have a large thickness. Furthermore, since the doping semiconductor layer 12 modified by using the excimer laser at a substrate temperature 200° C. has a low resistivity of 0.20-cm, the MIS type sensor has low light absorption in the doping semiconductor, and the TFT has sufficient transfer capability. Since the doping semiconductor layer 12 can be formed near the channel of the TFT, the channel resistance decreases.

In this manner, a high-performance radiation detecting apparatus which copes with a large area and is constituted by a photosensor having a high-performance TFT and a light output about 1.3 times that of a conventional light output can be formed. According to the present invention, at least one photomask for forming a conventional channel-etch type source/drain electrode can be omitted, and variations in voltage $V_{th}$ caused by ununiformity in large-area etching can be improved. Furthermore, since modification performed by an excimer laser can achieve good uniformity of a film thickness distribution and a high throughput, a high-performance radiation detecting apparatus having good in-plane uniformity in a large area can be provided at a low cost. Since the a-Si:H layer of the TFT portion can be formed to substantially have a small thickness, a disadvantage that an erroneous operation caused by light irradiation onto the TFT can be reduced, and a light-shielding film required in a prior art can be omitted. Therefore, a radiation detecting apparatus can be manufactured at a further low cost.

[Embodiment 28]

Figure 86:
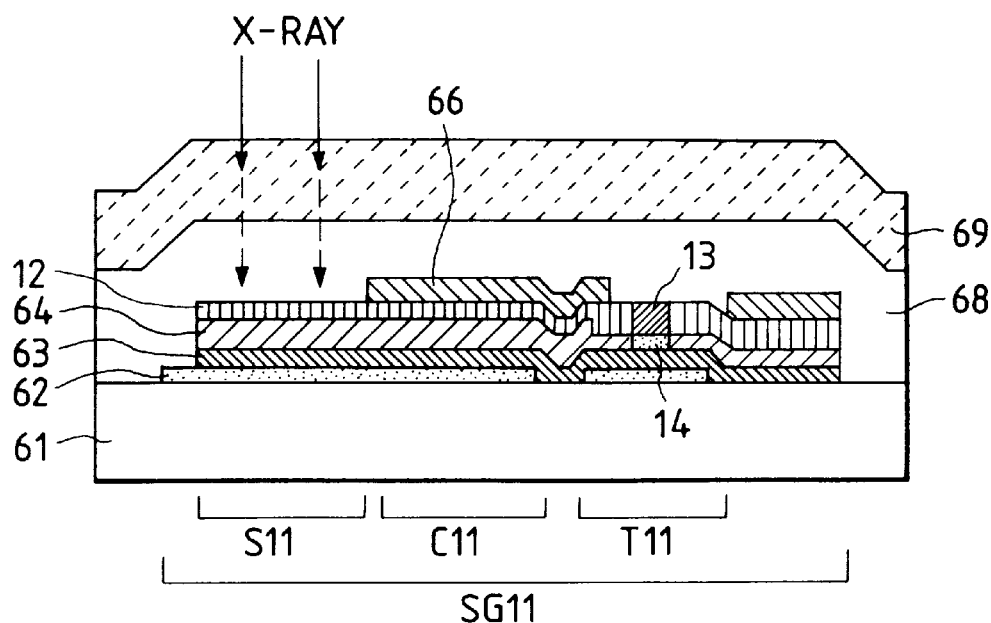
Figure 87:
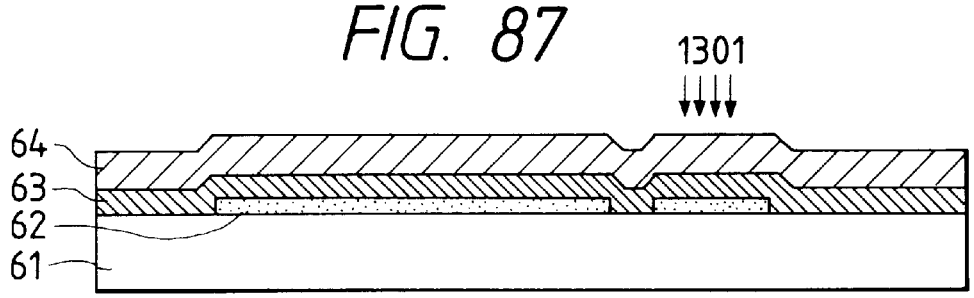
Figure 88:
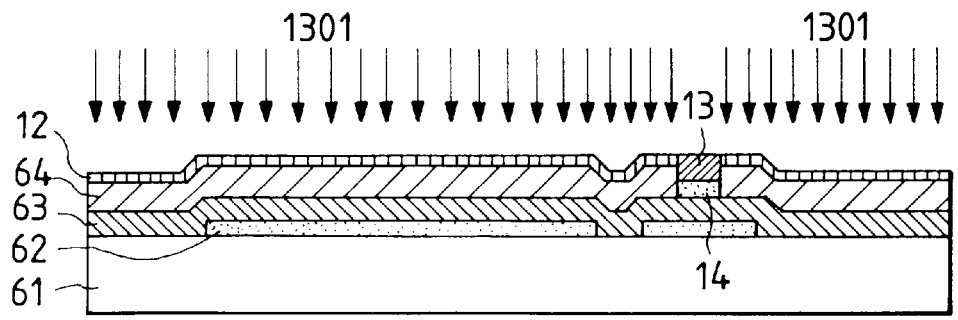

FIG. 86 is a typical sectional view for explaining still another embodiment of the present invention. Reference numeral 61 denotes an insulating substrate such as a glass substrate. An electrode 62 is formed on the substrate, an insulating layer 63 consisting of $SiO_2$ or SiN, and an a-Si:H amorphous silicon semiconductor layer 64 are formed. An insulating layer 13 obtained by modifying a portion of the semiconductor layer 64 to be a channel of a TFT into $SiO_2$, $Si_3N_4$, or the like by an excimer laser is formed, and a P-Si semiconductor layer 14 obtained by modifying the semiconductor layer 64 under the insulating layer 13 by an excimer laser is formed. A portion to be a doping semiconductor layer 12 is formed by excimer laser doping such that the semiconductor layer 64 is modified into the doping semiconductor layer 12. In addition, only a portion of the doping semiconductor layer 12 in which a source/drain of the TFT is to be formed is increased in thickness by performing excimer laser doping to the doping semiconductor layer 12 again, and an electrode 66 is formed thereon.

A forming method for realizing the embodiment of the present invention will be described below with reference to FIGS. 87 to 91. A 1,000-Å Cr film was deposited by a sputtering method on the entire surface of the insulating substrate 61, and then patterned as the electrode 62. The insulating layer 63 consisting of SiN, and the a-Si:H semiconductor layer 64 were deposited on the resultant structure by a plasma CVD method to have thicknesses of 3,000 Å and 3,300 Å, respectively.

The conditions for deposition of the insulating layer 63 are as follows: substrate temperature $T_s= 350°$ C.; $SiH_4/H_2$ (10%)=50 SCCM; $NH_3$=140 SCCM; pressure=0.2 Torr; and power density=0.034 W/m. The conditions for deposition of the a-Si:H semiconductor layer 64 were set as follows: substrate temperature $T_s=250°$ C.; $SiH_4/H_2$ (10%)=300 SCCM; pressure=0.5 Torr; and power density=0.012 W/cm².

Thereafter, an ArF 193-nm excimer laser beam 1301 was irradiated onto only a portion to be a channel portion of the TFT at a substrate temperature $T_s$ of 200° C., a pressure of 300 Torr, and an energy density of 30 mJ/cm² in an atmosphere including an $NH_3$ gas (see FIG. 87) to modify only a portion having a depth of 2,300 Å into $Si_3N_4$, thereby forming the insulating layer 13 as a channel protective layer.

Subsequently, the atmosphere was changed into a vacuum atmosphere, and the wavelength of the excimer laser was changed into KrF:248 nm. In this state, the excimer laser beam 1301 was irradiated on the same position as described above at an energy density of 200 mJ/cm² to modify the semiconductor layer 64 to be a P-Si semiconductor layer 14. The wavelength of the excimer laser beam 1301 was changed into ArF:193 nm, the mask formed on the optical system was changed, and the atmosphere was changed to contain a $PCL_3$ gas and have a pressure of 5 Torr. In this state, the ArF 193-nm excimer laser beam 1301 was irradiated at an energy density of 200 mJ/cm$^2$ such that the a-Si:H semiconductor layer 64 of a portion other than the portion modified into $Si_3N_4$ and P-Si as described above was modified in a depth of 300 Å from the surface side, thereby forming the doping semiconductor layer 12 (see FIG. 88).

Figure 89:
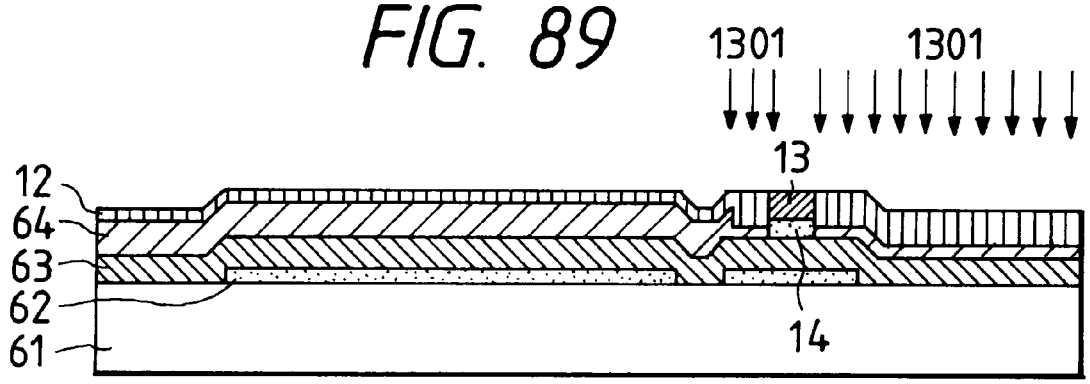

Thereafter, the mask formed on the optical system of the excimer laser was changed, and the excimer laser was irradiated onto only a portion to be a source/drain electrode of the TFT under the above conditions to form the doping semiconductor layer 12 in a total depth of 2,500 Å from the surface side (see FIG. 89). Thereafter, the resultant structure was patterned by using a $CF_4+O_2$ gas in an island shape.

Figure 90:
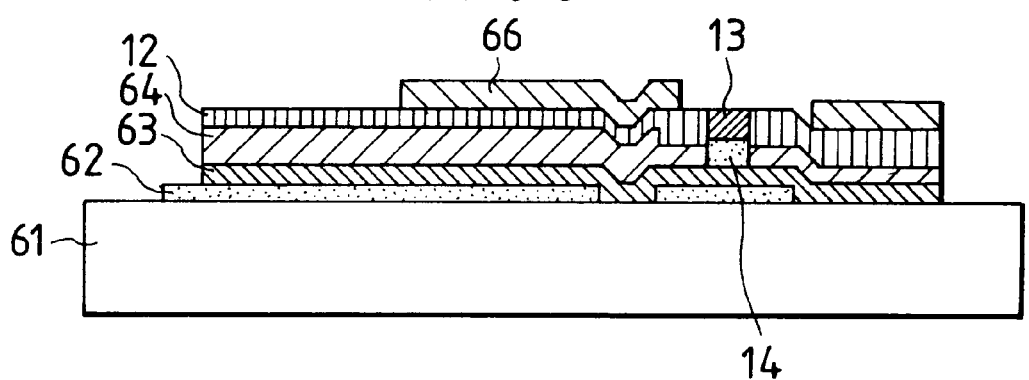
Figure 91:
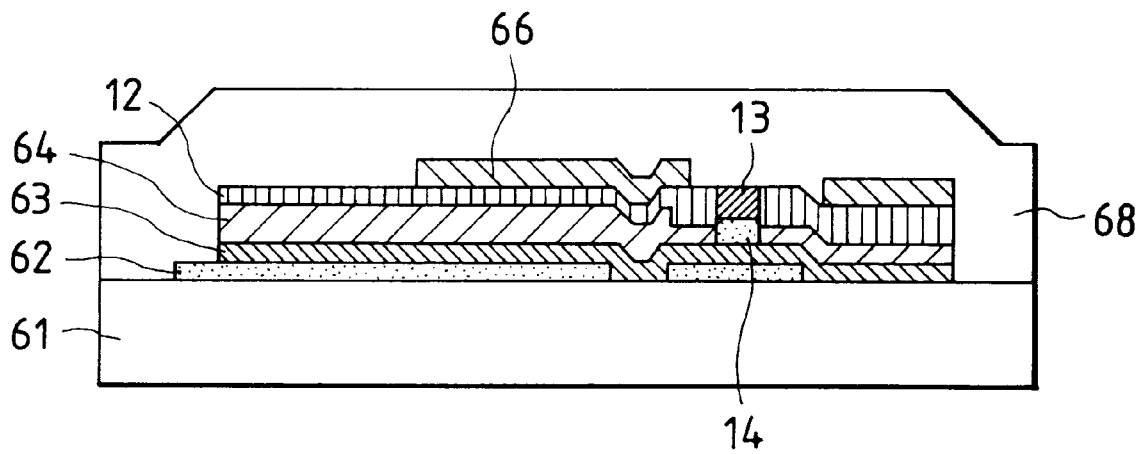

A 1-μm Al film was deposited by a sputtering method and patterned to be an electrode 66 (see FIG. 90). Finally, an $SiN_x$ film serving as a protective layer 68 was formed by a plasma CVD method (see FIG. 91).

In this embodiment, the doping semiconductor layer 12 serving as the MIS type sensor can be formed to have a small thickness, i.e., 300 Å, and the doping semiconductor layer 12 on the TFT can be formed to have a large thickness. Furthermore, the substrate temperature Ts can be decreased to 200° C., the doping semiconductor layer 12 modified by using the excimer laser has a low resistivity of 0.2 ancm, the channel portion of the TFT has an electron mobility which is remarkably improved, i.e., 30 cm$^2$/V·S. For this reason, the MIS type sensor has low light absorption in the doping semiconductor, and the TFT has a size smaller than a conventional TFT and sufficient transfer capability. Therefore, the opening ratio of the photosensor can be increased by 10% compared with a conventional photosensor.

In this manner, a high-performance radiation detecting apparatus which copes with a large area and is constituted by a photosensor having a light output about 1.5 times that of a conventional light output and a high-performance P-Si TFT capable of performing high-speed response can be formed. According to the present invention, at least one photomask for forming a conventional channel-etch type source/drain electrode can be omitted, and reliability of a $V_{th}$ shift or the like can be assured. For this reason, a radiation detecting apparatus constituted by a stable high-performance P-Si TFT can be provided. An erroneous operation caused by light irradiation onto the TFT and observed in a thin-film transistor using a conventional a-Si:H semiconductor layer 4 can be eliminated in the present invention.

In each embodiment of the present invention has described a radiation detecting apparatus having a phosphor. However, the present invention can also be applied to a two- or one-dimensional image reading apparatus which can directly receive visible light without using a phosphor as a matter of course.

Naturally, the further formation of a doping layer described in Embodiment 27 or 28, in other words, an increase in thickness of the doping semiconductor layer 12 can be applied to formation of a doping layer using the excimer laser beam as needed.

As has been described above, according to the present invention, after a semiconductor layer is formed, the semiconductor layer is modified by using an excimer laser to form an insulating layer, thereby forming a high-quality insulating layer at a low temperature. When an insulating layer is formed by partially modifying the semiconductor layer in the layer direction, the interface between the semiconductor layer and the insulating layer is formed cleanly, and the high-quality insulating layer and the semiconductor layer free from degradation can be formed at a low temperature without increasing the number of masks to be in contact with each other. Therefore, a semiconductor device having a semiconductor element such as high-performance TFT or a photosensor can be manufactured at a low cost without increasing the number of masks.

According to the present invention, after a semiconductor layer is formed, an insulating layer is formed by modifying the semiconductor layer using an excimer laser, and a doping semiconductor layer is formed by using the excimer laser, a high-quality insulating layer and a doping semiconductor layer can be formed at a low temperature. The interface between the semiconductor layer and the insulating layer can be formed cleanly by partially modifying the semiconductor layer in the layer direction.

According to the present invention, the insulating layer is formed in a part of the semiconductor layer in the layer direction, a portion of the semiconductor layer which is not modified into the insulating layer in the layer direction is used as a channel portion of a thin-film transistor, and the doping semiconductor layer is used as an ohmic contact layer of the thin-film transistor. In this manner, the semiconductor device having an element such as an inexpensive high-performance TFT or photosensor can be formed without increasing the number of masks.

Since a high-performance photosensor can be formed on the same substrate in the same manufacturing processes as in a TFT, a semiconductor device such as a high-performance image reading apparatus (image-pickup apparatus) or a liquid crystal display apparatus in which a high-performance photosensor free from variation can be driven by a high-performance TFT and a shift resistor can be manufactured at a low cost.

According to the present invention, since a high-quality film can be formed without ununiformity of film quality due to unevenness when a gate insulating film or a passivation film is to be formed because the surfaces of the doping semiconductor layer and the insulating layer form substantially the same flat surface, and the doping semiconductor layer can be formed near a channel portion, a semiconductor element such as a TFT or a photosensor having a small channel resistance and excellent high-frequency characteristics or a photosensor can be formed at a low temperature.

In addition, according to the present invention, after a semiconductor layer is formed, the semiconductor layer is partially modified in a layer direction by using an excimer laser to form an insulating layer, a portion of the semiconductor layer which is not modified into the insulating layer by using the excimer laser is modified into a polysilicon semiconductor layer by laser annealing so that the high-quality insulating layer and the high-quality polysilicon semiconductor layer can be formed at a low temperature, at the same time, the interface between the semiconductor layer and the insulating layer can be formed cleanly. Therefore, a higher-performance P-Si TFT can be formed by masks which are almost equal in number to masks in an a-Si:H TFT or a photosensor, and a semiconductor device including an inexpensive high-performance TFT or photosensor can be manufactured.

According to the present invention, since a high-performance photosensor can be formed on the same substrate in the same manufacturing processes as in a TFT, a semiconductor device including a high-performance image reading apparatus which is driven by a high-performance P-Si TFT and a shift resistor can be manufactured at a low cost.

In addition, according to the present invention, after a semiconductor layer is formed, the semiconductor layer is partially modified in a layer direction by using an excimer laser to form an insulating layer, the portion of the semiconductor layer which is not modified into the insulating layer in the layer direction by using the excimer laser is modified into a polysilicon semiconductor layer by laser annealing so that the high-quality insulating layer and the high-quality polysilicon semiconductor layer can be formed at a low temperature, and, at the same time, the interface between the semiconductor layer and the insulating layer can be formed cleanly. A doping semiconductor layer is formed by partially modifying the semiconductor layer by excimer laser doping, thereby forming a high-quality ohmic contact layer at a low temperature.

Therefore, a higher-performance P-Si TFT can be formed by masks which are almost equal in number to masks in an a-Si:H TFT or a photosensor, and a semiconductor device which includes an inexpensive high-performance TFT or a photosensor can be manufactured.

Furthermore, since a high-performance photosensor can be formed on the same substrate in the same manufacturing processes as in a TFT, a high-performance image reading apparatus in which the high-performance photosensor free from variation is driven by a high-performance P-Si TFT and a shift register can be manufactured at a low cost.

Since a high-quality film can be formed without ununiformity of film quality due to unevenness when a gate insulating film or a passivation film is to be formed because the surfaces of the doping semiconductor layer and the insulating layer form substantially the same flat surface, and the doping semiconductor layer can be formed near a channel portion, a semiconductor element such as a TFT or a photosensor having a small channel resistance and excellent high-frequency characteristics can be formed at a low temperature.

According to the present invention, when the doping layer formed by using the excimer laser is increased in thickness by using the excimer laser, even a semiconductor device having doping layers whose required thicknesses are different from each other can be uniformly manufactured at a high yield and a high accuracy. Since the arrangement can be optimized, a semiconductor device in which not only an improvement on the characteristics of respective elements but also totally excellent characteristics can be obtained can be provided.

In addition, according to the present invention, a semiconductor device, such as an apparatus of detecting an electromagnetic wave including radiation, having an MIS sensor having a sufficient large light output and a thin-film transistor having sufficient transfer capability which are parallelly arranged in such a manner that, after a semiconductor layer is formed, the semiconductor layer is modified into an insulating layer by using an excimer laser, and a doping semiconductor layer for the MIS sensor and a doping semiconductor layer for the TFT are formed to have thicknesses which are substantially different from each other can be formed.

According to the present invention, a semiconductor device including a radiation detecting apparatus, having excellent in-plane uniformity, and corresponding to a large area can be formed at a low cost by masks which are smaller in number than masks used in a conventional channel-etch type semiconductor device. According to the present invention, since a TFT and a photosensor can be formed in the same processes, and a semiconductor layer in a TFT portion can be substantially decreased in thickness, a disadvantage caused by irradiation of light onto the TFT can be reduced.

According to the present invention, after a semiconductor layer is formed, when the semiconductor layer is partially modified in a layer direction by using an excimer laser to form an insulating layer, and the semiconductor layer is modified into a polysilicon semiconductor layer under the insulating layer by laser annealing, the high-quality insulating layer and the high-quality polysilicon semiconductor layer can be formed at a low temperature, and, at the same time, the interface between the semiconductor layer and the insulating layer can be formed cleanly. Furthermore, a doping semiconductor layer can be formed by partially modifying the semiconductor layer by excimer laser doping, thereby forming the high-quality doping semiconductor layer having a low resistivity at a low temperature.

Therefore, a combination between a high-performance P-Si TFT which is not erroneously operated by light irradiation and a photosensor having a high light output can be obtained, and a high-performance radiation detecting apparatus having this combination can be manufactured. The high-performance P-Si TFT and the photosensor are formed at once, thereby improving an opening ratio of a photosensor portion.

According to the present invention, a high-performance, high-definition, and large-screen liquid crystal display apparatus which has high uniformity, high contrast, a high S/N ratio, and the like and is obtained by a small number of masks in such a manner that TFTs according to the present invention are arranged in a matrix form to be connected to pixel electrodes can be provided at a low cost.

Note that the present invention is not limited to the embodiments described above, and various changes and modifications may be effected without departing from the spirit and scope of the invention.

What is claimed is:

1. A method of manufacturing a semiconductor device, comprising the steps of:
    forming a semiconductor layer on an insulating surface;
    forming a doped layer adjacent a first region of the semiconductor layer;
    forming a conductive layer for formation of source/drain electrodes on the doped layer;
    patterning the conductive layer to form the source/drain electrodes;
    removing the doped layer between the source/drain electrodes;
    effecting excimer laser irradiation utilizing the source/drain electrode layer under an oxidizing or nitriding atmosphere to modify a part on the excimer laser irradiated side of at least the first region of the semiconductor layer exposed between the source/drain electrodes into an insulating material, thus forming an insulating layer; and
    forming a gate electrode on the insulating layer.

2. A method for manufacturing a semiconductor device according to claim 1, further comprising a step of modifying a semiconductor region, which is not modified and which is under the modified region, by irradiating with a second excimer laser having a wavelength different from that of the excimer laser for forming the insulating layer in the first region.

3. A method of manufacturing a semiconductor device according to claim 2, wherein the step of modifying the semiconductor region which has not been modified and which is under the modified region is performed by modifying said semiconductor region into a polysilicon semiconductor layer.

4. A method of manufacturing a semiconductor device according to claim 2, wherein the second excimer laser has a wavelength longer than that of the excimer laser for forming the insulating layer.

5. The method of manufacturing a semiconductor device according to claim 1, wherein the insulating layer is formed as a part in the thickness direction of the semiconductor layer.

6. The method of manufacturing a semiconductor device according to claim 1, wherein a portion in the thickness direction of the first region of the semiconductor layer which remains unmodified into the insulating layer is used as a channel portion of a thin film transistor.

7. The method of manufacturing a semiconductor device according to claim 1, comprising the step of effecting excimer laser irradiation under an impurity-containing atmosphere to dope a second region of the semiconductor layer adjacent to the first region with an impurity to thereby modify the second region, thus forming the doped layer.

8. The method of manufacturing a semiconductor device according to claim 7, wherein the semiconductor device comprises at least two semiconductor elements, and wherein the conditions for the excimer laser irradiation for formation of the doped layers of the least two semiconductor elements are different such that the doped layers of the at least two semiconductor elements have thickness substantially different from each other.

9. The method of manufacturing a semiconductor device according to claim 1, further comprising the step of after the formation of the insulating layer, effecting laser annealing to modify at least a part of the first region of the semiconductor layer which is not modified by the excimer laser into the insulating layer, into a polysilicon semiconductor layer.

10. The method of manufacturing a semiconductor device according to claim 9, wherein the excimer laser used for the modification into the insulating layer has a wavelength different from the wavelength of the laser used for the laser annealing for the modification into the polysilicon semiconductor layer.

11. The method of manufacturing a semiconductor device according to claim 1, further comprising the step of after the formation of the insulating layer, effecting laser annealing to modify at least a part of the first region of the semiconductor layer which is not modified by the excimer laser into the insulating layer, into a polysilicon semiconductor layer; and the step of effecting excimer laser irradiation under an impurity-containing atmosphere to dope a second region of the semiconductor layer adjacent to the first region with an impurity to thereby modify the second region, thus forming the doped layer.

12. The method of manufacturing a semiconductor device according to claim 11, wherein the excimer laser used for the modification into the insulating layer has a wavelength different from the wavelength of the laser used for the laser annealing for the modification into the polysilicon semiconductor layer.

13. The method of manufacturing a semiconductor device according to claim 1, wherein the semiconductor layer is of a non-monocrystalline semiconductor.

14. The method of manufacturing a semiconductor device according to claim 13, wherein the non-monocrystalline semiconductor is an amorphous semiconductor.

15. The method of manufacturing a semiconductor device according to claim 1, wherein the insulating layer has a function of a gate insulating film.

16. A method of manufacturing a semiconductor device, comprising the steps of:

forming a semiconductor layer on an insulating surface;

irradiating selectively a first region of the semiconductor layer with an excimer laser under an oxidizing or nitriding atmosphere to modify a part on the excimer laser irradiated side of at least the first region of the semiconductor layer into an insulating material, thus forming an insulating layer;

irradiating a region of the semiconductor layer being adjacent to and sandwiching the first region with an excimer laser under an impurity-containing atmosphere to form a doped layer incorporated with an impurity at a part on the excimer laser irradiated side of the semiconductor layer;

forming a conductive layer for formation of source/drain electrodes on the doped layer; and forming a gate electrode on the insulating layer.

* * * * *

UNITED STATES PATENT AND TRADEMARK OFFICE
CERTIFICATE OF CORRECTION

PATENT NO. : 6,214,684 B1
DATED : April 10, 2001
INVENTOR(S) : Tatsumi Shoji

It is certified that error appears in the above-identified patent and that said Letters Patent is hereby corrected as shown below:

Title page,
Item [56], FOREIGN PATENT DOCUMENTS,
"5-16372" should read -- 5-63172 --;
"6069504" should read -- 6-069504 --; and
"6125084" should read -- 6-125084 --.

Column 1,
Line 55, "SiN," should read -- $SiN_x$ --.

Column 2,
Line 40, "SiN.," should read -- $SiN_x$ --; and
Line 66, "no t" should read -- not --.

Column 4,
Line 35, "maskand" should read -- mask and --.

Column 10,
Line 54, "olsemicon" should read -- semicon --.

Column 13,
Line 42, "an" should read -- a --; and
Line 48, "an" should read -- a --.

Column 14,
Line 5, "se t" should read -- set --;
Line 25, "SiN,," should read -- $SiN_x$ --;
Line 45, "an" should read -- a --;
Line 50, "an" should read -- a --; and
Line 56, "an" should read -- a --.

UNITED STATES PATENT AND TRADEMARK OFFICE
CERTIFICATE OF CORRECTION

PATENT NO. : 6,214,684 B1
DATED : April 10, 2001
INVENTOR(S) : Tatsumi Shoji

It is certified that error appears in the above-identified patent and that said Letters Patent is hereby corrected as shown below:

Column 15,
Line 37, "an" should read -- a --;
Line 42, "an" should read --a --;
Line 51, insert -- ¶[Embodiment 4]¶ --.

Column 16,
Line 2, "inflating)" should read -- inflating --.

Column 17,
Line 7, "X." should read -- $X_1$ --.

Column 18,
Line 19, "SiN," should read -- $SiN_x$ --; and
Line 31, "SiN," should read -- $SiN_x$ --.

Column 22,
Line 5, "SiN,," should read -- $SiN_x$, --.

Column 24,
Line 8, "was" should be deleted.

Column 26,
Line 16, "SiN,," should read -- $SiN_x$, --.

Column 27,
Line 25, "SiN," should read -- $SiN_x$ --; and
Line 33, "SiN," should read -- $SiN_x$ --.

UNITED STATES PATENT AND TRADEMARK OFFICE
CERTIFICATE OF CORRECTION

PATENT NO. : 6,214,684 B1
DATED : April 10, 2001
INVENTOR(S) : Tatsumi Shoji

It is certified that error appears in the above-identified patent and that said Letters Patent is hereby corrected as shown below:

Column 28,
Line 1, "Si" should read -- S1 --;
Line 5, "Si;" should read -- S1; --;
Line 10, "-bits" should read -- bits --; and
Line 64, "SiN," should read -- $SiN_x$ --.

Column 29,
Line 15, "lay er" should read -- layer --; and "SiN, a nd" should read -- $SiN_x$ and--; and
Line 61, "0.20-cm," should read -- 0.2 $\Omega$.cm, --.

Column 30,
Line 24, "SiN," should read -- $SiN_x$ --; and
Line 44, "SiN," should read -- $SiN_x$ --.

Column 31,
Line 29, "0.2 ancm" should read -- 0.2 $\Omega$.cm, --.

Signed and Sealed this

Fifth Day of March, 2002

*Attest:*

JAMES E. ROGAN
*Attesting Officer*   *Director of the United States Patent and Trademark Office*